United States Patent
Hayashi et al.

(10) Patent No.: US 8,476,828 B2
(45) Date of Patent: Jul. 2, 2013

(54) ELECTRO-OPTICAL DEVICE, ELECTRONIC DEVICE, AND ILLUMINATION APPARATUS INCLUDING A PANEL HAVING AN ELECTRO-OPTICAL LAYER

(75) Inventors: Kenji Hayashi, Siojiri (JP); Kozo Shitagami, Chino (JP); Misako Kezuka, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 178 days.

(21) Appl. No.: 12/821,584

(22) Filed: Jun. 23, 2010

(65) Prior Publication Data

US 2010/0327737 A1   Dec. 30, 2010

(30) Foreign Application Priority Data

Jun. 24, 2009 (JP) ................ 2009-149478
Jun. 25, 2009 (JP) ................ 2009-150708
Mar. 16, 2010 (JP) ................ 2010-058826

(51) Int. Cl.
*H01L 33/04* (2010.01)

(52) U.S. Cl.
USPC .......................... 313/512; 313/504

(58) Field of Classification Search
None
See application file for complete search history.

(56) References Cited

U.S. PATENT DOCUMENTS

| | | | |
|---|---|---|---|
| 6,268,695 B1 * | 7/2001 | Affinito | 313/504 |
| 6,686,063 B2 * | 2/2004 | Kobayashi | 428/690 |
| 6,765,351 B2 * | 7/2004 | Forrest et al. | 313/506 |
| 6,822,391 B2 * | 11/2004 | Yamazaki et al. | 313/512 |
| 6,888,307 B2 * | 5/2005 | Silvernail et al. | 313/512 |
| 6,956,325 B2 * | 10/2005 | Yamazaki et al. | 313/512 |
| 7,067,976 B2 * | 6/2006 | Yamazaki | 313/512 |
| 7,208,872 B2 * | 4/2007 | Miyadera | 313/512 |
| 7,372,200 B2 * | 5/2008 | Yamazaki | 313/506 |
| 7,443,097 B2 * | 10/2008 | Yamazaki et al. | 313/512 |
| 7,541,671 B2 * | 6/2009 | Foust et al. | 257/688 |
| 7,990,060 B2 * | 8/2011 | Ahn et al. | 313/512 |
| 8,016,631 B2 * | 9/2011 | Boroson et al. | 445/25 |
| 2002/0068191 A1 * | 6/2002 | Kobayashi | 428/690 |
| 2002/0113549 A1 * | 8/2002 | Yamazaki et al. | 313/506 |
| 2003/0038590 A1 * | 2/2003 | Silvernail et al. | 313/504 |
| 2003/0117068 A1 * | 6/2003 | Forrest et al. | 313/504 |
| 2004/0104673 A1 * | 6/2004 | Hosokawa et al. | 313/512 |
| 2005/0001547 A1 * | 1/2005 | Yamazaki et al. | 313/512 |
| 2005/0017633 A1 * | 1/2005 | Miyadera | 313/512 |
| 2005/0088088 A1 * | 4/2005 | Yamazaki | 313/512 |
| 2005/0098113 A1 * | 5/2005 | Hayashi | 118/718 |
| 2005/0156519 A1 * | 7/2005 | Yoshizawa et al. | 313/512 |
| 2005/0158580 A1 * | 7/2005 | Ito et al. | 313/504 |
| 2006/0006799 A1 * | 1/2006 | Yamazaki et al. | 313/512 |
| 2006/0022592 A1 * | 2/2006 | Boroson | 313/512 |

(Continued)

FOREIGN PATENT DOCUMENTS

| | | |
|---|---|---|
| JP | A-2004-184616 | 7/2004 |
| JP | A-2005-019082 | 1/2005 |

(Continued)

*Primary Examiner* — Britt D Hanley
(74) *Attorney, Agent, or Firm* — Oliff & Berridge, PLC

(57) ABSTRACT

An electro-optical device includes a display panel having an electro-optical layer, a first resin film stacked on the display panel to cover a first surface on the side of a display area of the display panel, and a second resin film stacked on the display panel to cover a second surface opposite the first surface, and at least one reinforcing member disposed on at least one of the first resin film and the second resin film.

32 Claims, 32 Drawing Sheets

U.S. PATENT DOCUMENTS

| | | | | |
|---|---|---|---|---|
| 2006/0220551 | A1* | 10/2006 | Yamazaki | 313/512 |
| 2006/0226523 | A1* | 10/2006 | Foust et al. | 257/680 |
| 2008/0297042 | A1* | 12/2008 | Ahn et al. | 313/504 |
| 2008/0303140 | A1* | 12/2008 | Ohtani et al. | 257/729 |
| 2009/0130941 | A1* | 5/2009 | Boroson et al. | 445/25 |
| 2009/0314527 | A1* | 12/2009 | Hatano et al. | 174/255 |
| 2010/0013372 | A1* | 1/2010 | Oikawa et al. | 313/498 |

FOREIGN PATENT DOCUMENTS

| | | |
|---|---|---|
| JP | A-2007-042616 | 2/2007 |
| JP | A-2007-299603 | 11/2007 |
| JP | B2-4131639 | 8/2008 |
| JP | A-2008-224847 | 9/2008 |
| JP | A-2008-243495 | 10/2008 |
| JP | A-2009-086115 | 4/2009 |

* cited by examiner

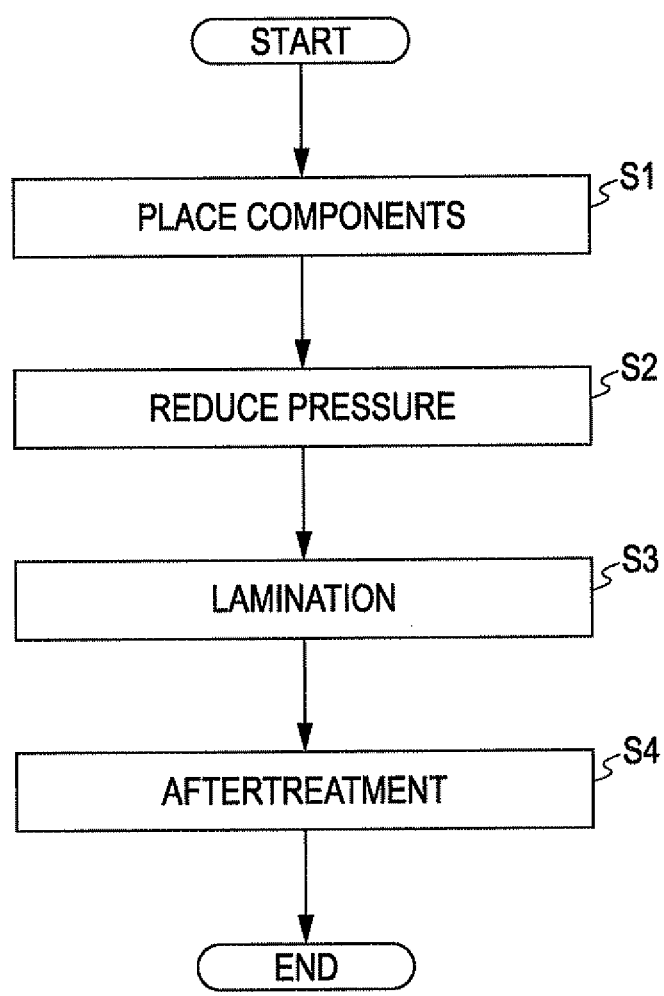

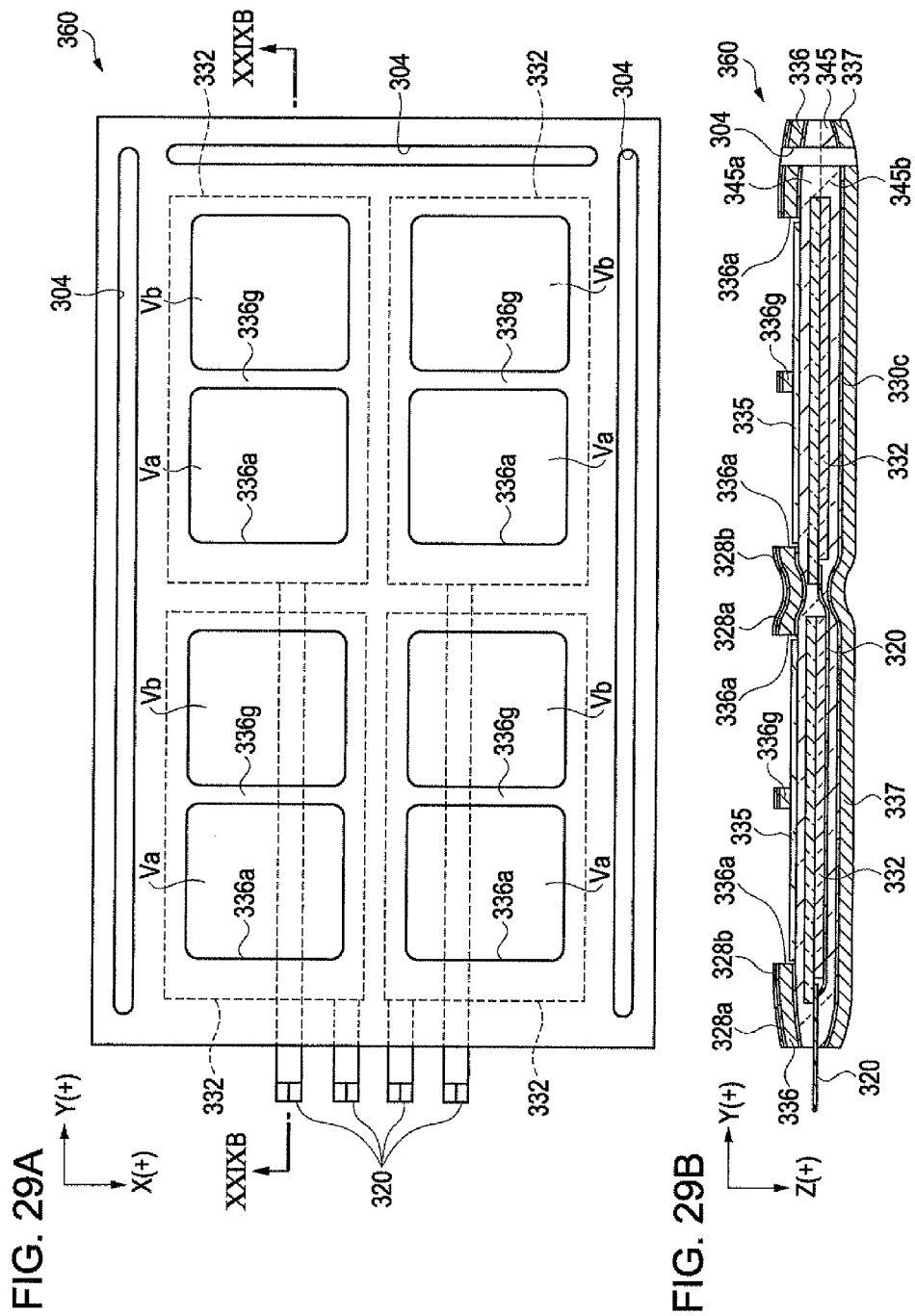

ELECTRO-OPTICAL DEVICE, ELECTRONIC DEVICE, AND ILLUMINATION APPARATUS INCLUDING A PANEL HAVING AN ELECTRO-OPTICAL LAYER

BACKGROUND

1. Technical Field

The present invention relates to an electro-optical device, an electronic device, and an illumination apparatus.

2. Related Art

Flat-panel displays for use in thin television sets and mobile phones are required to be of low profile and light weight. In recent years, flexible flat-panel displays have been proposed to develop new markets.

For example, JP-A-2005-19082 discloses an organic EL display that includes an organic electroluminescence (EL) layer between two glass substrates each having a thickness as small as 100 µm or less. JP-A-2005-19082 also discloses that the organic EL display may include resin reinforcing layers on outer surfaces of the front and back glass substrates to compensate for the insufficient strength resulting from the reduced thickness.

As illustrated in FIG. 34, Japanese Patent No. 4,131,639 discloses a liquid crystal display 400 that includes a liquid crystal panel 90 composed of a pair of thin glass substrates sandwiched between transparent resin films 95a and 95b.

The liquid crystal panel 90 is of a reflective type and is provided with a polarizing plate 91, which also serves as a reinforcing plate, on the display screen side and with a resin reinforcing plate 92 on the back side. The liquid crystal panel 90 with the resin reinforcing plates 91 and 92 attached on both sides is disposed between the two resin films 95a and 95b.

It is considered that the reinforcing structure including the reinforcing plates 91 and 92 and the resin films 95a and 95b is intended to compensate for the specific characteristics of the glass substrates, that is, relatively high resistance to compressive stress but very low resistance to tensile stress. Japanese Patent No. 4,131,639 also discloses that the reinforcing structure is applicable to EL panels.

However, it is difficult to achieve sufficient actual strength with the reinforcing structure that includes the resin reinforcing plates 91 and 92 and the resin films 95a and 95b. In other words, it is difficult for the liquid crystal display 400 to achieve both great flexibility and high actual strength (tenacity).

This is because the resin reinforcing plates 91 and 92 and the resin films 95a and 95b disposed on the glass substrates may bend along with the glass substrates upon the application of a bending stress. In other words, the reinforcing plates 91 and 92 and the resin films 95a and 95b, together with the glass substrates, may be easily bent to the breaking point of the glass substrates (limiting radius). Thus, the glass substrates may become cracked and broken.

With the reinforcing structure in which the liquid crystal panel 90 with the reinforcing plates 91 and 92 attached on both sides is disposed between the two resin films 95a and 95b, not only dose the liquid crystal display 400 have a large thickness, but a gap G is also formed around the liquid crystal panel 90.

The gap G is particularly troublesome in a reinforcing structure that includes an organic EL panel as a display panel. More specifically, the formation of a large gap G around an organic EL panel may allow moisture to intrude into the gap G, causing deterioration of the organic EL layer. Since organic EL panels are self-luminous devices, display on a screen causes heat generation. However, heat radiation is not taken into consideration at all in the reinforcing structure. In other words, it is difficult for the reinforcing structure to prevent deterioration of the organic EL panel caused by heat generation.

SUMMARY

The invention has been achieved to solve at least part of the problems described above and can be implemented in accordance with the following embodiments or aspects.

Aspects

An electro-optical device that includes a display panel having an electro-optical layer, a first resin film stacked on the display panel to cover a first surface on the side of a display area of the display panel, and a second resin film stacked on the display panel to cover a second surface opposite the first surface, and at least one reinforcing member disposed on at least one of the first resin film and the second resin film.

Since this electro-optical device has a structure in which a reinforcing member is disposed on the outer surface of at least one of the first resin film and the second resin film, the first resin film and the second resin film can be stacked with a smaller gap around the display panel, thereby improving sealing properties. The electro-optical device has a smaller thickness than a known display in which a reinforcing plate is attached to the front and back sides of a display panel.

In an electro-optical device according to another aspect, a first reinforcing member disposed on the first resin film has an opening corresponding to the display area of the display panel.

Since the first reinforcing member has an opening corresponding to the display area of the display panel, a reduction in the visibility of the display panel can be prevented even if the first reinforcing member is formed of a material that reduces visibility. The electro-optical device that includes such a reinforcing member having an opening can include a portion having a reduced thickness and can therefore be bent more easily than a conventional structure that includes no opening.

The at least one reinforcing member has a multilayer structure that includes a first carbon fiber layer and a second carbon fiber layer. The first carbon fiber layer contains a plurality of carbon fibers extending in a first direction. The second carbon fiber layer contains a plurality of carbon fibers extending in a second direction. The first direction and the second direction cross each other. The at least one reinforcing member two-dimensionally surrounds the display area of the display panel.

Since the at least one reinforcing member has a multilayer structure that includes the first carbon fiber layer containing a plurality of carbon fibers extending in a first direction and the second carbon fiber layer containing a plurality of carbon fibers extending in a second direction, which crosses the first direction, the first and second carbon fiber layers can increase the tensile strength of the at least one reinforcing member in any two-dimensional direction, thereby preventing a substrate on which an electro-optical layer is formed from being bent to the breaking point (limiting radius) even when a bending stress is applied to the substrate in any direction.

Carbon fiber is manufactured by carbonizing long fiber at high temperatures of 1000° C. or more to high purity. The long fiber can be made of polyacrylonitrile (PAN) or pitch. Carbon fiber has high tensile strength, a low thermal deformation ratio (a low coefficient of linear expansion), and high thermal conductivity. Such carbon fiber can be combined with a binder resin, such as an epoxy resin, to manufacture carbon-fiber-reinforced plastics (CFRPs). A reinforcing member containing a carbon-fiber-reinforced plastic (CFRP)

can have higher tensile strength than conventional resin reinforcing plates containing inorganic particles or glass fiber. With a reinforcing member having a thickness as small as 50 to 200 μm being attached to a substrate, carbon-fiber-reinforced plastic (CFRP) can prevent the substrate on which an electro-optical layer is formed from being bent to the breaking point (limiting radius) even when a bending stress is applied to the substrate in the extending direction of carbon fiber.

Thus, an electro-optical device according to the present aspect can have sufficient actual strength.

In a conventional display apparatus in which a reinforcing plate is covered with a resin film, heat generated by a display panel persists in the laminate structure. When a resin film is disposed on a reinforcing member, heat generated by a display panel does not persist in the laminate structure and can be efficiently dissipated. In particular, when a reinforcing member containing carbon fiber having higher thermal conductivity than resin is formed on a resin film, the reinforcing member has a higher thermal conductivity than a known resin reinforcing plate and can therefore efficiently radiate heat generated by a display panel.

When heat-conductive aluminum is used for a reinforcing plate, thermal expansion and contraction of aluminum may cause a warp in a thin display panel. This is because aluminum has a coefficient of linear expansion (approximately 24 ppm/° C.) approximately five times as high as the coefficient of linear expansion of a glass substrate (approximately 4 ppm/° C.). A reinforcing member having a multilayer structure in which two carbon fiber layers are layered in different directions has a coefficient of linear expansion of approximately 1 ppm/° C. Unlike a known aluminum member exhibiting large thermal expansion and contraction, therefore, such a reinforcing member attached to the back side of an electro-optical device can still prevent warping of the electro-optical device.

Thus, an electro-optical device that can sufficiently radiate heat and is prevented from warping is provided.

Preferably, the first carbon fiber layer and the second carbon fiber layer are formed of resin-impregnated carbon fiber prepreg, and the at least one reinforcing member is a layered product formed by curing at least three layers of the first carbon fiber layer and the second carbon fiber layer.

Preferably, the reinforcing member is formed of invar, titanium, or a titanium alloy.

Preferably, the opening of the first reinforcing member has the same shape as the display area, and the first reinforcing member two-dimensionally covers the display panel to the ends of the display panel.

Preferably, the at least one reinforcing member includes a first reinforcing member and a second reinforcing member. The first reinforcing member is disposed on the first resin film, and the second reinforcing member is disposed on the second resin film.

Preferably, the electro-optical device further includes an optical film covering the display area at the opening of the first reinforcing member, and the first resin film serves as an adhesive between the display panel, the first reinforcing member, and the optical film.

Preferably, the reinforcing member includes a graphite layer.

Preferably, the graphite layer is disposed between the second resin film and the first carbon fiber layer.

Preferably, the graphite layer is disposed between the first carbon fiber layer and the second carbon fiber layer.

Preferably, the graphite layer has a plurality of holes.

Preferably, the electro-optical device further includes a reflective layer disposed on at least one of a third surface and a fourth surface of the at least one reinforcing member. The third surface faces the first surface of the display panel, and the fourth surface is opposite the third surface.

Preferably, the electro-optical device further includes a reflective layer disposed on a fifth surface of the at least one reinforcing member. The fifth surface faces the second surface of the display panel.

In such a structure including a reflective layer, the reflective layer disposed on the at least one reinforcing member can reflect part of light emitted from the display area of the display panel and thereby improve luminance.

Preferably, the electro-optical layer of the display panel is disposed on a glass substrate, at least one side of the glass substrate has a protruding area protruding from the display area, the protruding area is connected to one end of a flexible printed circuit board, the one end of the flexible printed circuit board is covered with at least one of the first resin film and the second resin film, and the other end of the flexible printed circuit board is disposed outside an end of at least one of the first resin film and the second resin film.

Preferably, the glass substrate has a thickness of 100 μm or less.

Preferably, the first resin film and the second resin film are formed of a polyethylene copolymerization material.

Preferably, the electro-optical layer is an organic EL layer that includes an organic light-emitting layer.

In accordance with still another aspect of the invention, an electronic device is provided that includes, as a display, an electro-optical device according to any one of the aspects described above.

In accordance with still another aspect of the invention, an illumination apparatus is provided that includes a panel having an electro-optical layer, a first resin film stacked on the panel to cover a first surface of the panel, and a second resin film stacked on the panel to cover a second surface opposite the first surface, at least one reinforcing member disposed on at least one of the first resin film and the second resin film, and a reflective layer disposed on at least one of a third surface and a fourth surface of the at least one reinforcing member, the third surface facing the first surface of the panel, the fourth surface being opposite the third surface.

Since this illumination apparatus has a structure in which a reinforcing member is disposed on the outer surface of at least one of the first resin film and the second resin film, the first resin film and the second resin film can be stacked with a smaller gap around the panel, thereby improving sealing properties. The illumination apparatus has a smaller thickness than a known illumination apparatus that has a reinforcing plate on the front and back sides of a panel.

In addition, the reflective layer disposed on at least one of the third surface and the fourth surface of the first reinforcing member can reflect part of light emitted from the light-emitting region and thereby improve luminance. In other words, the reflective layer can increase illumination efficiency. Thus, the illumination apparatus can have sufficient illumination efficiency.

Preferably, the first surface of the panel has a light-emitting region, and a first reinforcing member disposed on the first resin film has an opening corresponding to the light-emitting region of the panel. Since the first reinforcing member has an opening corresponding to the light-emitting region of the panel, a reduction in the brightness of the panel can be prevented even if the first reinforcing member is formed of a material that reduces brightness. The illumination apparatus that includes such a reinforcing member having an opening can include a portion having a reduced thickness and can therefore be bent more easily than a conventional structure that includes no opening. The first reinforcing member two-dimensionally surrounding the light-emitting region of the panel can prevent the glass substrate from being bent to the breaking point (limiting radius), thus achieving sufficient actual strength.

Preferably, the reflective layer is disposed on the third surface and the fourth surface of the first reinforcing member.

Preferably, the at least one reinforcing member includes a first reinforcing member disposed on the first resin film and a second reinforcing member disposed on the second resin film of the panel Preferably, the illumination apparatus further includes a reflective layer disposed on a fifth surface of the second reinforcing member, the fifth surface facing the second surface of the panel.

Preferably, the illumination apparatus further includes a reflective layer on the surface of the first reinforcing member facing the first surface of the panel and on the surface of the second reinforcing member facing the second surface of the panel.

Preferably, the at least one reinforcing member has a multilayer structure that includes a first carbon fiber layer and a second carbon fiber layer, the first carbon fiber layer containing a plurality of carbon fibers extending in a first direction, the second carbon fiber layer containing a plurality of carbon fibers extending in a second direction, the first direction and the second direction crossing each other.

Since the at least one reinforcing member has a multilayer structure that includes the first carbon fiber layer containing a plurality of carbon fibers extending in a first direction and the second carbon fiber layer containing a plurality of carbon fibers extending in a second direction, which crosses the first direction, the first and second carbon fiber layers can increase the tensile strength of the least one reinforcing member in any two-dimensional direction, thereby preventing a glass substrate from being bent to the breaking point (limiting radius) even if a bending stress is applied to the glass substrate in any direction.

Carbon fiber is manufactured by carbonizing long fiber at high temperatures of 1000° C. or more to high purity. The long fiber can be made of polyacrylonitrile (PAN) or pitch. Carbon fiber has high tensile strength, a low thermal deformation ratio (a low coefficient of linear expansion), and high thermal conductivity. Such carbon fiber can be combined with a binder resin, such as an epoxy resin, to manufacture carbon-fiber-reinforced plastics (CFRPs). A reinforcing member containing a carbon-fiber-reinforced plastic (CFRP) can have higher tensile strength than conventional resin reinforcing plates containing inorganic particles or glass fiber. With a frame-shaped reinforcing member having a thickness as small as 50 to 200 μm being attached to a substrate, carbon-fiber-reinforced plastic (CFRP) can prevent a glass substrate from being bent to the breaking point (limiting radius) even when a bending stress is applied to the glass substrate in the extending direction of carbon fiber.

Thus, an illumination apparatus according to the present aspect can have sufficient actual strength.

In addition, a reinforcing member containing carbon fiber having higher thermal conductivity than resin has a higher thermal conductivity than a known resin reinforcing plate and can therefore efficiently radiate heat generated by a panel.

Preferably, the first carbon fiber layer and the second carbon fiber layer are formed of resin-impregnated carbon fiber prepreg, and the at least one reinforcing member is a layered product formed by curing at least three layers of the first carbon fiber layer and the second carbon fiber layer. More specifically, each of the carbon fiber layers is formed of uncured-resin-impregnated carbon fiber prepreg.

Preferably, the at least one reinforcing member is formed of invar, titanium, or a titanium alloy.

Preferably, the first reinforcing member has an opening of the same shape as a light-emitting region of the panel and two-dimensionally covers the panel to the ends of the panel.

Preferably, the first resin film, the second resin film, and the at least one reinforcing member have a plurality of mounting holes passing therethrough around the panel.

Preferably, the mounting holes are elongated holes extending along sides of the panel.

Preferably, the electro-optical layer of the panel is disposed on a glass substrate, at least one side of the glass substrate has a protruding area protruding from the light-emitting region, the protruding area is connected to one end of a flexible printed circuit board, the one end of the flexible printed circuit board is covered with the first resin film and the second resin film, and the other end of the flexible printed circuit board is disposed outside ends of the first resin film and the second resin film.

Preferably, the electro-optical layer of the panel is disposed on a glass substrate, and the glass substrate has a thickness of 100 μm or less.

Preferably, the first resin film and the second resin film are formed of a polyethylene copolymerization material.

Preferably, the electro-optical layer is an organic EL layer that includes an organic light-emitting layer.

BRIEF DESCRIPTION OF THE DRAWINGS

The invention will be described with reference to the accompanying drawings, wherein like numbers reference like elements.

FIG. 5 is a flow chart illustrating a method for manufacturing a display according to the first embodiment.

FIG. 29A is a plan view of an illumination apparatus according to a twelfth embodiment.

FIG. 29B is a sectional side view of the illumination apparatus taken along the line XXIXB-XXIXB in FIG. 29A.

DESCRIPTION OF EXEMPLARY EMBODIMENTS

Figure 1:
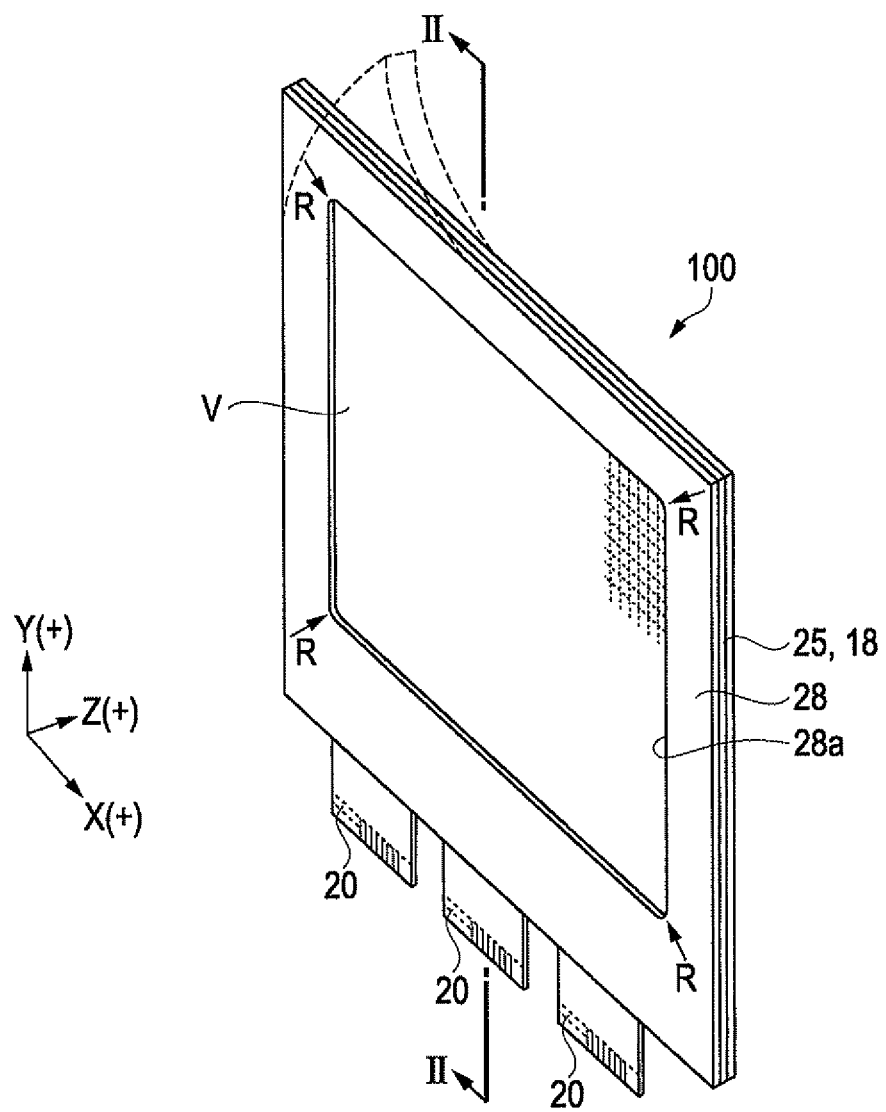
FIG. 1 is a perspective view of a display according to a first embodiment of the invention.

Embodiments of the invention will be described below with reference to the drawings. For the sake of convenient reference, the sizes of the layers and the components in the drawings are different from the exact sizes.

First Embodiment

Outline of Display

Figure 2:
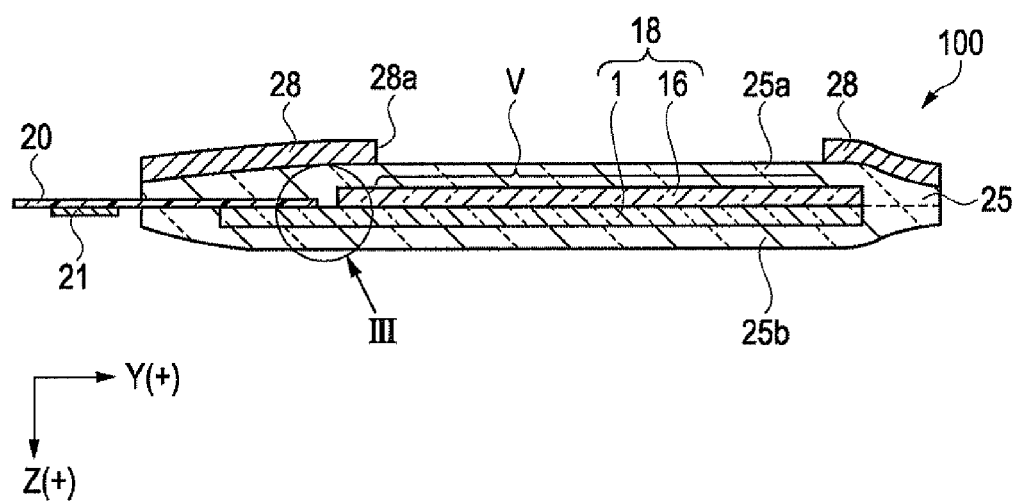
FIG. 2 is a sectional side view of the display taken along the line II-II in FIG. 1.

FIG. 1 is a perspective view of a display according to a first embodiment of the invention. FIG. 2 is a sectional side view of the display taken along the line II-II in FIG. 1.

The following is an outline of a display 100, which is an electro-optical device according to a first embodiment of the invention.

As illustrated in FIGS. 1 and 2, the display 100 is a flexible organic EL display that includes a display panel 18, which is a thin organic EL panel, between a first resin film 25*a* and a second resin film 25*b*. This laminate structure or the display panel 18 in a stacked form is hereinafter also referred to as a laminate structure 25.

The display panel 18 includes a display area V composed of a matrix of pixels. Each of a pair of substrates constituting the display panel 18 has a thickness of 100 μm or less to ensure great flexibility. The display area V includes arrays of red (R), green (G), and blue (B) pixels. Light beams from the pixels form full color images. The display panel is not limited to the color display panel 18 and may be a monochrome display panel. The display area V is horizontally oriented rectangular. In the drawings including FIG. 1, the horizontal direction is an X-axis direction, and the vertical direction is a Y-axis direction. The thickness direction of the display panel 18 is a Z-axis direction. The side of the display area V is referred to as a first surface or a front side, and the other side is referred to as a second surface or a back side.

A frame-shaped reinforcing member 28 two-dimensionally surrounding the display area V is disposed on the display area V side of the laminate structure 25. The term "frame-shaped", as used herein, means that the reinforcing member has an opening 28*a* corresponding to the display area V of the display panel 18. Preferably, the contour of the opening 28*a* of the reinforcing member 28 follows the contour of the display area V, and the reinforcing member 28 covers the display panel 18 to the ends of the display panel 18. The reinforcing member 28 reinforces the thin display panel 18 and is composed of a material having high tensile strength. For example, the reinforcing member 28 is preferably composed of a material containing carbon fiber. The opening (hole) 28*a* through which the display area V is exposed has four rounded corners Rs.

The display 100 having such a structure is flexible and has such a high actual strength that the display panel 18 is not broken when the display 100 is bent, as indicated by the dotted line in FIG. 1.

As illustrated in FIG. 2, the display panel 18 includes an element substrate 1 and a color filter (CF) substrate 16. One side of the element substrate 1 protrudes from the CF substrate 16, forming a protruding area. The protruding area is connected to a flexible board 20. A flexible board is an abbreviation of a flexible printed circuit board. A driver integrated circuit (IC) 21 is mounted on the flexible board 20. The flexible board 20 has a plurality of terminals at one end for the connection with an external device.

Detailed Structure of Display Panel

Figure 3:
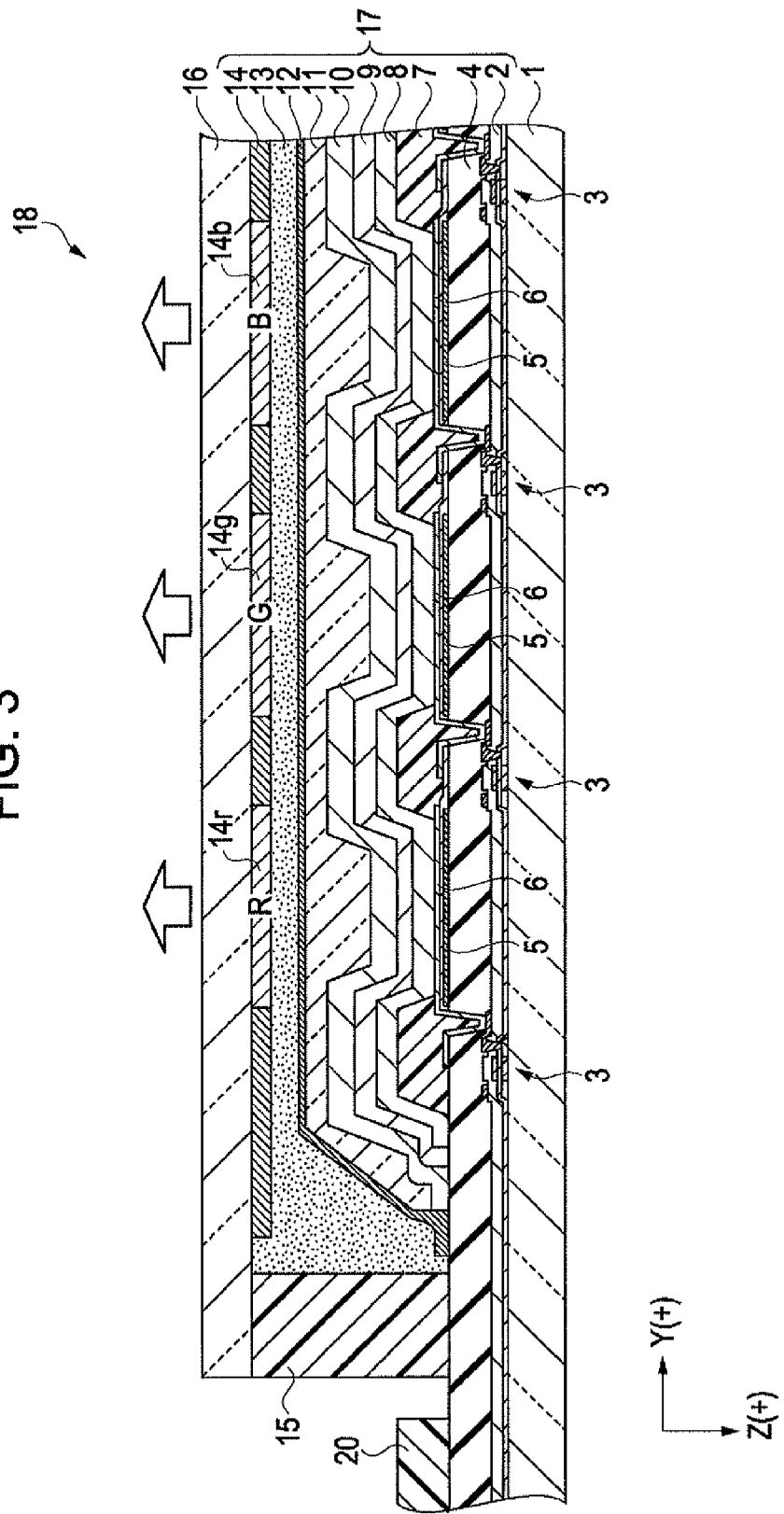
FIG. 3 is an enlarged view of a portion III in FIG. 2.

FIG. 3 is an enlarged view of a portion III of the display panel 18 illustrated in FIG. 2. The detailed structure of the display panel 18 will be described below.

As illustrated in FIG. 3, the display panel 18 includes the element substrate 1, an element layer 2, a planarization layer 4, a pixel electrode 6, a partition 7, an organic EL layer 8 serving as an electro-optical layer, a common electrode 9, an electrode protective layer 10, a buffer layer 11, a gas barrier layer 12, filler 13, a CF layer 14, and the CF substrate 16. A portion between the element substrate 1 and the CF substrate 16 is referred to as a functional layer 17. In other words, a multilayer structure from the element layer 2 to the CF layer 14 is referred to as the functional layer 17.

The element substrate 1 is formed of transparent inorganic glass. In the present embodiment, non-alkali glass is used as a suitable example.

The element layer 2 includes a pixel circuit for actively driving each pixel. The pixel circuit includes a select transistor for selecting a thin film transistor (TFT) pixel and a drive transistor 3 for applying an electric current to the organic EL layer 8. The pixel circuit is provided for each pixel.

The planarization layer 4, which is an insulating layer, for example, formed of an acrylic resin, is disposed on the element layer 2 (in the (−) direction on the Z-axis).

A reflective layer 5 and the pixel electrode 6 are disposed on the planarization layer 4 in this order for each pixel. The reflective layer 5 is formed of, for example, aluminum and reflects light traveling from the organic EL layer 8 to the element substrate 1, thereby enhancing display light.

The pixel electrode 6 is a transparent electrode, for example, formed of indium tin oxide (ITO) or ZnO and is connected to a drain terminal of the drive transistor 3 in the element layer 2 in each pixel via a contact hole passing through the planarization layer 4.

The partition 7 contains a photo-curing black resin and separates pixels in a grid-like fashion. The partition 7 is laid on top of the pixel circuit including the drive transistor 3 in the element layer 2 to prevent malfunction of the pixel circuit by light.

The organic EL layer 8 is disposed on the pixel electrode 6 and the partition 7. Although the organic EL layer 8 in FIG. 3 is a single layer, the organic EL layer 8 actually includes a hole-transport layer, a light-emitting layer, and an electron-injection layer disposed in this order on the pixel electrode 6. The hole-transport layer and the light-emitting layer are formed of a thin film of an organic substance. The hole-transport layer is formed of a subliming material, such as an aromatic diamine (TPAB2Me-TPD, α-NPD, or the like). The light-emitting layer is a multilayer thin film of an organic light-emitting material that emits white light formed by the combination of three colors: red, green, and blue. The electron-injection layer contains lithium fluoride (LiF).

The common electrode 9 is a transparent thin layer of metal, such as MgAg. The common electrode 9 may further include a transparent conductive layer of a metal oxide, such as ZnO, or a metal nitride, such as TiN, to reduce the resistance of the common electrode 9.

The electrode protective layer 10 is formed of a transparent high-density material impervious to water, such as $SiO_2$, $Si_3N_4$, or $SiO_xN_y$.

The buffer layer 11 is a transparent organic buffer layer, for example, formed of a thermosetting epoxy resin.

The gas barrier layer 12 is a transparent high-density sealing layer impervious to water, for example, formed of $SiO_2$, $Si_3N_4$, or $SiO_xN_y$, and has the function of preventing moisture from intruding into the organic EL layer 8.

The filler 13 is a transparent adhesive layer, for example, formed of a thermosetting epoxy resin and is applied to a rough surface between the gas barrier layer 12 and the CF layer 14 to bond them together. The filler 13 also functions to prevent moisture from intruding into the organic EL layer 8 from the outside.

Like the element substrate 1, the CF substrate 16 is formed of inorganic glass and is adjacent to the CF layer 14 on the organic EL layer 8 side (in the (+) side on the Z-axis).

The CF layer 14 includes a red filter 14r, a green filter 14g, and a blue filter 14b disposed in the same manner as the pixels. More specifically, each of the color filters is disposed on top of the corresponding pixel electrode 6. The color filters are separated by a light-shielding portion indicated by a hatched area. The light-shielding portions are disposed on top of the partitions 7 in a grid-like fashion and optically function as a black matrix.

Each of the pixels having such a structure emits light depending on the color tone of the corresponding color filter. In the red pixel, a red component of white light emitted by the organic EL layer 8 is selected by the red filter 14r and is emitted from the CF substrate 16. In the same manner, the green and blue pixels emit green and blue light, respectively.

Thus, full color images can be displayed in the display area V with light from a plurality of color pixels through the CF substrate 16.

In the absence of the reflective layer 5, full color images can be displayed on the back side of the display area V. In other words, full color images can be displayed on the front and back sides of the display panel 18.

The structure of the display panel 18 is not limited to a top emission type. The display panel 18 may have any structure in which an electro-optical layer is disposed between two glass substrates. For example, the organic EL display may be of a bottom emission type in which light from the organic EL layer 8 is emitted from the element substrate 1. The display may also be an inorganic EL display including an inorganic EL as a light source.

An electro-optical layer is not necessarily disposed between two glass substrates. For example, the organic EL layer 8 may be disposed as an electro-optical layer on a single glass substrate having the pixel electrode 6, and the common electrode 9, the electrode protective layer 10, the buffer layer 11, and the gas barrier layer 12 may be disposed on the organic EL layer 8 in this order, thus constituting a monochrome display.

The CF substrate 16 and the element substrate 1 are bonded together and sealed with a sealant 15 applied to the periphery of the CF substrate 16. The sealant 15 may be an epoxy adhesive or a UV curable resin.

A protruding area of the element substrate 1 protruding from the CF substrate 16 is connected to the flexible board 20. For example, the flexible board 20 includes a wiring pattern formed of copper foil formed on a polyimide film substrate and a driver IC mounted on the pattern. The flexible board 20 is electrically connected to a transparent electrode formed on the element substrate 1 via an anisotropic electroconductive adhesive film.

Since the connection via the anisotropic electroconductive adhesive film has insufficient mechanical strength, the connected portion of the flexible board 20 is conventionally reinforced with a silicon resin (adhesive). However, the silicon resin tends to be easily detached.

In the present embodiment, in place of this reinforcing structure, a first resin film 25a functions as an adhesive (filler)

to ensure sufficient actual strength and great flexibility. A method for bonding the first resin film 25a and the second resin film 25b will be described later.

Laminate Structure and Material of Reinforcing Member

Referring back to FIG. 2, the first resin film 25a and the second resin film 25b of the laminate structure 25 and the material of the reinforcing member 28 will be described below.

The first resin film 25a and the second resin film 25b entirely cover the front and back sides of the display panel 18 including the display area V and the periphery of the display panel 18. Thus, the first resin film 25a and the second resin film 25b require good adhesion with the glass substrate and the reinforcing member 28, great flexibility, high transparency (beam extraction efficiency), complete covering (high insulating properties and heat resistance) of the flexible board 20, and high water resistance to prevent moisture from intruding into the interior.

In order to satisfy these functions, the material of the first resin film 25a and the second resin film 25b is preferably a polyethylene resin having high water resistance (low water absorption), high insulating properties, great flexibility, high transparency, and low-temperature bondability. More preferably, the material of the first resin film 25a and the second resin film 25b is a copolymer having a polar group to improve adhesion.

More specifically, preferred examples of the polyethylene copolymer include an ethylene-vinyl acetate copolymer (EVA), an ethylene-methyl methacrylate copolymer (EMMA), an ethylene-hydroxyalkyl methacrylate copolymer, an ethylene-alkoxyethyl methacrylate copolymer, an ethylene-aminoethyl methacrylate copolymer, an ethylene-hydroxyglycidyl methacrylate copolymer, an ethylene-vinyl alcohol copolymer (EVOH), an ethylene-acrylic acid copolymer (EAA), an ethylene-methacrylic acid copolymer (EMAA), an ethylene-alkyl acrylate copolymer, an ethylene-vinylacetal copolymer, and an ethylene-vinylbutyral copolymer (PUB). Combinations of these two or more polyethylene copolymers (for example, an ethylene-vinyl acetate-vinyl alcohol copolymer exhibits good adhesion with both glass and CFRP) or mixtures of these two or more polyethylene copolymers may also be used.

The material of the first resin film 25a and the second resin film 25b may further contain a curing component, such as an epoxy compound, an isocyanate compound, or an amine compound, for example, polyethyleneimine, as a cross-linker to increase the heat resistance of the first resin film 25a and the second resin film 25b. Although an ethylene copolymer having a non-esterified carboxy group, such as an ethylene-acrylic acid copolymer (EAA) or an ethylene-methacrylic acid copolymer (EMAA), has low-temperature bondability and good adhesion, it may corrode copper wiring of the flexible board 20. An ethylene copolymer having a non-esterified carboxy group is therefore preferably combined with a cross-linking component, such as an epoxy curing agent, and is thermally cross-linked to eliminate residual acrylic acid.

The reinforcing member 28 should reinforce the fragile ends of the glass substrate, prevent warping of a panel having a multilayer structure composed of materials having different coefficients of linear expansion, have tenacity (tensile resistance) to prevent the glass substrate from being bent to the breaking point (limiting radius), and radiate heat generated by the display panel 18.

Preferably, the material of the reinforcing member 28 has a high Young's modulus (10 GPa or more), a low coefficient of linear expansion (10 ppm/° C. or less), and a high thermal conductivity (10 W/m·k or more) to satisfy these functions.

In the present embodiment, as a suitable example, the material of the reinforcing member 28 is carbon-fiber-reinforced plastic (CFRP) having high tensile strength and sufficient heat radiation. Since CFRP has a low density (1.5 to 2.0 g/cm$^3$) and a high tensile strength (1000 MPa or more), even a thin CFRP film can strongly reinforce the object. In addition, light weight of CFRP makes CFRP a suitable material for the reinforcing member 28.

Figure 4:
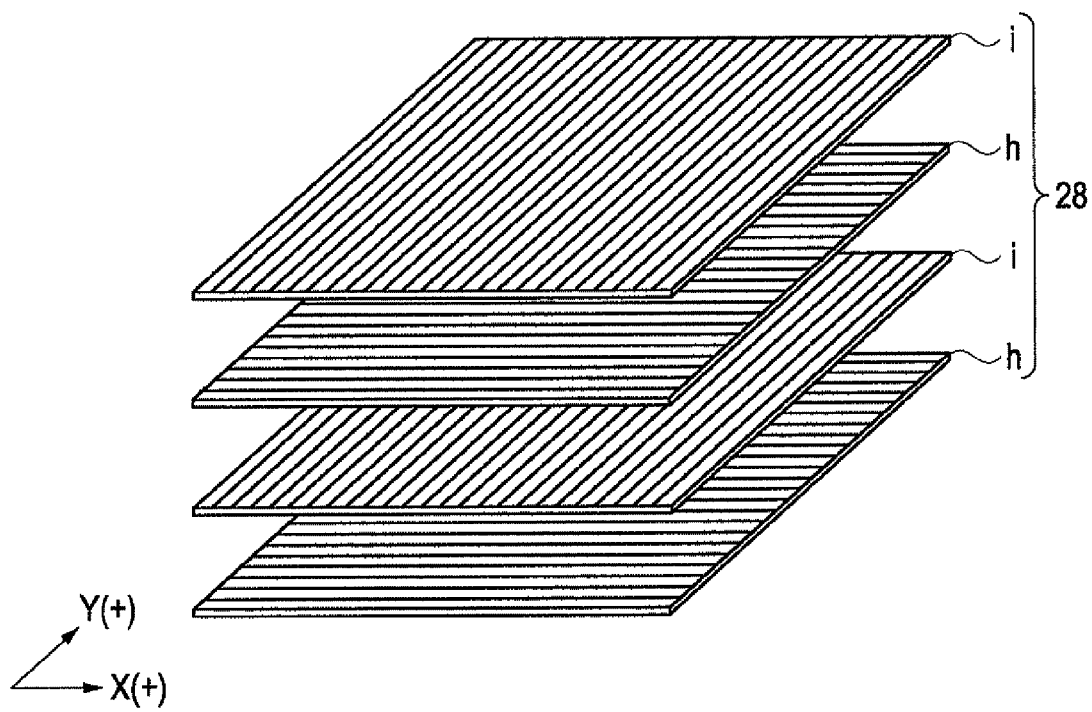
FIG. 4 is a schematic view illustrating the multilayer structure of CFRP.

FIG. 4 is a schematic view illustrating the multilayer structure of CFRP.

CFRP is a composite material of carbon fiber and resin and is manufactured by impregnating carbon fibers arranged parallel to each other with a thermosetting resin, such as an epoxy resin or a phenolic resin, or a thermoplastic resin, such as a polyester, to manufacture a precursor (carbon fiber layer) called prepreg, stacking two or more prepreg sheets alternately in different directions, and hardening the prepreg sheets.

More specifically, as illustrated in FIG. 4, two carbon fiber layers h (first carbon fiber layers), which are precursors containing a plurality of carbon fibers extending in the X-axis direction, and two carbon fiber layers i (second carbon fiber layers), which are precursors containing a plurality of carbon fibers extending in the Y-axis direction are alternately stacked and heated under pressure (for example, 120° C. to 180° C.) to manufacture a CFRP sheet. This CFRP sheet is used as the reinforcing member 28. In FIG. 4, the stripes indicate the extending direction of carbon fibers. Although the layers are separated for the sake of clarity, the layers are actually bonded to each other, forming a layered product.

Preferably, carbon fiber is polyacrylonitrile (PAN) carbon fiber or pitch (petroleum resin) carbon fiber.

In the present embodiment, although the reinforcing member 28 is a four-layer CFRP sheet as a suitable example, the reinforcing member 28 may have any multilayer structure composed of two or more carbon fiber layers having different extending directions of carbon fiber. In other words, the reinforcing member 28 may have any multilayer structure composed of two or more carbon fiber layers stacked such that the extending directions of carbon fiber cross each other.

Taking the X-axis direction as approximately 0 degrees, the extending directions of carbon fiber are basically approximately 0 degrees, approximately 90 degrees, approximately 90 degrees, and approximately 0 degrees from the bottom (the front and back sides of the reinforcing member 28 have the same extending direction of carbon fiber). The extending directions of carbon fiber may also be approximately 0 degrees, approximately 90 degrees, approximately 0 degrees, and approximately 90 degrees, or approximately 0 degrees, approximately 0 degrees, approximately 90 degrees, and approximately 90 degrees.

The front and back sides of the reinforcing member 28 basically have the same extending direction of carbon fiber, for example, 0 degrees, 90 degrees, and 0 degrees for three layers, or 0 degrees, 90 degrees, 0 degrees, 0 degrees, 90 degrees, and 0 degrees for six layers.

With any of these structures, the reinforcing member 28 can have intended functions. More specifically, the reinforcing member 28 can have a tensile strength of 1000 MPa or more in substantially all directions parallel to the surface of the reinforcing member 28.

Carbon fiber composed of high-purity carbon has a thermal conductivity in the range of 20 to 60 W/m·k, which is higher than glass (1 W/m·k) or general-purpose plastics (approximately 0.5 W/m·k), thus achieving sufficient heat radiation.

The outermost surface of a CFRP sheet may be roughened to increase its surface area, thereby improving heat radiation in the atmosphere.

Thickness of Each Component

Referring back to FIG. 3, the following is the description of the optimum thickness of each component required to impart both great flexibility and high actual strength (tenacity) to the display 100.

First, the thickness of the display panel 18 will be described below.

In FIG. 3, although the functional layer 17 is particularly magnified to clarify the relationship between the components of the functional layer 17, the functional layer 17 actually has the smallest thickness. The functional layer 17 has a thickness in the range of several micrometers to approximately 20 µm. The thickness of the buffer layer 11 accounts for more than half of the total thickness. The organic EL layer 8 composed of a plurality of thin films each having a thickness in the order of nanometers has a thickness as small as less than 1 µm. As described above with reference to FIG. 3, in order to achieve both great flexibility and high adhesive strength, a space between the substrates of the display panel 18 is entirely filled with solid substances without a hollow structure.

In the present embodiment, as a suitable example, each of the element substrate 1 and the CF substrate 16 has a thickness of approximately 40 µm. As a suitable example, the display panel 18 has a total thickness of approximately 90 µm. Experimental results obtained by the present inventors show that, in order to ensure the reliability of an organic EL panel, in addition to a sealing structure, such as the gas barrier layer 12, each of the element substrate 1 and the CF substrate 16 should have a thickness of approximately 10 µm or more. In other words, only in the case that each of the element substrate 1 and the CF substrate 16 has a thickness of approximately 10 µm or more, it is possible to ensure sufficient impact strength without impairing flexibility and excellent moisture barrier properties.

It is also known that the element substrate 1 and the CF substrate 16 each having a thickness of approximately 100 µm or more may result in poor flexibility.

Thus, each of the element substrate 1 and the CF substrate 16 preferably has a thickness in the range of 10 to 100 µm. In consideration of the balance between strength and flexibility, each of the element substrate 1 and the CF substrate 16 more preferably has a thickness in the range of 20 to 80 µm.

In consideration of the balance between strength and flexibility, the total thickness of the display panel 18 from the element substrate 1 to the CF substrate 16 preferably ranges from 50 to 120 µm.

The thickness of each of the element substrate 1 and the CF substrate 16 initially ranges from approximately 0.3 to 0.7 mm and is then reduced by polishing or etching. Preferably, after the display panel 18 including thick front and back glass substrates is manufactured, the display panel 18 having an intended thickness is manufactured by etching with an etchant (aqueous solution) containing hydrofluoric acid. The display panel 18 having an intended thickness may also be manufactured by another method, such as a mechanical polishing method.

Referring back to FIG. 2, the thicknesses of the first resin film 25a and the second resin film 25b of the laminate structure 25 will be described below.

In the present embodiment, as a suitable example, each of the first resin film 25a and the second resin film 25b is an EVA film having a thickness of approximately 50 µm. Experimental results obtained by the present inventors also show that each of the first resin film 25a and the second resin film 25b should have a thickness of approximately 20 µm or more to eliminate differences in levels including a gap around the display panel 18.

In consideration of the balance between the elimination of differences in levels and the total thickness of the display 100, each of the first resin film 25a and the second resin film 25b preferably has a thickness in the range of 20 to 100 µm. Also taking into account the cost of the first resin film 25a and the second resin film 25b and ease of lamination (workability), each of the first resin film 25a and the second resin film 25b preferably has a thickness in the range of 40 to 80 µm.

The thickness of the reinforcing member 28 will be described below.

In the present embodiment, as a suitable example, the reinforcing member 28 is a four-layer CFRP sheet having a thickness of approximately 100 µm.

A CFRP sheet can be manufactured if the CFRP sheet has a thickness of approximately 25 µm or more. With being attached to the laminate structure 25 (including the display panel 18) having the thickness described above, the reinforcing member 28 should have a thickness in the range of 50 to 200 µm to ensure flexibility and actual strength (tenacity).

The total thickness of the display 100 including these components is approximately 290 µm at the thickest portion. The thickest portion is the periphery of the display panel 18 at which the display panel 18 and the reinforcing member 28 overlap each other.

The dimensions in the suitable examples described above are one of suitable examples derived by the present inventors from experimental results and physical property data by virtue of originality and ingenuity. Thus, the dimensions of each of the components are not particularly limited and are determined within the recommended ranges for each application.

Method for Manufacturing Display

Figure 6A:
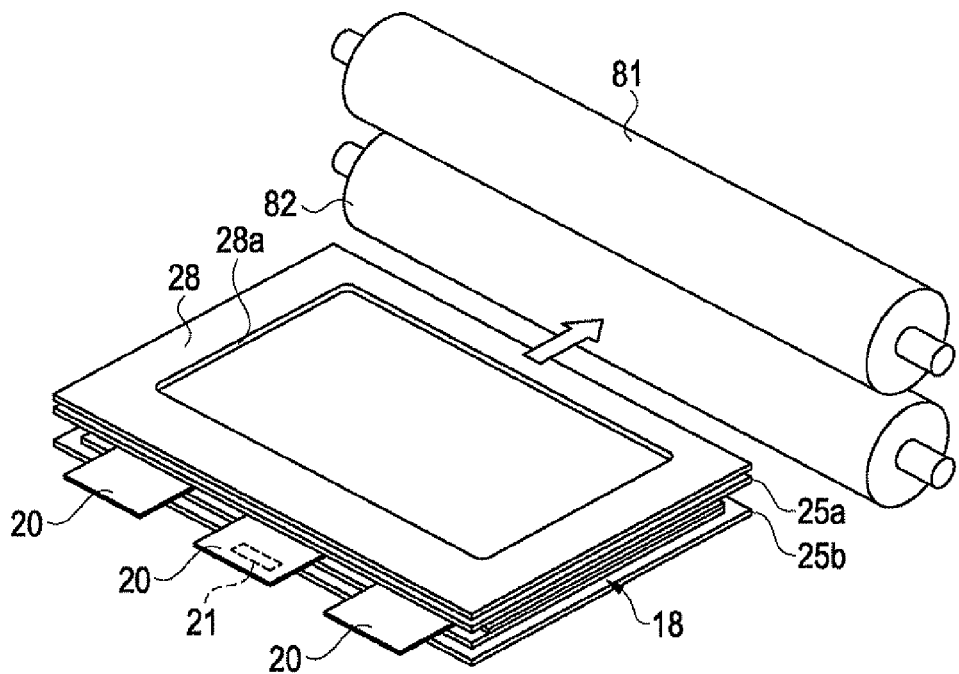
FIG. 6A is a schematic view illustrating a process of manufacturing a display according to the first embodiment.
Figure 6B:
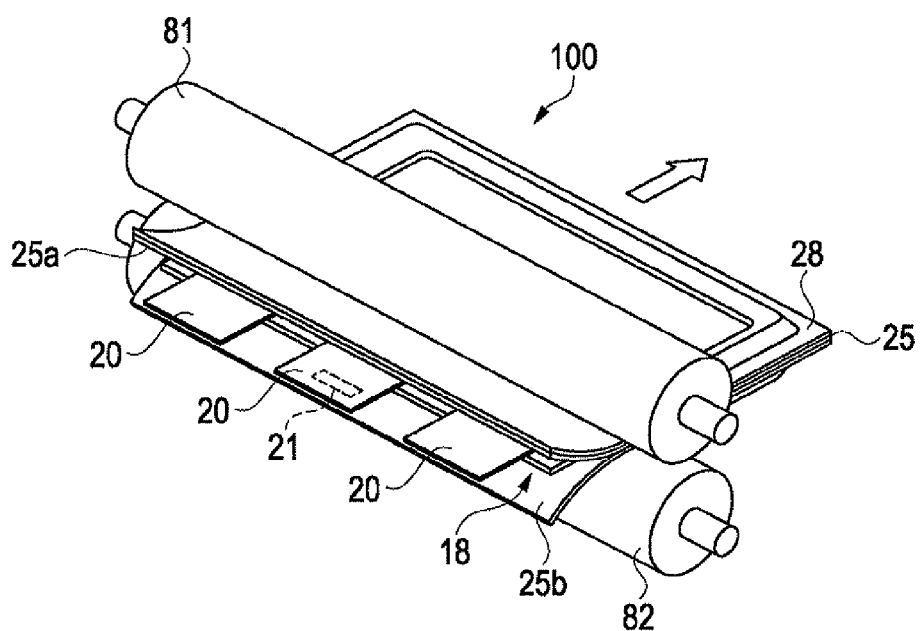
FIG. 6B is a schematic view illustrating a process of manufacturing a display according to the first embodiment.

FIG. 5 is a flow chart illustrating a method for manufacturing a display. FIGS. 6A and 6B are schematic views illustrating a process of manufacturing a display.

A method for manufacturing the display 100 will be described in detail below with reference to the flow chart shown in FIG. 5.

As illustrated in FIG. 6A, in step S1, the components are stacked (a precursor) and are placed in a laminator. More specifically, the display panel 18, the first resin film 25a, and the reinforcing member 28 are stacked on the second resin film 25b in this order. Although not shown in FIG. 6A, the components are stacked using a special-purpose guide plate and are correctly positioned. This process is performed in a normal environment as a suitable example and may also be performed under a reduced pressure as described below.

The precursor is placed in the laminator. FIG. 6A only shows the pressure rollers 81 and 82 of the laminator.

In step S2, the pressure of the environment in which the laminator and the precursor are placed is reduced. The laminator has been installed in a chamber, the internal pressure of which can be adjusted to a desired pressure. Through this process, air (air bubbles) within the precursor can be removed (degassing).

Simultaneously, the pressure rollers 81 and 82 are heated, and the roller surfaces formed of a heat-conductive elastomer are heated to a temperature in the range of 80° C. to 120° C.

In step S3, as indicated by the arrow in FIG. 6A, the side of the precursor opposite to the flexible boards 20 is inserted between the pair of pressure rollers 81 and 82 to perform lamination. The first resin film 25a and the second resin film 25b are melted by the heat of the rollers between the pressure rollers 81 and 82 and are bonded together under pressure. The first resin film 25a and the second resin film 25b thus melted function as an adhesive (filler) and bond the display panel 18, the flexible board 20, and the reinforcing member 28 together.

As the precursor is pressed from one side to the other side, even if the components contain residual air bubbles, the air bubbles are squeezed out from the other end. As illustrated in FIG. 6B, the display 100 is extruded from the pressure rollers 81 and 82 at the end of the lamination.

Step S4 involves annealing to relieve the residual stress of the display 100. The display 100 may be annealed successively under a reduced pressure or in a normal environment. In the case that the first resin film 25a and the second resin film 25b contain a cross-linking component, the display 100 is preferably annealed at approximately 100° C. to complete crosslinking.

The laminator is not limited to the roll laminator with a pair of pressure rollers 81 and 82 and may be any apparatus that can convert the precursor into the display 100 in finished form. For example, a diaphragm vacuum laminator may be used. In the diaphragm vacuum laminator, a precursor is placed on a heating plate (hot plate), a flexible rubber sheet is pushed against the precursor by a pressure difference, and the precursor is heated under pressure.

Through these steps, the display 100 having great flexibility and high actual strength (tenacity) as illustrated in FIG. 1 is formed.

The reinforcing member 28 is not necessarily disposed on the display area V side (the front side) and may be disposed on the other side (the back side) of the display area V. In other words, the reinforcing member 28 may be disposed on the outer surface of one of the first resin film 25a and the second resin film 25b. In either case, the same reinforcing effect can be achieved.

As described above, the display 100 and a method for manufacturing the display 100 according to the present embodiment have the following advantages.

In the display 100, the laminate structure 25 having such a thickness that the display 100 can have great flexibility is provided with the frame-shaped CFRP reinforcing member 28 two-dimensionally surrounding the display area V. Carbon fiber contained in CFRP has a higher tensile strength than conventional resin reinforcing plates. With the reinforcing member 28 being attached to the laminate structure 25, therefore, the reinforcing member 28 can prevent the laminate structure 25 from being bent to the breaking point (limiting radius) without impairing flexibility even when a bending stress is applied to the laminate structure 25 in the extending direction of carbon fiber.

The reinforcing member 28 has a multilayer structure composed of two or more carbon fiber layers having different extending directions of carbon fiber. This can increase the tensile strength of the laminate structure 25 in any two-dimensional direction, thereby preventing the laminate structure 25 from being bent to the breaking point (limiting radius) even if a bending stress is applied to the laminate structure 25 in any direction.

This is ascribable to the characteristics of carbon fiber: very small elongation due to high tensile strength and very small dimensional changes due to diagonal lamination of carbon fiber. Because of these characteristics, the deformation of the reinforcing member 28 under stress stops at a certain angle. The reinforcing member 28 can therefore prevent a glass substrate from being bent to the breaking point (limiting radius). Like a spring, the reinforcing member 28 also has functions of deformation constraint and recovery to its original shape.

CFRP containing carbon fiber has a coefficient of linear expansion as low as 1 ppm/° C. or less. Heat press bonding at approximately 100° C. therefore does not cause a warp in CFRP. In addition, since the coefficient of linear expansion of CFRP containing carbon fiber is very close to that of glass (4 ppm/° C.), CFRP containing carbon fiber is highly resistant to thermal shock against the display panel 18.

The four rounded corners Rs of the opening (hole) 28a of the reinforcing member 28 can reduce cracking under bending stress, as compared with square corners. For example, the rounded corners Rs have a radius of approximately 1 mm.

Thus, the display 100 having great flexibility and high actual strength (tenacity) can be provided.

Figure 34:
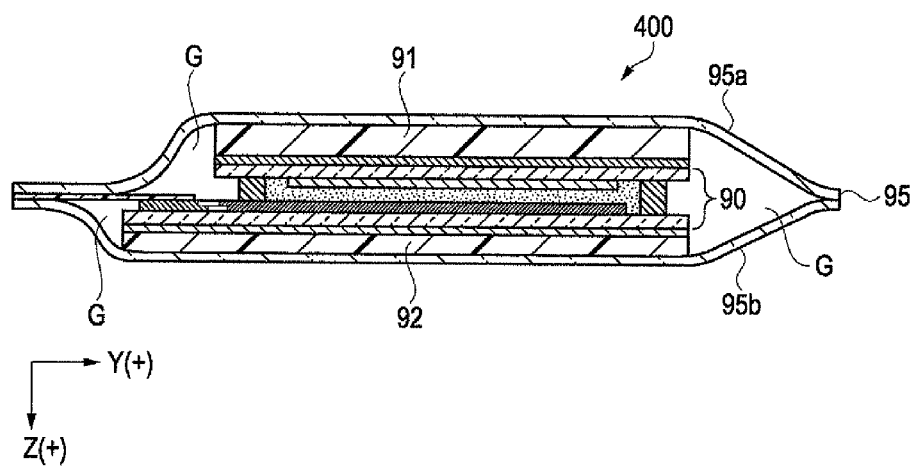
FIG. 34 is a sectional side view of a known display.

Unlike the known liquid crystal display 400 in which the reinforcing plates (91 and 92) are attached to the front and back sides of the liquid crystal panel 90 (see FIG. 34), as illustrated in FIG. 2, the structure in which the reinforcing member 28 is disposed on one of the front and back sides of the laminate structure 25 allows a reduction in the thickness of the display 100. This can improve the shape conformability of the first resin film 25a and the second resin film 25b during lamination, thereby reducing or preventing the formation of a gap around the display panel 18.

Experimental results obtained by the present inventors show that no gap was observed around the display panel 18 in a suitable example in which the display panel 18 had a thickness of approximately 90 with and the first resin film 25a and the second resin film 25b had a thickness of approximately 50 μm.

As illustrated in FIG. 1, in the case that the reinforcing member 28 is disposed on the display area V side (front side), since the reinforcing member 28 is black, the reinforcing member 28 can clearly define the display area V and function as a distinctive corner bead.

Terminals connected to the flexible board 20 and the outside area of the display area V (the ends of the display panel) on which power supply lines and common electrode wiring are disposed are likely to generate heat. The reinforcing member 28 adjacent to the terminals and the outside area can efficiently radiate heat.

Since the reinforcing member 28 has a higher thermal conductivity than resin and is exposed to the outside air on one of the front and back sides of the laminate structure 25, the reinforcing member 28 can efficiently radiate heat generated by the display panel 18. The reinforcing member 28 can therefore prevent deterioration of the display panel 18 caused by heat generation.

Thus, the display 100 having great flexibility, high actual strength (tenacity), and sufficient heat radiation can be provided.

Unlike the conventional reinforcement of the connected portion of the flexible board 20 with a silicon resin (adhesive), the first resin film 25a and the second resin film 25b also reinforce the connected portion, thus improving manufacturing efficiency. Furthermore, the connected portion and the display panel 18 can be packed in (filled with) a single resin to ensure sufficient actual strength (tenacity) without impairing flexibility.

The polyethylene adhesive layers of the first resin film 25a and the second resin film 25b have excellent insulating properties, high water resistance, and high heat resistance, thus ensuring sufficient electrical reliability.

As for the manufacturing method, unlike acrylic adhesive layers, the polyethylene adhesive layer is almost free of initial tack at room temperature, allowing air bubbles to be easily removed and facilitating the positioning of the components in the precursor. A multilayer structure can therefore be formed in one pass by heat lamination under a reduced pressure. Thus, the manufacturing is highly efficient and highly mass productive.

Since the polyethylene adhesive layer is almost free of initial tack at room temperature, contamination with foreign substances can be reduced, and contaminants, if any, can be easily removed. Small foreign substances may be taken in the adhesive layer melted by heating. Defects caused by contamination with foreign substances in the polyethylene adhesive layer can therefore be less than in generally-used acrylic adhesive layers. In addition, the polyethylene resin is a general-purpose resin and inexpensive.

Second Embodiment

Figure 7:
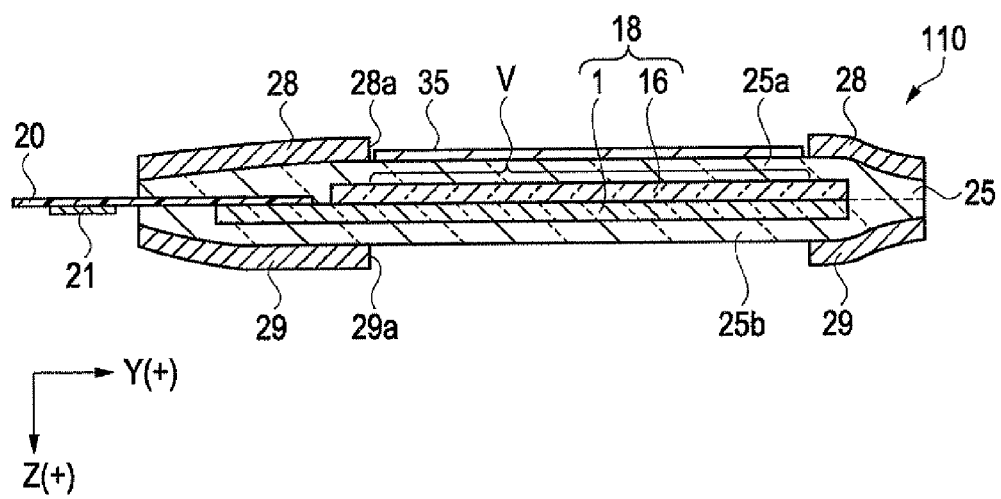
FIG. 7 is a cross-sectional view of a display according to a second embodiment of the invention.

FIG. 7 is a cross-sectional view of a display according to a second embodiment and corresponds to FIG. 2.

A display 110 according to the second embodiment will be described below. The same components as in the first embodiment are denoted by the same reference numerals and will not be further described.

In addition to the components of the display 100 according to the first embodiment, the display 110 further includes an optical film 35 and a second reinforcing member 29 on the back side of the laminate structure 25. Except for this, the description in the first embodiment substantially applies to the present embodiment.

In addition to the reinforcing member 28 (hereinafter also referred to as a first reinforcing member 28) on the front side of the laminate structure 25, the display 110 further includes the frame-shaped second reinforcing member 29 on the back side of the laminate structure 25. The second reinforcing member 29 has an opening 29a corresponding to the display area V. The second reinforcing member 29 is formed of the material for the first reinforcing member 28.

The opening (hole) 28a of the first reinforcing member 28 is provided with the optical film 35 to cover the display area V.

The optical film 35 is provided for the purpose of reinforcement, protection of the display surface, and improvement in visibility.

In the present embodiment, as a suitable example, the optical film 35 is a poly(ethylene terephthalate) (PET) film having excellent transparency. The optical film 35 has an antireflection (AR) layer on the surface to improve visibility. The antireflection layer has a multilayer structure composed of inorganic oxides having different refractive indexes.

The material of the optical film 35 is not limited to PET and may be any transparent material, for example, poly(ethylene naphthalate) (PEN), cellulose triacetate (TAC), or a cyclic olefin polymer (COP).

The surface treatment of the optical film 35 is not limited to the antireflection treatment and may be another treatment. Examples of the surface treatment include a hard-coat treatment involving the formation of a hard-coat layer, such as a PMMA layer, to improve abrasion resistance, an antireflection treatment involving the formation of a low-reflection (LR) layer formed of a low-refractive-index fluorocarbon resin, an antiglare treatment involving the formation of a rough surface, an antistatic treatment involving the formation of an antistatic layer to keep out the dust, and an oil repellent treatment involving the formation of an oil repellent layer to prevent the deposition of sebum.

As a suitable example, the optical film 35 has a thickness in the range of approximately 20 to 50 µm. General transparent resins, including PET, have a large coefficient of linear expansion (20 to 80 ppm/° C.) and are elongated by heating during lamination and shrink while being cooled to room temperature, possibly causing a warp in a panel after lamination. Even a slight reduction in the thickness of the optical film improves the shape retention ability of CFRP of the first reinforcing member 28. The optical film 35 is therefore less likely to shrink while being cooled to room temperature. Thus, a warp in the panel can be prevented. In an optical film 35 having a thickness of 20 µm or less, however, surface coating, such as hard coating or antireflection coating, is difficult to perform. Thus, the optical film 35 preferably has a thickness in the range of 20 to 50 µm. The thickness of the optical film 35 depends on the thickness of the first reinforcing member 28 and should be smaller than the thickness of the first reinforcing member 28. If the first reinforcing member 28 has a thickness of approximately 200 µm, the optical film 35 preferably has a thickness in the range of 20 to 100 µm.

Figure 8:
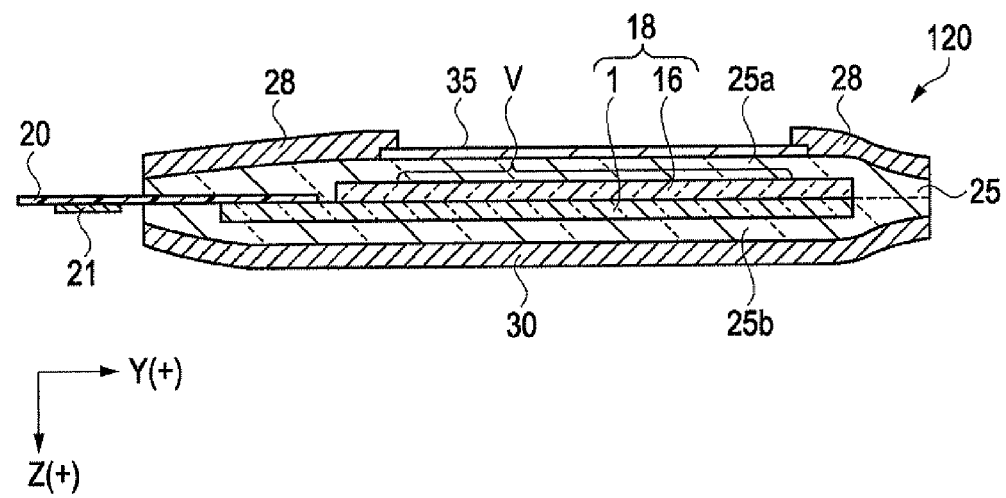
FIG. 8 is a cross-sectional view of a display according to a third embodiment of the invention.

The optical film 35 may be larger than the display area V, and the first reinforcing member 28 may be laid on the periphery of the optical film 35 (see FIG. 8). This structure can improve workability in the installation of the optical film 35.

Although each of the first reinforcing member 28 and the second reinforcing member 29 includes four carbon fiber layers having a total thickness of approximately 100 µm in the above description, the first reinforcing member 28 and the second reinforcing member 29 may have another thickness.

In the display 110, the first reinforcing member 28 and the second reinforcing member 29 are disposed on the front and back sides of the laminate structure 25. A slight reduction in the thickness of the first reinforcing member 28 and the second reinforcing member 29 therefore does not significantly affect the actual strength. For example, each of the first reinforcing member 28 and the second reinforcing member 29 may be composed of three carbon fiber layers having a total thickness of approximately 75 µm. In this case, the optical film 35 preferably has a thickness in the range of 20 to 50 µm to prevent warping of the panel after lamination.

If the first reinforcing member 28 and the second reinforcing member 29 have a multilayer structure composed of two or more carbon fiber layers having different extending directions of carbon fiber, the first reinforcing member 28 and the second reinforcing member 29 may have a thickness below 75 µm. The first reinforcing member 28 and the second reinforcing member 29 may have different thicknesses.

In addition to the advantages of the first embodiment, the present embodiment also has the following advantages.

The display 110 includes the first reinforcing member 28 on the front side and the frame-shaped second reinforcing member 29 on the back side of the laminate structure 25.

Even if a bending stress is applied to a glass substrate in any direction, therefore, the glass substrate can be prevented from being bent to the breaking point (limiting radius). In particular, the first reinforcing member 28 and the second reinforcing member 29 cover the most crack-prone periphery of the display panel 18 from the front and back sides of the laminate structure 25, thereby preventing cracking of the display panel 18.

Thus, the display 110 having great flexibility and high actual strength (tenacity) can be provided.

The first reinforcing member 28 and the second reinforcing member 29 on the front and back sides of the laminate structure 25 can efficiently radiate heat generated by the display panel 18.

Thus, the display 110 having great flexibility, high actual strength (tenacity), and sufficient heat radiation can be provided.

In the display 110, the opening (hole) 28a of the first reinforcing member 28 on the front side is provided with the optical film 35 to cover the display area V.

The optical film 35 can protect the display surface and improve the tenacity of the display 100. The optical film 35 can also improve visibility.

Third Embodiment

FIG. 8 is a cross-sectional view of a display according to a third embodiment and corresponds to FIG. 7.

A display 120 according to the third embodiment will be described below. The same components as in the second embodiment are denoted by the same reference numerals and will not be further described.

The display 120 according to the present embodiment is different from the display 110 according to the second embodiment only in the structure of the second reinforcing member on the back side of the laminate structure 25. More specifically, the display 120 includes a second reinforcing member 30 having no opening (hole) on the back side of the laminate structure 25. The optical film 35 has a larger size than the display area V, and the first reinforcing member 28 is laid on the periphery of the optical film 35. Except those, the description in the second embodiment applies to the present embodiment.

The display 120 includes the first reinforcing member 28 on the front side of the laminate structure 25 and the second reinforcing member 30 having no opening (hole) on the back side of the laminate structure 25.

The second reinforcing member 30 is a CFRP sheet composed of four carbon fiber layers having a planar size substantially the same as the second resin film 25b and has a thickness of approximately 100 μm.

Although each of the first reinforcing member 28 and the second reinforcing member 30 includes four carbon fiber layers having a thickness of approximately 100 μm in the above description, the first reinforcing member 28 and the second reinforcing member 30 may have another thickness. As described above in the second embodiment, the first reinforcing member 28 and the second reinforcing member 30 may have a reduced thickness provided that they have a multilayer structure composed of two or more carbon fiber layers having different extending directions of carbon fiber.

Since the optical film 35 is larger than the display area V, and the first reinforcing member 28 is laid on the periphery of the optical film 35, workability in the installation of the optical film 35 can be improved. More specifically, although some experience and skill are required to insert the thin optical film 35 into the opening 28a of the first reinforcing member 28 as illustrated in FIG. 7, the structure of the present embodiment facilitates the positioning of the optical film 35.

In addition to the advantages of the second embodiment, the present embodiment also has the following advantages.

The display 120 includes the first reinforcing member 28 on the front side and the second reinforcing member 30 having no opening (hole) on the back side of the laminate structure 25. The first reinforcing member 28 and the second reinforcing member 30 can efficiently radiate heat generated by the display panel 18. In particular, since the second reinforcing member 30 covers the entire surface of the display panel 18 including the display area V, the second reinforcing member 30 can efficiently radiate heat released from the display area V.

Thus, the display 120 having great flexibility, high actual strength (tenacity), and sufficient heat radiation can be provided.

Fourth Embodiment

Figure 9:
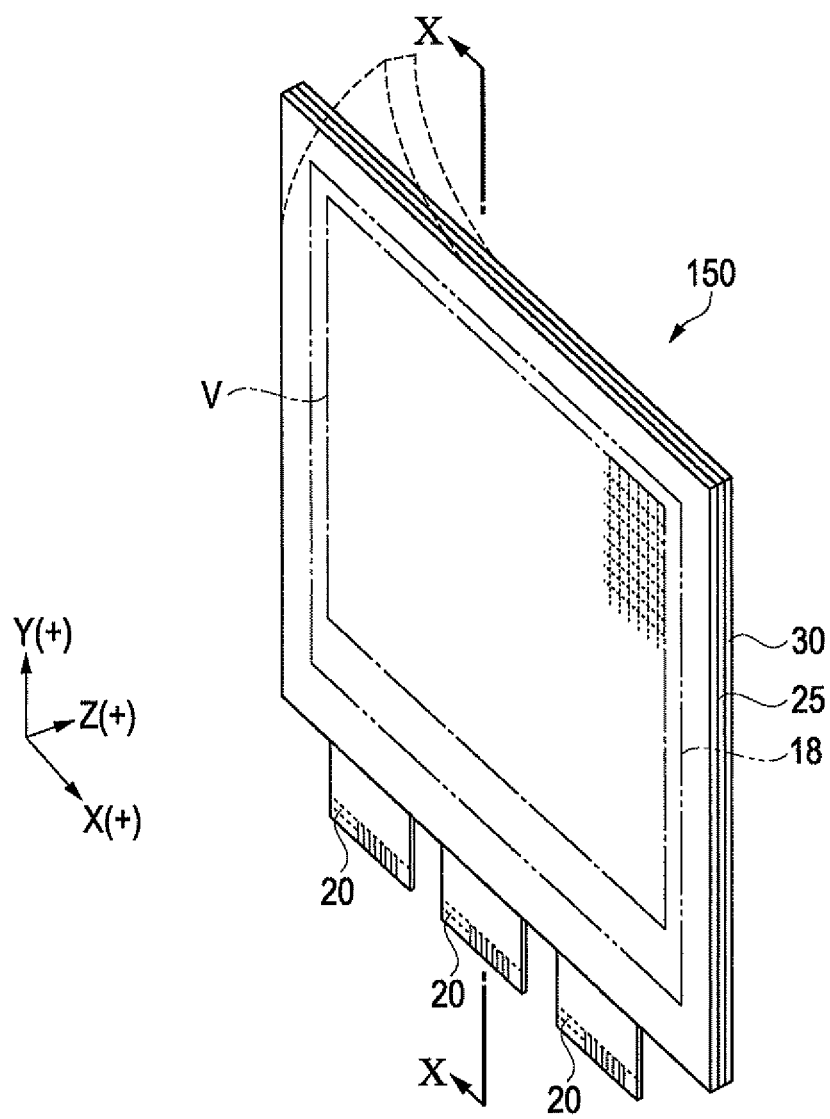
FIG. 9 is a perspective view of a display according to a fourth embodiment of the invention.
Figure 10:
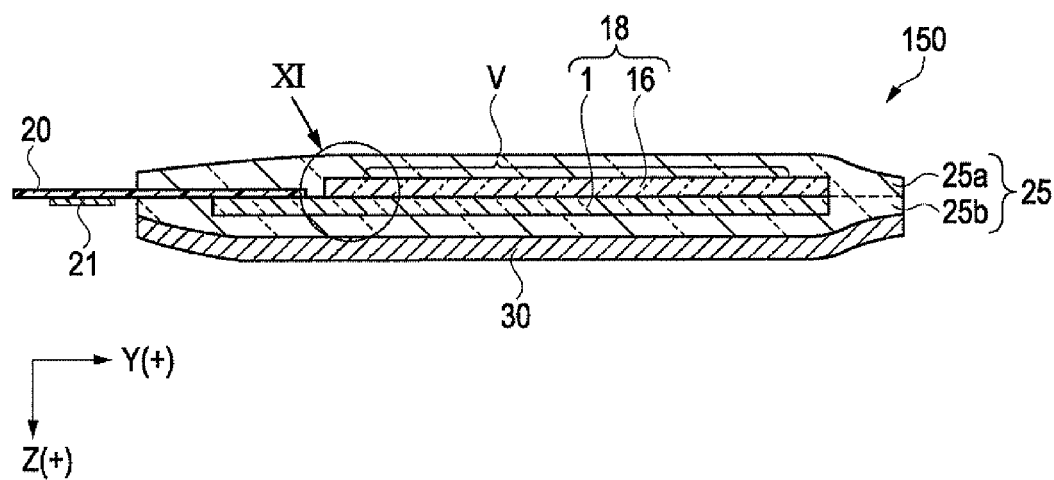
FIG. 10 is a sectional side view of the display taken along the line X-X in FIG. 9.

FIG. 9 is a perspective view of a display according to a fourth embodiment of the invention. FIG. 10 is a sectional side view of the display taken along the line X-X in FIG. 9.

A display 150 according to the fourth embodiment will be described below. The same components as in the third embodiment are denoted by the same reference numerals and will not be further described.

The display 150 according to the present embodiment has the same structure as the display 120 according to the third embodiment except that the first reinforcing member 28 on the front side and the optical film 35 are removed.

As illustrated in FIGS. 9 and 10, the display 150 is a flexible organic EL display that includes a display panel 18, which is a thin organic EL panel, between a first resin film 25a and a second resin film 25b.

The display panel 18 includes a display area V composed of a matrix of pixels. Each of a pair of substrates constituting the display panel 18 has a thickness of 100 μm or less to ensure great flexibility. The display area V includes arrays of red (R), green (G), and blue (B) color pixels. Light beams from the pixels form full color images. The display panel is not limited to a color display panel and may be a monochrome display panel.

The display 150 includes a reinforcing member 30 on the entire back side of the laminate structure 25. The reinforcing member 30 has a size substantially the same as the laminate structure 25. The reinforcing member 30 reinforces the thin display panel 18 and radiates heat generated by the display panel 18. The reinforcing member 30 is formed of a material containing carbon fiber having high thermal conductivity, high tensile strength, and a coefficient of linear expansion similar to the glass substrate. The reinforcing member 30 may be referred to as a heat radiation member 30. Thus, the display 150 has sufficient actual strength and such heat radiation characteristics that the deterioration of the display panel 18 caused by heat generation can be prevented. A warp in the display panel 18 can also be prevented. The term "actual strength", as used herein, refers to great flexibility and such tenacity that the display panel 18 is not broken when the display 150 is bent, as indicated by the dotted line in FIG. 9.

As illustrated in FIG. 10, the display panel 18 includes an element substrate 1 and a color filter (CF) substrate 16. One side of the element substrate 1 protrudes from the CF substrate 16, forming a protruding area. The protruding area is connected to a flexible board 20. A flexible board is an abbreviation of a flexible printed circuit board. A driver integrated circuit (IC) 21 is mounted on the flexible board 20. The flexible board 20 has a plurality of terminals at one end for the connection with an external device.

Detailed Structure of Display Panel

Figure 11:
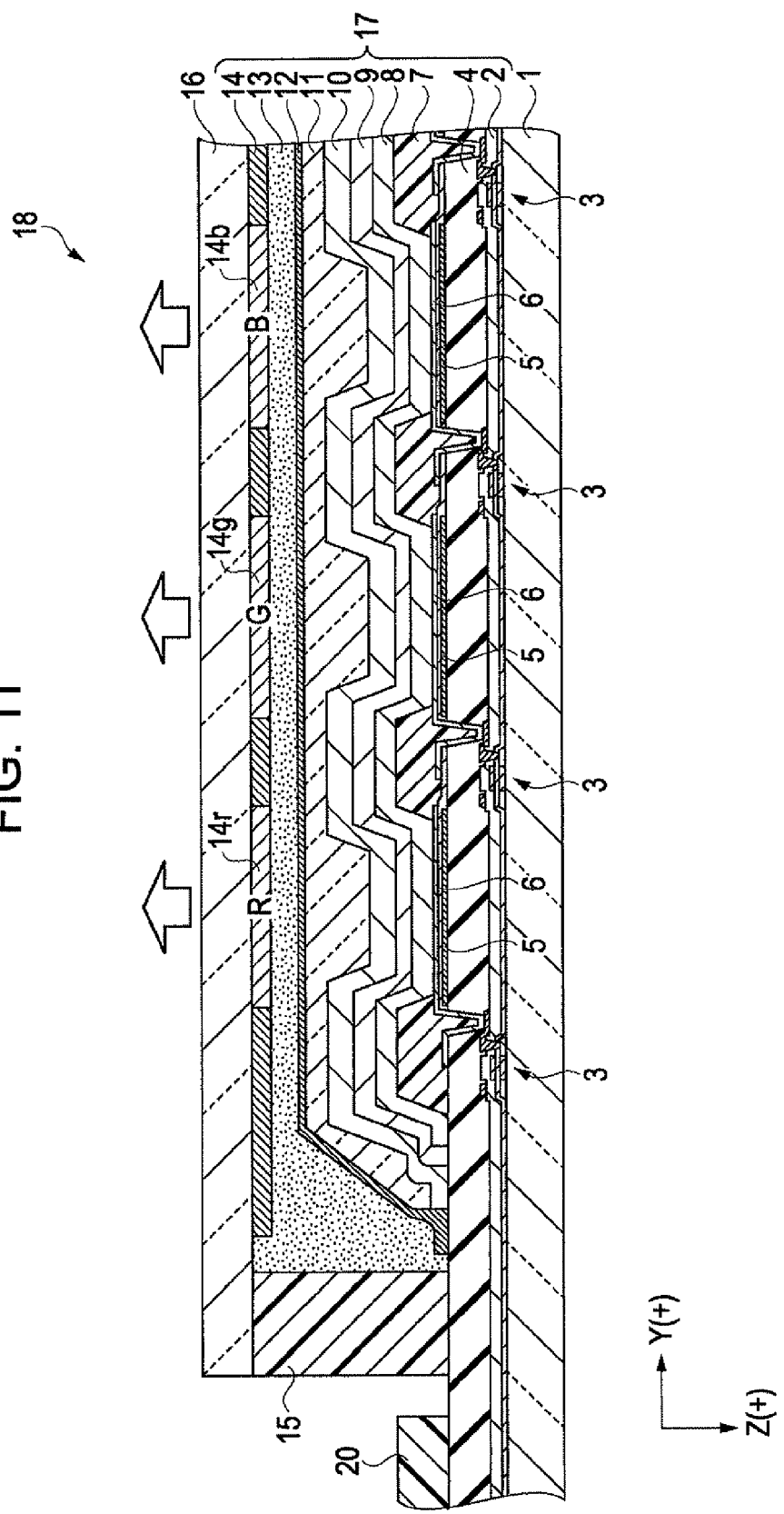
FIG. 11 is an enlarged view of a portion XI in FIG. 10.

FIG. 11 is an enlarged view of a portion XI of the display panel 18 illustrated in FIG. 10.

As described above in the first embodiment, the display panel 18 includes the element substrate 1, the element layer 2, the planarization layer 4, the pixel electrode 6, the partition 7, the organic EL layer 8 serving as an electro-optical layer, the common electrode 9, the electrode protective layer 10, the buffer layer 11, the gas barrier layer 12, the filler 13, the CF layer 14, and the CF substrate 16. White light is emitted from the organic EL layer 8 of the functional layer 17 through the CF layer 14. Thus, the display panel 18 is an organic EL panel that can display color images.

The element substrate 1 is a transparent substrate, for example, a non-alkali glass substrate.

The element layer 2 includes a pixel circuit for actively driving each pixel. The pixel circuit includes a select transistor for selecting a thin film transistor (TFT) pixel and a drive transistor 3 for applying an electric current to the organic EL layer 8. The pixel circuit is provided for each pixel.

As described above in the first embodiment, in the absence of the reflective layer 5, full color images can be displayed on the back side of the display area V. In other words, full color images can be displayed on the front and back sides of the display panel 18.

Also as described above in the first embodiment, the structure of the display panel 18 is not limited to a top emission type. The display panel 18 may have any structure in which an electro-optical layer is disposed between two glass substrates. For example, the organic EL display may be of a bottom emission type in which light from the organic EL layer 8 is emitted from the element substrate 1. The display may also be an inorganic EL display including an inorganic EL as a light source.

An electro-optical layer is not necessarily disposed between two glass substrates. For example, the organic EL layer 8 may be disposed as an electro-optical layer on a single glass substrate having the pixel electrode 6, and the common electrode 9, the electrode protective layer 10, the buffer layer 11, and the gas barrier layer 12 may be disposed on the organic EL layer 8 in this order, thus constituting a monochrome display.

A protruding area of the element substrate 1 protruding from the CF substrate 16 is connected to the flexible board 20. For example, the flexible board 20 includes copper wiring and a driver IC on a polyimide film substrate. The flexible board 20 is electrically connected to a transparent electrode formed on the element substrate 1 via an anisotropic electroconductive adhesive film.

Since the connection via the anisotropic electroconductive adhesive film has insufficient mechanical strength, the connected portion of the flexible board 20 is conventionally reinforced with a silicon resin (adhesive). However, the silicon resin tends to be easily detached.

In the present embodiment, in place of this reinforcing structure, the first resin film 25a functions as an adhesive (filler) to ensure sufficient actual strength and great flexibility. A method for bonding the first resin film 25a and the second resin film 25b will be described later.

Laminate Structure and Material of Reinforcing Member

Referring back to FIG. 10, the first resin film 25a and the second resin film 25b of the laminate structure 25 and the material of the reinforcing member 30 will be described below.

The first resin film 25a and the second resin film 25b entirely cover the front and back sides of the display panel 18 including the display area V and the periphery of the display panel 18. Thus, the first resin film 25a and the second resin film 25b require good adhesion with the glass substrate and the reinforcing member 30, great flexibility, high transparency (beam extraction efficiency), complete covering (high insulating properties and heat resistance) of the flexible board 20, and high water resistance to prevent moisture from intruding into the interior.

In order to satisfy these functions, the material of the first resin film 25a and the second resin film 25b is preferably a polyethylene resin having high water resistance (low water absorption), high insulating properties, great flexibility, high transparency, and low-temperature bondability. More preferably, the material of the first resin film 25a and the second resin film 25b is a copolymer having a polar group to improve adhesion.

The materials of the first resin film 25a and the second resin film 25b are the same as in the first embodiment.

The reinforcing member 30 should reinforce the fragile ends of the glass substrate, radiate heat generated by the display panel 18, prevent a warp in the display panel 18 having a multilayer structure composed of materials having different coefficients of linear expansion, and have tenacity (tensile resistance) to prevent the glass substrate from being bent to the breaking point (limiting radius).

Preferably, the material of the reinforcing member 30 has a high Young's modulus (10 GPa or more), a high thermal conductivity (10 W/m·k or more), and a low coefficient of linear expansion (10 ppm/° C. or less) to satisfy these functions.

In the present embodiment, as a suitable example, the material of the reinforcing member 30 is carbon-fiber-reinforced plastic (CFRP) having high tensile strength and sufficient heat radiation. Since CFRP has a low density (1.5 to 2.0 g/cm$^3$) and a high tensile strength (1000 MPa or more), even a thin CFRP film can strongly reinforce the object. In addition, light weight of CFRP makes CFRP a suitable material for the reinforcing member 30.

Carbon fiber, which is the main component of CFRP, has a thermal conductivity in the range of 20 to 60 W/m·k, which is higher than glass (1 W/m·k) or engineering plastics (approximately 0.5 W/m·k). The reinforcing member 30 therefore has sufficient functions as a heat-radiating plate.

Figure 12:
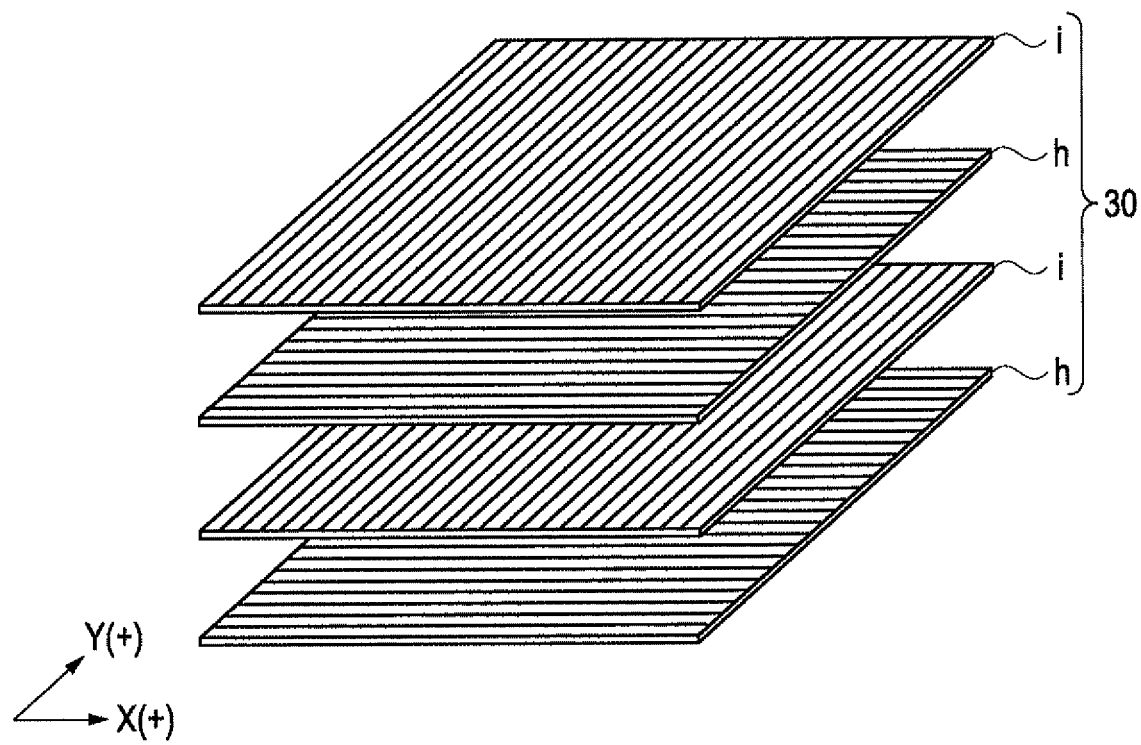
FIG. 12 is a schematic view illustrating the multilayer structure of CFRP.

FIG. 12 is a schematic view illustrating the multilayer structure of CFRP.

CFRP is a composite material of carbon fiber and resin and is manufactured by impregnating carbon fibers arranged parallel to each other with a thermosetting resin, such as an epoxy resin or a phenolic resin, or a thermoplastic resin, such as a polyester, to manufacture a precursor (carbon fiber layer) called prepreg, stacking two or more prepreg sheets alternately in different directions, and hardening the prepreg sheets.

More specifically, as illustrated in FIG. 12, two carbon fiber layers h (first carbon fiber layers), which are precursors containing a plurality of carbon fibers extending in the X-axis direction, and two carbon fiber layers i (second carbon fiber layers), which are precursors containing a plurality of carbon fibers extending in the Y-axis direction are alternately stacked and heated under pressure (for example, 120° C. to 180° C.) to manufacture a CFRP sheet. This CFRP sheet is used as the reinforcing member 30. In FIG. 12, the stripes indicate the extending direction of carbon fibers. Although the layers are separated for the sake of clarity, the layers are actually bonded to each other, forming a layered product.

Preferably, carbon fiber is polyacrylonitrile (PAN) carbon fiber or pitch (petroleum resin) carbon fiber.

In the present embodiment, although the reinforcing member 30 is a four-layer CFRP sheet as a suitable example, the reinforcing member 30 may have any multilayer structure composed of two or more carbon fiber layers having different extending directions of carbon fiber. In other words, the reinforcing member 30 may have any multilayer structure composed of two or more carbon fiber layers stacked such that the extending directions of carbon fiber cross each other.

Taking the X-axis direction as approximately 0 degrees, the extending directions of carbon fiber are basically approximately 0 degrees, approximately 90 degrees, approximately 90 degrees, and approximately 0 degrees from the bottom (the front and back sides of the reinforcing member 30 have the same extending direction of carbon fiber). The extending directions of carbon fiber may also be approximately 0 degrees, approximately 90 degrees, approximately 0 degrees, and approximately 90 degrees, or approximately 0 degrees, approximately 0 degrees, approximately 90 degrees, and approximately 90 degrees.

The front and back sides of the reinforcing member 30 basically have the same extending direction of carbon fiber, for example, 0 degrees, 90 degrees, and 0 degrees for three layers, or 0 degrees, 90 degrees, 0 degrees, 0 degrees, 90 degrees, and 0 degrees for six layers.

With any of these structures, the reinforcing member 30 can have intended functions. More specifically, the reinforcing member 30 can have a tensile strength of 1000 MPa or more in substantially all directions parallel to the surface of the reinforcing member 30.

Carbon fiber composed of high-purity carbon has a thermal conductivity in the range of 20 to 60 W/m·k, which is higher than glass (1 W/m·k) or general-purpose plastics (approximately 0.5 W/m·k), thus achieving sufficient heat radiation. The outermost surface of a CFRP sheet may be roughened to increase its surface area, thereby improving heat radiation in the atmosphere.

Thickness of Each Component

Referring back to FIG. 11, the following is the description of the optimum thickness of each component required to impart both great flexibility and high actual strength (tenacity) to the display 150.

First, the thickness of the display panel 18 will be described below. In order to achieve both great flexibility and high adhesive strength, a space between the substrates of the display panel 18 is entirely filled with solid substances without a hollow structure.

In FIG. 11, although the functional layer 17 is particularly magnified to clarify the relationship between the components of the functional layer 17, the functional layer 17 actually has the smallest thickness. The functional layer 17 has a thickness in the range of several micrometers to approximately 20 μm. The thickness of the buffer layer 11 accounts for more than half of the total thickness. The organic EL layer 8 composed of a plurality of thin films each having a thickness in the order of nanometers has a thickness as small as less than 1 μm.

In the present embodiment, as a suitable example, each of the element substrate 1 and the CF substrate 16 has a thickness of approximately 40 μm. As a suitable example, the display panel 18 has a total thickness of approximately 90 μm. Experimental results obtained by the present inventors show that, in order to ensure the reliability of an organic EL panel, in addition to a sealing structure, such as the gas barrier layer 12, each of the element substrate 1 and the CF substrate 16 should have a thickness of approximately 10 μm or more. In other words, only in the case that each of the element substrate 1 and the CF substrate 16 has a thickness of approximately 10 μm or more, it is possible to ensure sufficient impact strength without impairing flexibility and excellent moisture barrier properties.

It is also known that the element substrate 1 and the CF substrate 16 each having a thickness of approximately 100 μm or more may result in poor flexibility.

Thus, each of the element substrate 1 and the CF substrate 16 preferably has a thickness in the range of 10 to 100 μam. In consideration of the balance between strength and flexibility, each of the element substrate 1 and the CF substrate 16 more preferably has a thickness in the range of 20 to 80 μm.

In consideration of the balance between strength and flexibility, the total thickness of the display panel 18 from the element substrate 1 to the CF substrate 16 preferably ranges from 50 to 120 μm.

The thickness of each of the element substrate 1 and the CF substrate 16 initially ranges from approximately 0.3 to 0.7 mm and is then reduced by polishing or etching. Preferably, after a display panel including thick front and back glass substrates is manufactured, the display panel 18 having an intended thickness is manufactured by etching with an etchant (aqueous solution) containing hydrofluoric acid. The display panel 18 having an intended thickness may also be manufactured by another method, such as a mechanical polishing method.

Referring back to FIG. 10, the thicknesses of the first resin film 25a and the second resin film 25b of the laminate structure 25 will be described below.

In the present embodiment, as a suitable example, each of the first resin film 25a and the second resin film 25b is an EVA film having a thickness of approximately 50 μm. Experimental results obtained by the present inventors also show that each of the first resin film 25a and the second resin film 25b should have a thickness of approximately 20 μm or more to eliminate differences in levels including a gap around the display panel 18.

In consideration of the balance between the elimination of differences in levels and the total thickness of the display 150, each of the first resin film 25a and the second resin film 25b preferably has a thickness in the range of 20 to 100 μm. Also taking into account the cost of the first resin film 25a and the second resin film 25b and ease of lamination (workability), each of the first resin film 25a and the second resin film 25b preferably has a thickness in the range of 40 to 80 μm.

The thickness of the reinforcing member 30 will be described below.

In the present embodiment, as a suitable example, the reinforcing member 30 is a four-layer CFRP sheet having a thickness of approximately 100 μm.

A CFRP sheet can be manufactured if the CFRP sheet has a thickness of approximately 25 μm or more. With being attached to the laminate structure 25 (including the display panel 18) having the thickness described above, the reinforcing member 30 should have a thickness in the range of 50 to 200 μm to ensure flexibility and actual strength (tenacity).

The total thickness of the display 150 including these components is approximately 260 μm at the thickest portion. The thickest portion is the periphery of the display panel 18 at which the display panel 18 and the reinforcing member 30 overlap each other.

The dimensions in the suitable examples described above are one of suitable examples derived by the present inventors from experimental results and physical property data by virtue of originality and ingenuity. Thus, the dimensions of each of the components are not particularly limited and are determined within the recommended ranges for each application.

Method for Manufacturing Display

Figure 13:
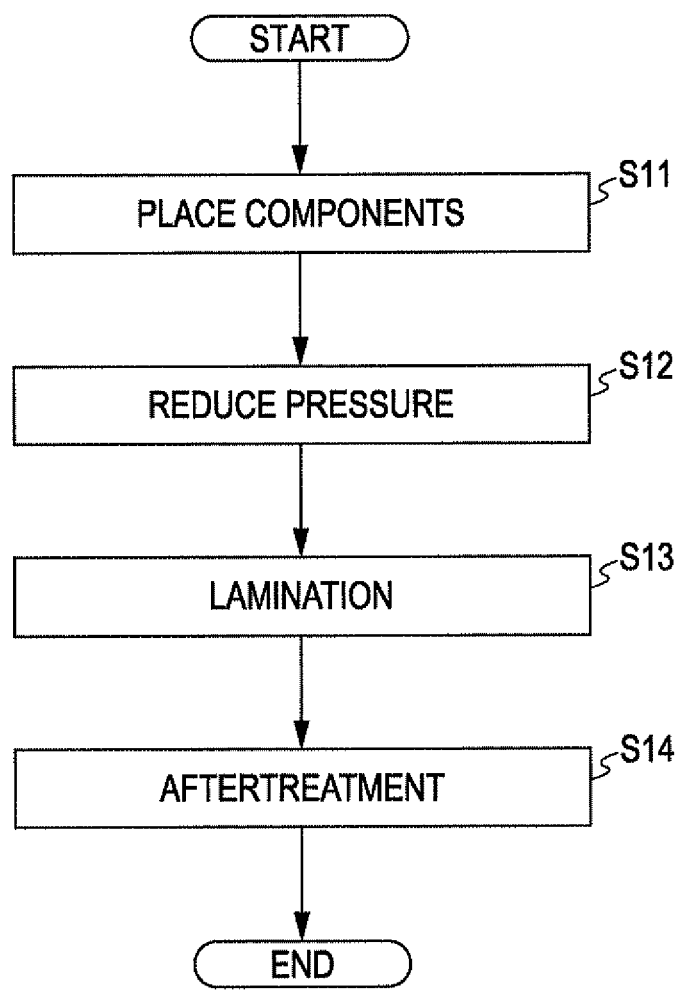
FIG. 13 is a flow chart illustrating a method for manufacturing a display according to the fourth embodiment.
Figure 14A:
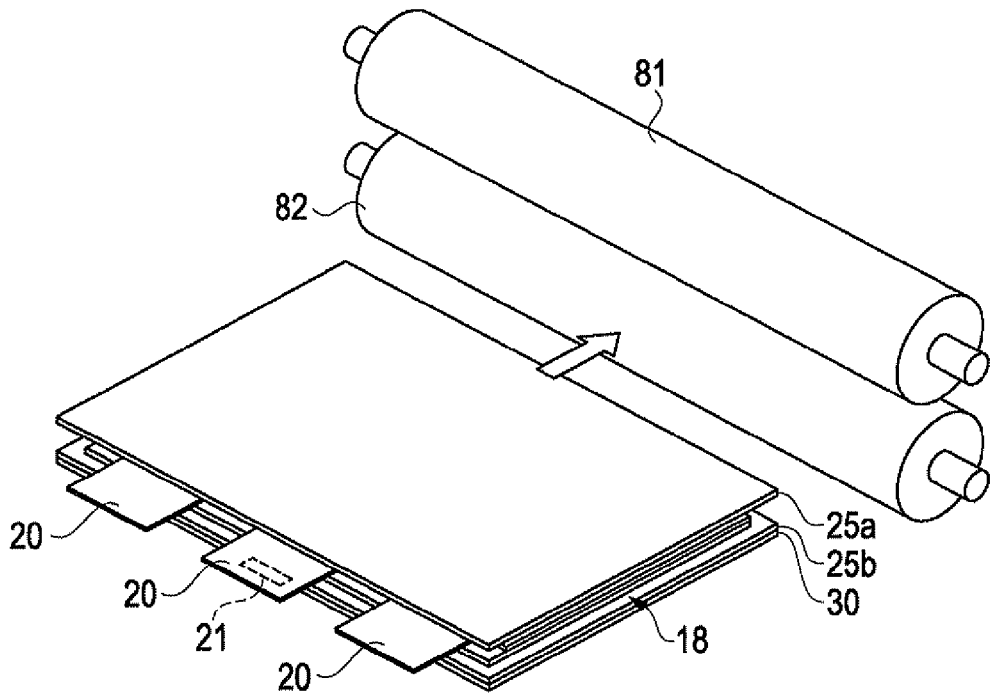
FIG. 14A is a schematic view illustrating a process of the method for manufacturing a display according to the fourth embodiment.
Figure 14B:
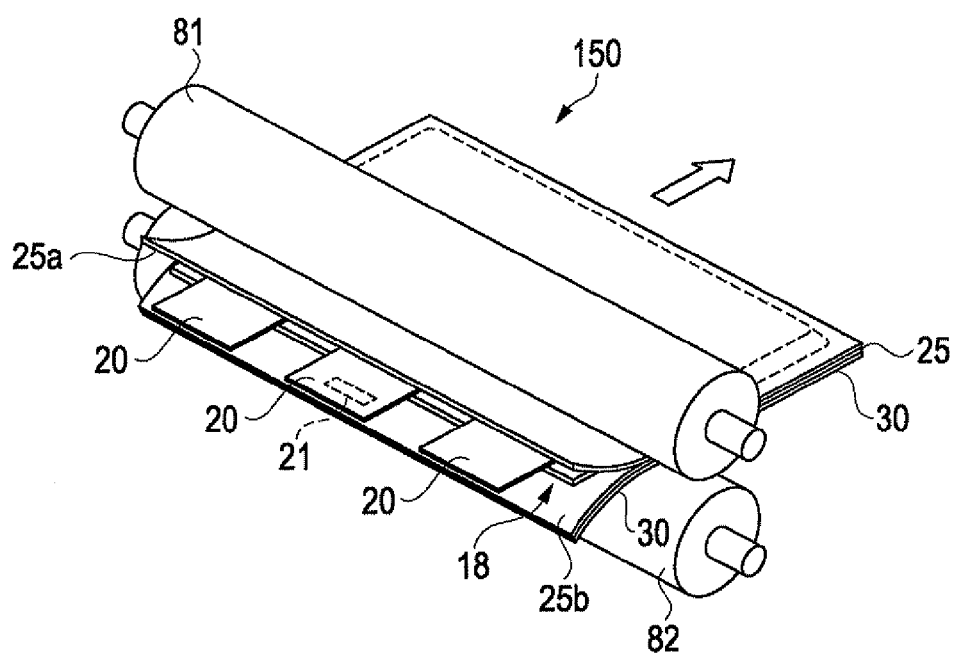
FIG. 14B is a schematic view illustrating a process of the method for manufacturing a display according to the fourth embodiment.

FIG. 13 is a flow chart illustrating a method for manufacturing a display according to the fourth embodiment. FIGS. 14A and 14B are schematic views illustrating a process of manufacturing a display.

A method for manufacturing the display 150 will be described in detail below with reference to the flow chart shown in FIG. 13.

As illustrated in FIG. 14A, in step S11, the components are stacked (a precursor) and are placed in a laminator. More specifically, the second resin film 25b, the display panel 18, and the first resin film 25a are stacked on the reinforcing member 30 in this order. Although not shown in FIG. 14A, the components are stacked using a special-purpose guide plate and are correctly positioned. This process is performed in a normal environment as a suitable example and may also be performed under a reduced pressure as described below.

The precursor is placed in the laminator. FIG. 14A only shows the pressure rollers 81 and 82 of the laminator.

In step S12, the pressure of the environment in which the laminator and the precursor are placed is reduced. The laminator has been installed in a chamber, the internal pressure of which can be adjusted to a desired pressure. Through this process, air (air bubbles) within the precursor can be removed (degassing).

Simultaneously, the pressure rollers 81 and 82 are heated, and the roller surfaces formed of a heat-conductive elastomer are heated to a temperature in the range of 80° C. to 120° C.

In step S13, as indicated by the arrow in FIG. 14A, the side of the precursor opposite to the flexible boards 20 is inserted between the pair of pressure rollers 81 and 82 to perform lamination. The first resin film 25a and the second resin film 25b are melted by the heat of the rollers between the pressure rollers 81 and 82 and are bonded together under pressure. The first resin film 25a and the second resin film 25b thus melted function as an adhesive (filler) and bond the display panel 18, the flexible board 20, and the reinforcing member 30 together.

As the precursor is pressed from one side to the other side, even if the components contain residual air bubbles, the air bubbles are squeezed out from the other end. As illustrated in FIG. 14B, the display 150 is extruded from the pressure rollers 81 and 82 at the end of the lamination.

Step S14 involves annealing to relieve the residual stress of the display 150. The display 150 may be annealed successively under a reduced pressure or in a normal environment. In the case that the first resin film 25a and the second resin film 25b contain a cross-linking component, the display 150 is preferably annealed at approximately 100° C. to complete crosslinking.

The laminator is not limited to the roll laminator with a pair of pressure rollers 81 and 82 and may be any apparatus that can convert the precursor into the display 150 in finished form. For example, a diaphragm vacuum laminator may be used. In the diaphragm vacuum laminator, a precursor is placed on a heating plate (hot plate), a flexible rubber sheet is pushed against the precursor by a pressure difference, and the precursor is heated under pressure.

Through these processes, the display 150 having high actual strength (tenacity) and sufficient heat radiation can be fabricated as illustrated in FIG. 10 (or FIG. 9) without impairing great flexibility.

The size of the reinforcing member 30 is not limited to a size substantially the same as the laminate structure 25. For example, a size required to cover the most exothermic display area V may be sufficient for heat radiation. In terms of strength, a size required to cover the periphery of the display panel 18, which is prone to cause a crack in bending, may be sufficient.

Thus, the size of the reinforcing member 30 may range from a size required to cover the display area V to a size substantially the same as the laminate structure 25 in accordance with the specifications required for the display 150.

As described above, the display 150 and a method for manufacturing the display 150 according to the present embodiment have the following advantages.

The display 150 includes the reinforcing member 30 on the back side of the laminate structure 25 to cover the display panel 18. The reinforcing member 30 has a multilayer structure composed of two or more carbon fiber layers having different extending directions of carbon fiber.

As described above, carbon fiber is manufactured by carbonizing long fiber at high temperatures of 1000° C. or more to high purity. The long fiber can be made of polyacrylonitrile (PAN) or pitch. Carbon fiber has high tensile strength, a low thermal deformation ratio (a low coefficient of linear expansion), and high thermal conductivity.

Since the reinforcing member 30 containing carbon fiber having a higher thermal conductivity than resin is disposed on the outer surface (the outermost surface) of the second resin film 25b, the display 150 can more efficiently radiate heat generated by the display panel 18 than the known liquid crystal display 400 (see FIG. 34) that includes the aluminum reinforcing plate 92 in the laminate structure.

In particular, since the reinforcing member 30 entirely covers the exterior of the display panel 18 including the most exothermic display area V, that is, the periphery of the display panel 18, the display 150 can effectively radiate heat.

Unlike conventional aluminum exhibiting large thermal expansion and contraction, the reinforcing member 30 has a coefficient of linear expansion of approximately 1 ppm/° C. The reinforcing member 30 on the entire back side of the laminate structure 25 does not cause a warp in the display 150.

Thus, the display 150 that can sufficiently radiate heat and is prevented from warping is provided.

Carbon fiber has a higher tensile strength than conventional resin reinforcing plates or aluminum. With the reinforcing member 30 being attached to the laminate structure 25, therefore, the reinforcing member 30 can prevent the glass substrate from being bent to the breaking point (limiting radius) even when a bending stress is applied to the glass substrate in the extending direction of carbon fiber.

In particular, since the reinforcing member 30 covers the most crack-prone periphery of the display panel 18, which is prone to cause a crack under bending stress, the occurrence of a crack can be prevented without fail.

Since the reinforcing member 30 has a multilayer structure that includes the first carbon fiber layer containing a plurality of carbon fibers extending in a first direction and the second carbon fiber layer containing a plurality of carbon fibers extending in a second direction, which crosses the first direction, the first and second carbon fiber layers can increase the tensile strength of the reinforcing member 30 in any two-dimensional direction, thereby preventing a glass substrate from being bent to the breaking point (limiting radius) even if a bending stress is applied to the glass substrate in any direction. Like a spring, the reinforcing member 30 also has functions of deformation constraint and recovery to its original shape.

Thus, the display 150 can have sufficient actual strength.

As compared with the known liquid crystal display 400 (see FIG. 34) that includes the reinforcing plates on the front and back sides of the display panel 18, the structure in which the reinforcing member 30 is disposed only on the outer surface of the laminate structure 25 allows a reduction in the thickness of the display panel 18. This can improve the shape conformability of the first resin film 25a and the second resin film 25b during lamination, thereby reducing or preventing the formation of a gap around the display panel 18. Thus, a gap around the display panel 18 can be reduced in the lamination of the resin film, thereby achieving sufficient barrier properties to prevent moisture from intruding into the interior.

Experimental results obtained by the present inventors show that no gap was observed around the display panel 18 in a suitable example in which the display panel 18 had a thickness of approximately 90 µm and the first resin film 25a and the second resin film 25b had a thickness of approximately 50 µm.

Thus, the display 150 can have high reliability.

Unlike the conventional reinforcement of the connected portion of the flexible board 20 with a silicon resin (adhesive), the first resin film 25a and the second resin film 25b also reinforce the connected portion, thus improving manufacturing efficiency. Furthermore, the connected portion and the display panel 18 can be packed in (filled with) a single resin to ensure sufficient actual strength (tenacity) without impairing flexibility.

The polyethylene adhesive layers of the first resin film 25a and the second resin film 25b have excellent insulating properties, high water resistance, and high heat resistance, thus ensuring sufficient electrical reliability.

As for the manufacturing method, unlike acrylic adhesive layers, the polyethylene adhesive layer is almost free of initial tack at room temperature, allowing air bubbles to be easily removed and facilitating the positioning of the components in the precursor. A multilayer structure can therefore be formed in one pass by heat lamination under a reduced pressure. Thus, the manufacturing is highly efficient and highly mass productive.

Since the polyethylene adhesive layer is almost free of initial tack at room temperature, contamination with foreign substances can be reduced, and contaminants, if any, can be easily removed. Small foreign substances may be taken in the adhesive layer melted by heating. Defects caused by contamination with foreign substances in the polyethylene adhesive layer can therefore be less than in generally-used acrylic adhesive layers. In addition, the polyethylene resin is a general-purpose resin and inexpensive.

Fifth Embodiment

Figure 15A:
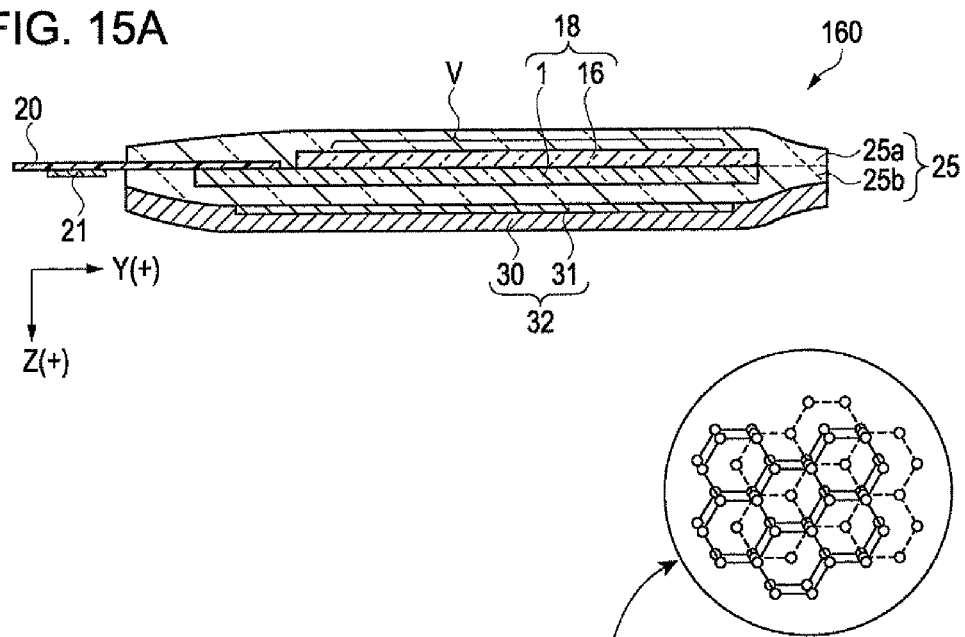
FIG. 15A is a cross-sectional view of a display according to a fifth embodiment of the invention.
Figure 15B:
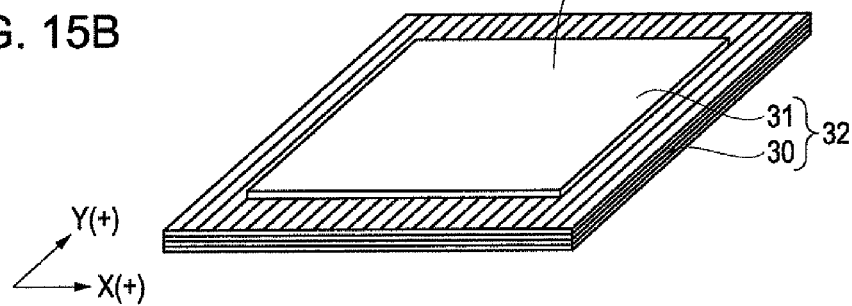
FIG. 15B is a perspective view of a reinforcing member according to the fifth embodiment.
Figure 15C:
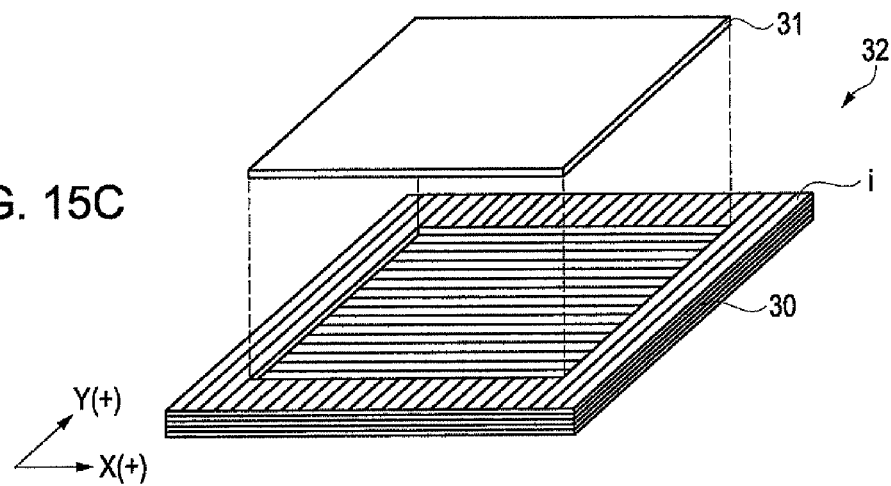
FIG. 15C is a perspective view of the reinforcing member according to the fifth embodiment.

FIG. 15A is a cross-sectional view of a display according to a fifth embodiment and corresponds to FIG. 10. FIGS. 15B and 15C are perspective views of a reinforcing member according to the fifth embodiment.

A display 160 according to the fifth embodiment will be described below. The same components as in the fourth embodiment are denoted by the same reference numerals and will not be further described.

The display 160 according to the present embodiment includes a reinforcing member 32, which is structurally different from the reinforcing member 30 in the fourth embodiment. More specifically, the reinforcing member 32 exhibits better heat radiation characteristics than the reinforcing member 30. Except for this, the description in the fourth embodiment substantially applies to the present embodiment.

The reinforcing member 32 is disposed on the entire back side of the laminate structure 25 in the display 160. The reinforcing member 32 has a size substantially the same as the laminate structure 25.

As illustrated in FIG. 15B, the reinforcing member 32 includes a graphite layer 31 on a four-layer CFRP reinforcing body 30 in an integrated form. Although the reinforcing body 30 has the same structure as the reinforcing member 30 in the fourth embodiment, the reinforcing body 30 is part of the reinforcing member 32 and is designated differently from the reinforcing member 30.

The graphite layer 31 includes layers composed of carbon atoms having a hexagonal structure (as illustrated in an enlarged view in a circle in FIG. 15B) stacked in the thickness direction (the Z-axis direction).

The graphite layer 31 has a thermal conductivity as high as 600 to 1500 W/m·k in the in-plane direction. The graphite layer 31 disposed between the laminate structure 25 and the reinforcing body 30 can improve heat radiation. More specifically, heat generated by the display panel 18 is radially diffused across the graphite layer 31 in a short period of time. The graphite layer 31 can transfer heat to the reinforcing body 30 on the outermost surface, thus improving heat radiation. Graphite may be synthetic graphite manufactured by firing the starting material of a polyimide film at 1000° C. or more for crystallization or natural graphite manufactured by rolling graphite particles produced from a mine into a film. In either case, graphite has a hexagonal structure and a thermal conductivity of 600 W/m·k or more. The graphite layer 31 has a coefficient of linear expansion of approximately 5 ppm/° C., which is substantially the same as that of a glass substrate.

A layered product composed of the CFRP reinforcing body 30 and the graphite layer 31 is also referred to as carbon fiber graphite reinforced plastic (CFGRP).

For example, the reinforcing member 32 (CFGRP) can be manufactured by stacking an epoxy-intermediate-impregnated carbon fiber prepreg film (layer) on a graphite film (layer) and hot-pressing them under reduced pressure. The heating temperature preferably ranges from 120° C. to 150° C.

As described in the fourth embodiment, although the reinforcing body 30 is a four-layer CFRP sheet as a suitable example in the present embodiment, the reinforcing body 30 may have any multilayer structure composed of two or more carbon fiber layers having different extending directions of carbon fiber.

The graphite layer 31 is smaller than the reinforcing body 30. In other words, the periphery of the graphite layer 31 is within the reinforcing body 30. The graphite layer 31 is suitably larger than the display area V of the display panel 18 but smaller than the display panel 18.

Such a structure is intended to exploit the high thermal conductivity of the graphite layer 31 and compensate for low abrasion resistance and fragility of the graphite layer 31. Such a structure has been designed such that a portion generating a large amount of heat is covered with the graphite layer 31 while less bending stress is applied to the portion during lamination.

In the present embodiment, as a suitable example, the reinforcing member 32 is a five-layer CFGRP sheet having a thickness of approximately 140 μm. More specifically, the CFGRP sheet includes four CFRP layers having a total thickness of approximately 100 μm and the graphite layer 31 having a thickness of approximately 40 μm.

The thickness of the reinforcing member 32 is not limited to this thickness and may range from approximately 50 to 200 μm. Within this thickness range, the display 160 can have self-supporting ability, a high strength, and moderate flexibility.

Preferably, the graphite layer 31 has a thickness of 50 μm or less to ensure thermal conductivity in the thickness direction.

The structure of the reinforcing member 32 is not limited to the structure illustrated in FIG. 15B. For example, the reinforcing member 32 may have the structure illustrated in FIG. 15C.

In the reinforcing member 32 illustrated in FIG. 15C, the top carbon fiber layer i of the reinforcing body 30 has an opening (hole) into which the graphite layer 31 is inserted. In other words, the top carbon fiber layer i has a frame shape with an opening into which the graphite layer 31 is inserted.

Thus, the reinforcing member 32 includes the graphite layer 31 placed in the opening. The reinforcing member 32 may be manufactured by hot pressing.

In this structure, the graphite layer 31 has such a thickness that the top surface of the graphite layer 31 is flush with or higher than the top surface of the carbon fiber layer i to ensure heat transfer. As a suitable example, the graphite layer 31 has a thickness of approximately 25 μm, which is the same as the height of the carbon fiber layer i.

This structure allows a reduction in the total thickness of the display 160 while the heat radiation characteristics are substantially the same as the reinforcing member 32 illustrated in FIG. 15B.

In addition to the advantages of the fourth embodiment, the present embodiment also has the following advantages.

The display 160 includes the reinforcing member 32 on the back side of the laminate structure 25. The reinforcing member 32 includes the CFRP reinforcing body 30 and the graphite layer 31 in an integrated form.

In particular, the graphite layer 31 having high thermal conductivity disposed between the laminate structure 25 and the reinforcing body 30 can radially diffuse heat generated by the display panel 18 across the graphite layer 31 in a short period of time. The graphite layer 31 can transfer heat to the reinforcing body 30 on the outermost surface. The reinforcing body 30 on the outermost surface can radiate heat to the outside.

The graphite layer 31 has a coefficient of linear expansion of approximately 5 ppm/° C., which is substantially the same as that of a glass substrate. The reinforcing member 32 including the graphite layer 31 disposed on the CFRP reinforcing body 30 can therefore be attached to the laminate structure 25 without causing a warp in the laminate structure 25.

Thus, the display 160 that can sufficiently radiate heat and is prevented from warping is provided.

The graphite layer 31 having a thickness as small as 50 μm or less is covered with the reinforcing body 30 and the second resin film 25b such that the periphery of the graphite layer 31 is not exposed. Such a structure can compensate for low abrasion resistance and fragility of the graphite layer 31, thereby ensuring sufficient actual strength, without impairing thermal conductivity in the thickness direction.

Thus, the display 160 can have sufficient actual strength while having great flexibility.

Sixth Embodiment

Figure 16:
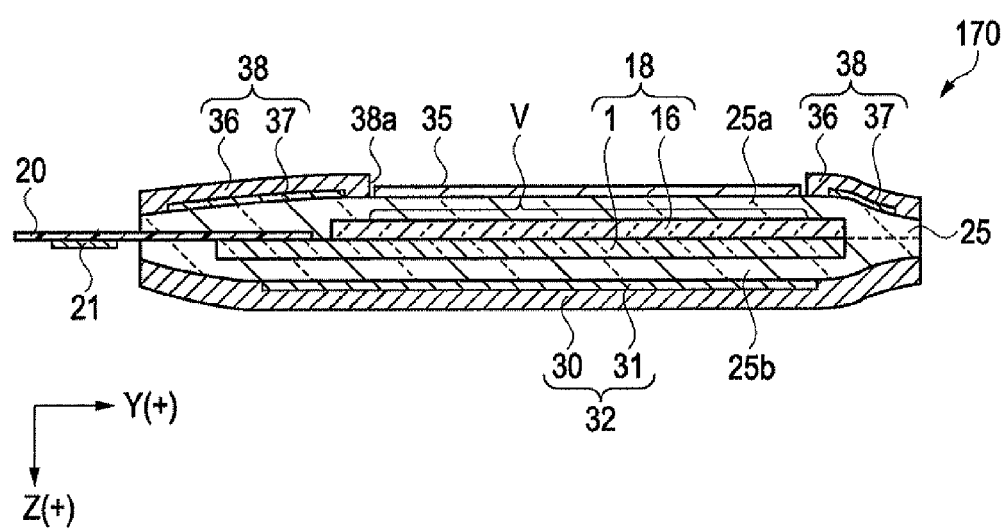
FIG. 16 is a cross-sectional view of a display according to a sixth embodiment of the invention.

FIG. 16 is a cross-sectional view of a display according to a sixth embodiment and corresponds to FIG. 15A.

A display 170 according to the sixth embodiment will be described below. The same components as in the fourth and fifth embodiments are denoted by the same reference numerals and will not be further described.

In addition to the structure of the display 160 according to the fifth embodiment, the display 170 according to the present embodiment further includes a frame-shaped first reinforcing member 38 on the front side and an optical film 35. Except for this, the description for the display 160 according to the fifth embodiment substantially applies to the present embodiment. The designations "a first reinforcing member" and "a second reinforcing member" are intended for differentiation. Thus, a second reinforcing member 30 may be referred to as a first reinforcing member, and the first reinforcing member 38 may be referred to as a second reinforcing member. The same applies to the other embodiments and modified embodiments.

The frame-shaped first reinforcing member 38 two-dimensionally surrounding the display area V is disposed on the display area V side of the laminate structure 25 in the display 170. The term "frame-shaped", as used herein, means that the reinforcing member has an opening 38a corresponding to the display area V of the display panel 18. Preferably, the contour of the opening 38a of the first reinforcing member 38 follows the contour of the display area V, and the first reinforcing member 38 covers the display panel 18 to the ends of the display panel 18.

The first reinforcing member 38 includes a graphite layer 37 on a four-layer CFRP reinforcing body 36 in an integrated form. The reinforcing body 36 is formed of the same material as the reinforcing body 30 according to the fifth embodiment, and the graphite layer 37 is formed of the same material as the graphite layer 31 according to the fifth embodiment. However, the first reinforcing member 38 has a frame shape with an opening (hole) 38a. The graphite layer 37 is smaller than the reinforcing body 36, and the periphery of the graphite layer 37 is within the reinforcing body 36. The opening 38a of the first reinforcing member 38 has four rounded corners Rs (see FIG. 19A). For example, the rounded corners Rs have a radius of approximately 1 mm.

The thickness of the first reinforcing member 38 and a method for manufacturing the first reinforcing member 38 are the same as in the description for the reinforcing member 32.

As in the structure illustrated in FIG. 15C, the graphite layer 37 may be disposed in an opening in the top carbon fiber layer of the reinforcing body 36.

The opening (hole) 38a of the first reinforcing member 38 is provided with the optical film 35 to cover the display area V. In order to improve workability, the optical film 35 may be larger than the opening 38a, and the first reinforcing member 38 may be laid on the periphery of the optical film 35 (see FIG. 18).

The optical film 35 is provided for the purpose of reinforcement, protection of the display surface, and improvement in visibility.

In the present embodiment, as a suitable example, the optical film 35 is a polyethylene terephthalate) (PET) film having excellent transparency. The optical film 35 has an antireflection (AR) layer on the surface to improve visibility. The antireflection layer has a multilayer structure composed of inorganic oxides having different refractive indexes.

The material of the optical film 35 is not limited to PET and may be any transparent material, for example, poly(ethylene naphthalate) (PEN), cellulose triacetate (TAC), or a cyclic olefin polymer (COP).

The surface treatment of the optical film 35 is not limited to the antireflection treatment and may be another treatment. Examples of the surface treatment include a hard-coat treatment involving the formation of a hard-coat layer, such as a PMMA layer, to improve abrasion resistance, an antireflection treatment involving the formation of a low-reflection (LR) layer formed of a low-refractive-index fluorocarbon resin, an antiglare treatment involving the formation of a rough surface, an antistatic treatment involving the formation of an antistatic layer to keep out the dust, and an oil repellent treatment involving the formation of an oil repellent layer to prevent the deposition of sebum.

As a suitable example, the optical film 35 has a thickness in the range of approximately 20 to 50 μm. General transparent resins, including PET, have a large coefficient of linear expansion (20 to 80 ppm/° C.) and are elongated by heating during lamination and shrink while being cooled to room temperature, possibly causing a warp in a panel after lamination. Even a slight reduction in the thickness of the optical film 35 improves the shape retention ability of the first reinforcing member 38 and a second reinforcing member 32 each mainly composed of CFRP. The optical film 35 is therefore less likely to shrink while being cooled to room temperature. Thus, a warp in the display panel 18 can be prevented.

In an optical film 35 having a thickness of 20 μm or less, however, surface coating, such as hard coating or antireflection coating, is difficult to perform. Thus, the optical film 35 preferably has a thickness in the range of 20 to 50 μm. The thickness of the optical film 35 depends on the thickness of the first reinforcing member 38 and should be smaller than the thickness of the first reinforcing member 38. If each of the first reinforcing member 38 and the second reinforcing member 32 has a thickness of 200 μm, the optical film 35 may have a thickness in the range of 20 to 100 μm.

A method for manufacturing the display 170 is basically the same as the description for the flow chart shown in FIG. 13 except that a precursor prepared in step S11 is different from the fourth embodiment.

More specifically, the second resin film 25b, the display panel 18, the first resin film 25a, the optical film 35, and the first reinforcing member 38 are stacked on the second reinforcing member 32 in this order.

In step S13, this precursor is pressed. In other words, all of the components of the display 170 are pressed in a single step.

Although each of the first reinforcing member 38 and the second reinforcing member 32 includes four carbon fiber layers having a total thickness of approximately 100 µm in the above description, the first reinforcing member 38 and the second reinforcing member 32 may have another thickness.

In the display 170, the first reinforcing member 38 and the second reinforcing member 32 are disposed on the front and back sides of the laminate structure 25. A slight reduction in the thickness of the first reinforcing member 38 and the second reinforcing member 32 therefore does not significantly affect the actual strength. For example, each of the first reinforcing member 38 and the second reinforcing member 32 may be composed of three carbon fiber layers having a total thickness of approximately 75 µm. In this case, the optical film 35 preferably has a thickness in the range of 20 to 50 µm to prevent warping of the panel after lamination.

If the first reinforcing member 38 and the second reinforcing member 32 have a multilayer structure composed of two or more carbon fiber layers having different extending directions of carbon fiber, the first reinforcing member 38 and the second reinforcing member 32 may have a thickness below 50 µm. The first reinforcing member 38 and the second reinforcing member 32 may have different thicknesses.

In addition to the advantages of the fifth embodiment, the present embodiment also has the following advantages.

The display 170 includes the second reinforcing member 32 on the back side and the frame-shaped first reinforcing member 38 on the front side of the laminate structure 25.

Even if a bending stress is applied to a glass substrate in any direction, therefore, the glass substrate can be prevented from being bent to the breaking point (limiting radius). In particular, the first reinforcing member 38 and the second reinforcing member 32 cover the most crack-prone periphery of the display panel 18 from the front and back sides of the laminate structure 25, thereby preventing cracking of the display panel 18.

The rounded corners Rs of the opening 38a of the first reinforcing member 38 can reduce cracking under bending stress, as compared with square corners.

Thus, the display 170 having great flexibility and high actual strength (tenacity) can be provided.

The first reinforcing member 38 and the second reinforcing member 32 on the front and back sides of the laminate structure 25 can efficiently radiate heat generated by the display panel 18. Also on the front side, the graphite layer 37 disposed between the laminate structure 25 and the reinforcing body 36 can efficiently radiate heat generated on the front side of the display panel 18.

Thus, the display 170 having great flexibility, high actual strength (tenacity), and sufficient heat radiation can be provided.

The display 170 includes the optical film 35 covering the display area V on the front side. The optical film 35 can protect the display surface and improve the tenacity of the display 170. The optical film 35 can also improve visibility.

Seventh Embodiment

Figure 17A:
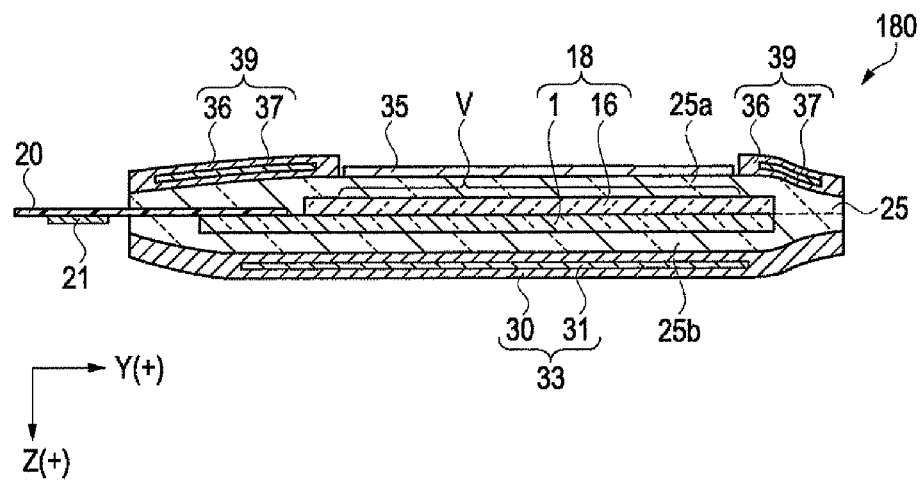
FIG. 17A is a cross-sectional view of a display according to a seventh embodiment of the invention.
Figure 17B:
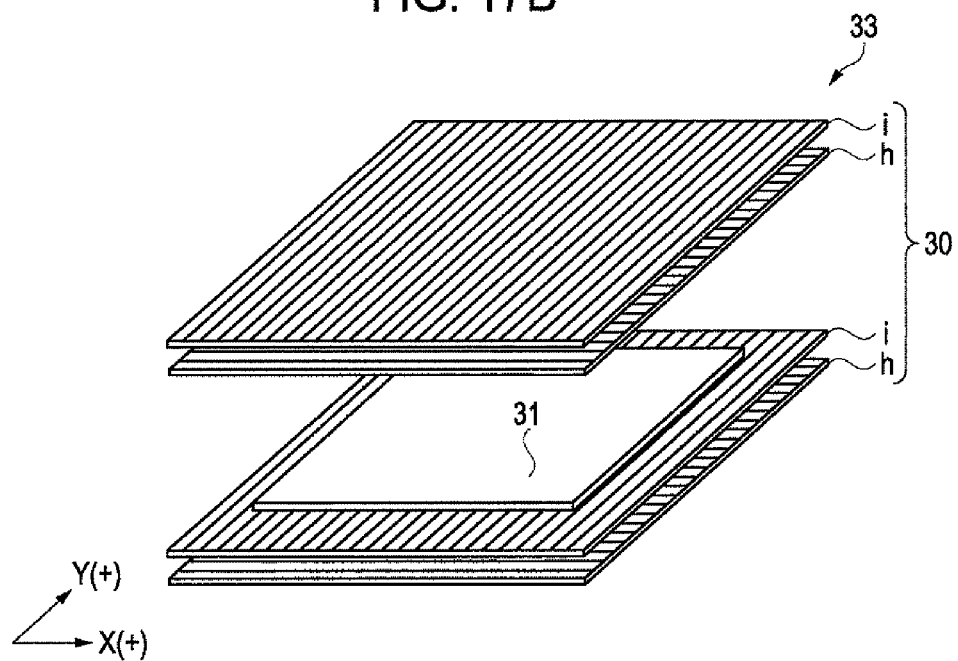
FIG. 17B is a perspective view of a reinforcing member according to the seventh embodiment.

FIG. 17A is a cross-sectional view of a display according to a seventh embodiment and corresponds to FIG. 16. FIG. 17B is a perspective view of a reinforcing member according to the seventh embodiment and corresponds to FIG. 153.

A display 180 according to the seventh embodiment will be described below. The same components as in the sixth embodiment are denoted by the same reference numerals and will not be further described.

Although the display 180 according to the present embodiment includes a reinforcing member on the front and back sides of the laminate structure 25 as in the display 170 according to the sixth embodiment, the multilayer structure of the reinforcing members is different from the sixth embodiment. Except for this, the display 180 has the same structure as the display 170 according to the sixth embodiment.

The display 180 includes a frame-shaped first reinforcing member 39 on the front side and a second reinforcing member 33 on the back side of the laminate structure 25. The display 180 further includes an optical film 35 covering the display area V on the front side.

Although the first reinforcing member 39 and the second reinforcing member 33 have the same planar shape and thickness as the first reinforcing member 38 and the second reinforcing member 32 according to the sixth embodiment, respectively, the first reinforcing member 39 and the second reinforcing member 33 have a multilayer structure different from that of the first reinforcing member 38 and the second reinforcing member 32.

As illustrated in FIG. 17B, the second reinforcing member 33 includes a four-layer CFRP reinforcing body 30 and a graphite layer 31 in an integrated form. More specifically, the graphite layer 31 is disposed between a second carbon fiber layer i and a third carbon fiber layer h of the four CFRP layers. In other words, the graphite layer 31 is packed between two sets of two carbon fiber layers having different extending directions of carbon fiber.

The four-layer CFRP reinforcing body 30 is not limited to the multilayer structure described above and may have any multilayer structure in which the graphite layer 31 is disposed between a plurality of carbon fiber layers. As in the fourth embodiment, the reinforcing body 30 may have any multilayer structure composed of two or more carbon fiber layers having different extending directions of carbon fiber.

The first reinforcing member 39 and the second reinforcing member 33 and the display 180 can be manufactured by the methods described in the preceding embodiments.

As described above, the present embodiment has the following advantages.

The first reinforcing member 39 and the second reinforcing member 33 include the graphite layers 31 and 37 having high thermal conductivity in the CFRP multilayer structure. The first reinforcing member 39 and the second reinforcing member 33 therefore have better heat radiation characteristics than a reinforcing member formed of CFRP alone. Experimental results obtained by the present inventors show that the first reinforcing member 39 and the second reinforcing member 33 have substantially the same heat radiation characteristics as the first reinforcing member 38 and the second reinforcing member 32 in the sixth embodiment.

The present embodiment can also provide the advantages of the sixth embodiment. Thus, the display 180 having great flexibility, high actual strength (tenacity), and sufficient heat radiation can be provided.

Eighth Embodiment

Figure 18A:
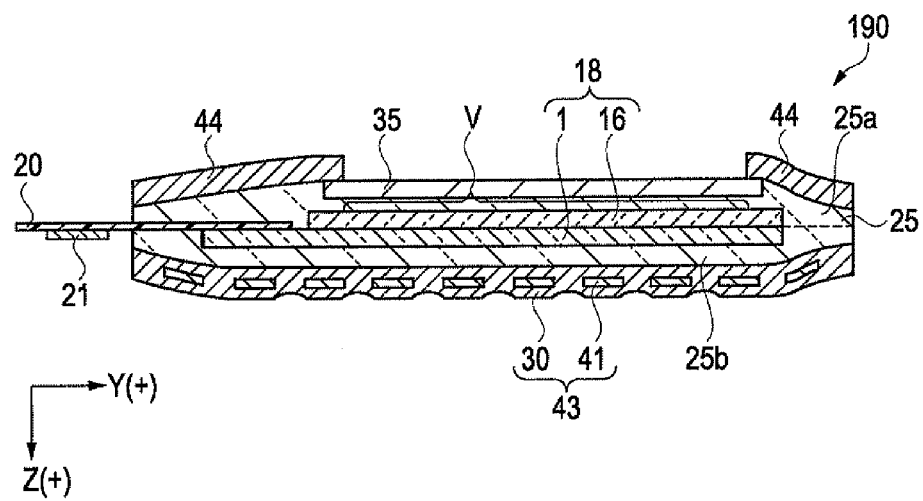
FIG. 18A is a cross-sectional view of a display according to an eighth embodiment of the invention.
Figure 18B:
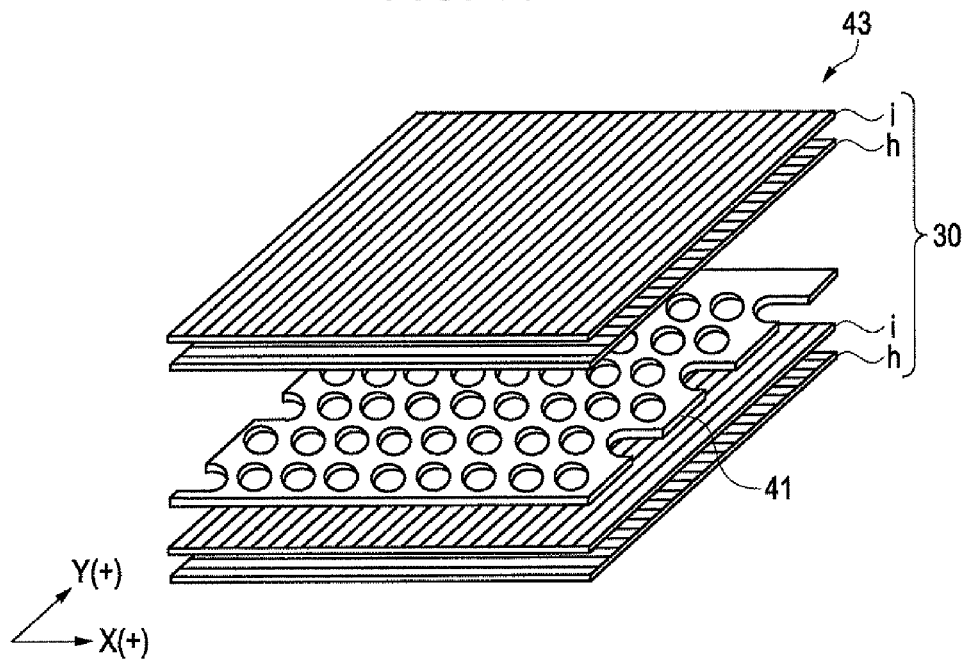
FIG. 18B is a perspective view of a reinforcing member according to the eighth embodiment.

FIG. 18A is a cross-sectional view of a display according to an eighth embodiment and corresponds to FIG. 17A. FIG. 18B is a perspective view of a reinforcing member according to the eighth embodiment and corresponds to FIG. 17B.

A display 190 according to the eighth embodiment will be described below. The same components as in the seventh embodiment are denoted by the same reference numerals and will not be further described.

Although the display 190 according to the present embodiment includes a reinforcing member on the front and back sides of the laminate structure 25 as in the display 180 according to the seventh embodiment, the multilayer structure of the reinforcing members is different from the seventh embodiment. More specifically, a first reinforcing member 44 on the front side does not include a graphite layer. A second reinforcing member 43 on the back side includes a graphite layer 41 having a plurality of holes. Except for this, the display 190 has the same structure as the display 180 according to the seventh embodiment.

The display 190 includes the frame-shaped first reinforcing member 44 on the front side and the second reinforcing member 43 on the back side of the laminate structure 25. The display 190 further includes an optical film 35 covering the display area V on the front side.

The first reinforcing member 44 has the same structure as the first reinforcing member 39 in the seventh embodiment except that the graphite layer is removed. In other words, the first reinforcing member 44 is a frame-shaped CFRP sheet manufactured by press working of the reinforcing member 30 illustrated in FIG. 12.

The second reinforcing member 43 has the same planar shape, thickness, and stacking sequence (structure) as the second reinforcing member 33 in the seventh embodiment but includes the graphite layer 41 having a different form.

More specifically, the graphite layer 41 has a size substantially the same as the second reinforcing member 43 and includes a plurality of holes. In the present embodiment, as a suitable example, the graphite layer 41 includes holes having a diameter of approximately 5 mm arranged at intervals of approximately 10 mm on the entire surface. The diameter and intervals of the holes may be appropriately determined in accordance with the size of the display 190.

For example, the graphite layer 41 can be easily formed from a large-size graphite sheet with a press die or a Thomson die.

The second reinforcing member 43 and the display 190 can be manufactured by the methods described in the fourth embodiment.

As illustrated in FIG. 18A, if the second reinforcing member 43 is manufactured by hot pressing, the second reinforcing member 43 includes concaves corresponding to the holes of the graphite layer 41 on the back side (the outermost surface) of the second reinforcing member 43. This is because a second carbon fiber layer i and a third carbon fiber layer h are bonded to each other through the holes, for example, with a heat-curing epoxy resin.

In addition to the advantages of the seventh embodiment, the present embodiment also has the following advantages.

The display 190 includes the second reinforcing member 43, which includes the graphite layer 41 having a plurality of holes between the carbon fiber layers. The carbon fiber layers on the front and back sides of the graphite layer 41 are bonded to each other through the holes, thereby increasing the strength of the graphite layer 41 and the actual strength (tenacity) of the second reinforcing member 43. The uneven back side (outermost surface) of the second reinforcing member 43 has a large radiating surface, thus improving heat radiation.

The graphite layer 41 has a size substantially the same as the second reinforcing member 43. The second reinforcing member 43 can therefore be manufactured by stacking large-size carbon fiber layers and a large-size graphite layer to form a large-size reinforcing member and cutting the second reinforcing member 43 from the large-size reinforcing member. In other words, the second reinforcing member 43 can be manufactured by press working of a large-size reinforcing member on which a plurality of reinforcing members are defined. This method can improve manufacturing efficiency and reduce manufacturing costs.

Thus, the display 190 having great flexibility, high actual strength (tenacity), and sufficient heat radiation can be provided.

Ninth Embodiment
Electronic Device

Figure 19A:
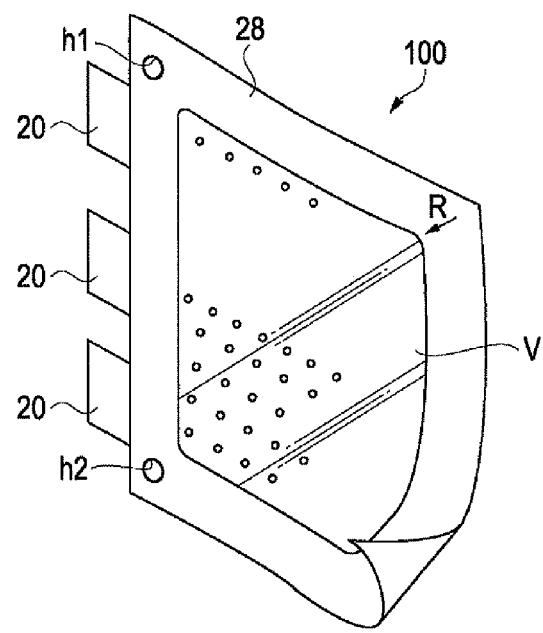
FIG. 19A is a perspective view of a display of an electronic book as an example of an electronic device.
Figure 19B:
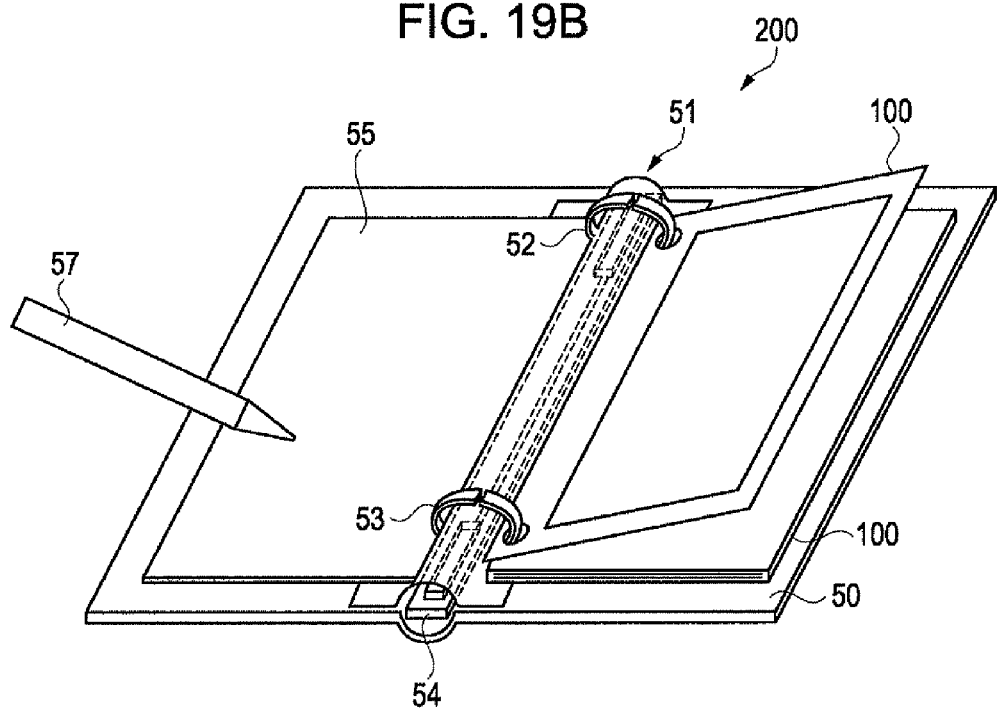
FIG. 19B is a perspective view of an electronic book.

FIGS. 19A and 19B are perspective view of an electronic book, which is an electronic device including the display described above. FIG. 19A is a perspective view of a display constituting each page. FIG. 19B is a perspective view of the electronic book.

For example, the display 100 according to the first embodiment can be incorporated into the electronic book 200, which is an example of an electronic device. The display 100 can be replaced with a display according to another embodiment or a modified embodiment described below.

In the display 100 illustrated in FIG. 19A, the display area V is vertically oriented. The display 100 includes binding holes h1 and h2 for filing in the electronic book 200 at upper and lower ends on the flexible board 20 side of the first reinforcing member 28.

As illustrated in FIG. 19B, the electronic book 200 includes a main body 50, a hinge portion 51, rings 52 and 53, a circuit 54, and an operating section 55.

The main body 50 is a file (binder) and includes front and back boards, which can be opened and closed.

The hinge portion 51 is disposed at a joint between the front and back boards and is provided with the rings 52 and 53. The hinge portion 51 can be opened and closed. The rings 52 and 53 can also be opened and closed in synchronism with the opening and closing of the hinge portion 51.

While the rings 52 and 53, as well as the hinge portion 51, are opened, the rings 52 and 53 are passed through the binding holes h1 and h2 to file the display 100 in the electronic book 200. Simultaneously, three flexible boards 20 are inserted into connectors (not shown) within the hinge portion 51. The connectors are connected to the circuit 54. The hinge portion 51 is then closed. FIG. 19B illustrates the electronic book 200 with the display 100 being filed. The electronic book 200 can include a plurality of displays 100.

The operating section 55 on the front board includes a touch panel. The operating section 55 can be touched with a pen interface 57 or a finger to display a desired image on the display 100.

The circuit 54 within the hinge portion 51 includes a rechargeable power supply, such as a lithium-ion battery, an image-processing unit for producing image data to be sent to the display 100, a memory for storing a program that defines various display modes of the electronic book 200 and data, a control unit for controlling components in accordance with the program, data, or the operation in the operating section 55, and an interface that is to be connected to an external device and receive image signals.

For example, the operating conditions can be determined in the operating section 55 such that the displays 100 can be successively turned over to display sequential images such as when thumbing through the pages of a book. In such a display mode, closed displays 100 are automatically turned off for power saving.

Since the displays 100 of the electronic book 200 are flexible, the displays 100 can be smoothly turned over to see images and read sentences like in a book. The displays 100 have sufficient actual strength (tenacity) to be handled as a book typically is.

Thus, the electronic book 200 is provided that can be handled in the same manner as a book.

The electronic device is not limited to the electronic book 200 and may be any electronic device including a display, such as a mobile phone. The mobile phone may be an integral-type mobile phone, folding-type mobile phone, or a slide-type mobile phone. The electronic device may also be used in a display for a car navigation system, a personal digital assistant (PDA), a mobile computer, a digital camera, a digital video camera, onboard equipment, or an audio instrument.

Tenth Embodiment

Outline of Illumination Apparatus

Figure 20:
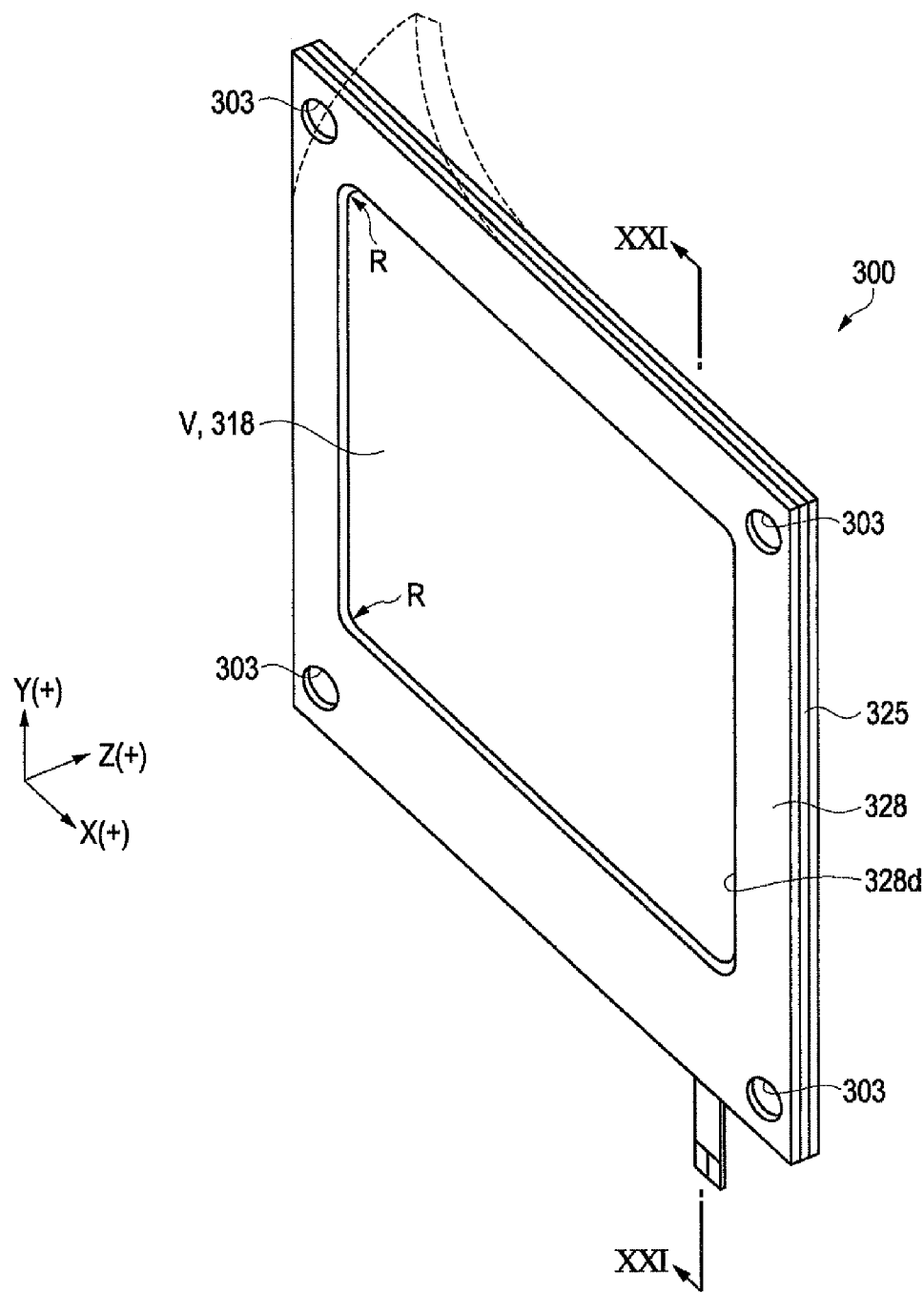
FIG. 20 is a perspective view of an illumination apparatus according to a tenth embodiment of the invention.
Figure 21:
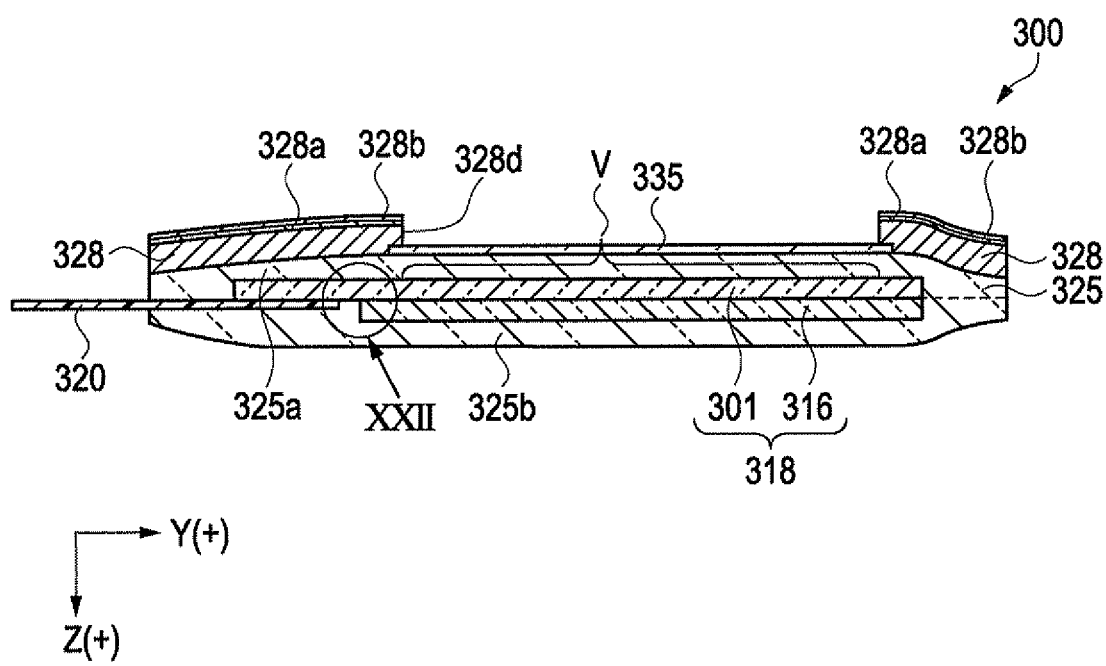
FIG. 21 is a sectional side view of the illumination apparatus taken along the line XXI-XXI in FIG. 20.

FIG. 20 is a perspective view of an illumination apparatus according to a tenth embodiment of the invention. FIG. 21 is a sectional side view of the illumination apparatus taken along the line XXI-XXI in FIG. 20.

The following is an outline of an illumination apparatus 300, which is an electro-optical device according to the tenth embodiment of the invention.

The illumination apparatus 300 is a flexible organic EL illumination apparatus (display) that includes a thin organic EL panel 318 between a first resin film 325$a$ and a second resin film 325$b$. This laminate structure or the panel 318 in a stacked form is hereinafter also referred to as a laminate structure 325.

The panel 318 is an organic EL illumination panel that includes a horizontally oriented rectangular light-emitting region V. Substantially white light (illumination light) is emitted from the entire surface of the light-emitting region V.

Each of a pair of substrates of the panel 318 has a thickness of 100 μm or less to ensure flexibility.

In the drawings including FIG. 20, the horizontal direction of a horizontally oriented rectangular light-emitting region V is defined as an X-axis direction, and the vertical direction is defined as a Y-axis direction. The thickness direction of the panel 318 is defined as a Z-axis direction. The side of the light-emitting region V in the panel 318 is a first surface or a front side, and the other side is a second surface or a back side.

A frame-shaped reinforcing member 328 two-dimensionally surrounding the light-emitting region V is disposed on the front side of the laminate structure 325. The term "frame-shaped", as used herein, means that the reinforcing member has an opening 328$d$ corresponding to the light-emitting region V of the panel 318. The reinforcing member 328 entirely covers the panel 318 to the ends (the periphery) of the panel 318.

The reinforcing member 328 reinforces the thin panel 318 and is composed of a material having high tensile strength. For example, the reinforcing member 328 is preferably composed of a material containing carbon fiber. The opening (hole) 328$d$ through which the light-emitting region V is exposed has four rounded corners Rs.

As illustrated in FIG. 21, a reflective layer 328$a$ and a transparent protective layer 328$b$ are disposed on the reinforcing member 328 in this order.

The illumination apparatus 300 having such a structure is flexible and has such a high actual strength that the panel 318 is not broken when the illumination apparatus 300 is bent, as indicated by the dotted line in FIG. 20. Part of illumination light emitted from the light-emitting region V is reflected by the reflective layer 328$a$ of the reinforcing member 328, thus improving luminance.

The reinforcing member 328 has a mounting hole 303 on the four corners. The four mounting holes 303 are through-holes disposed outside the panel 318 and passing through a three-layer structure composed of the first resin film 325$a$, the second resin film 325$b$, and the reinforcing member 328. For example, the illumination apparatus 300 can be screwed on the ceiling through the four mounting holes 303.

The number of mounting holes 303 is not limited to four and may be appropriately determined in accordance with the size of the illumination apparatus 300. For example, an additional mounting hole 303 may be provided substantially in the center of each long side of the illumination apparatus 300. A large number of mounting holes 303 may be formed on a side of the illumination apparatus 300 to facilitate the deformation of the reinforcing member 328, thereby reducing the impact on the reinforcing member 328 and avoiding stress concentration on the ends of the glass substrate.

As illustrated in FIG. 21, the panel 318 includes an element substrate 301 and a sealing substrate 316. One side of the element substrate 301 protrudes from the sealing substrate 316, forming a protruding area. The protruding area is connected to one end of a flexible board 320. A flexible board is an abbreviation of a flexible printed circuit board.

The other end of the flexible board 320 has a plurality of terminals for the input of external driving power.

Detailed Structure of Panel

Figure 22:
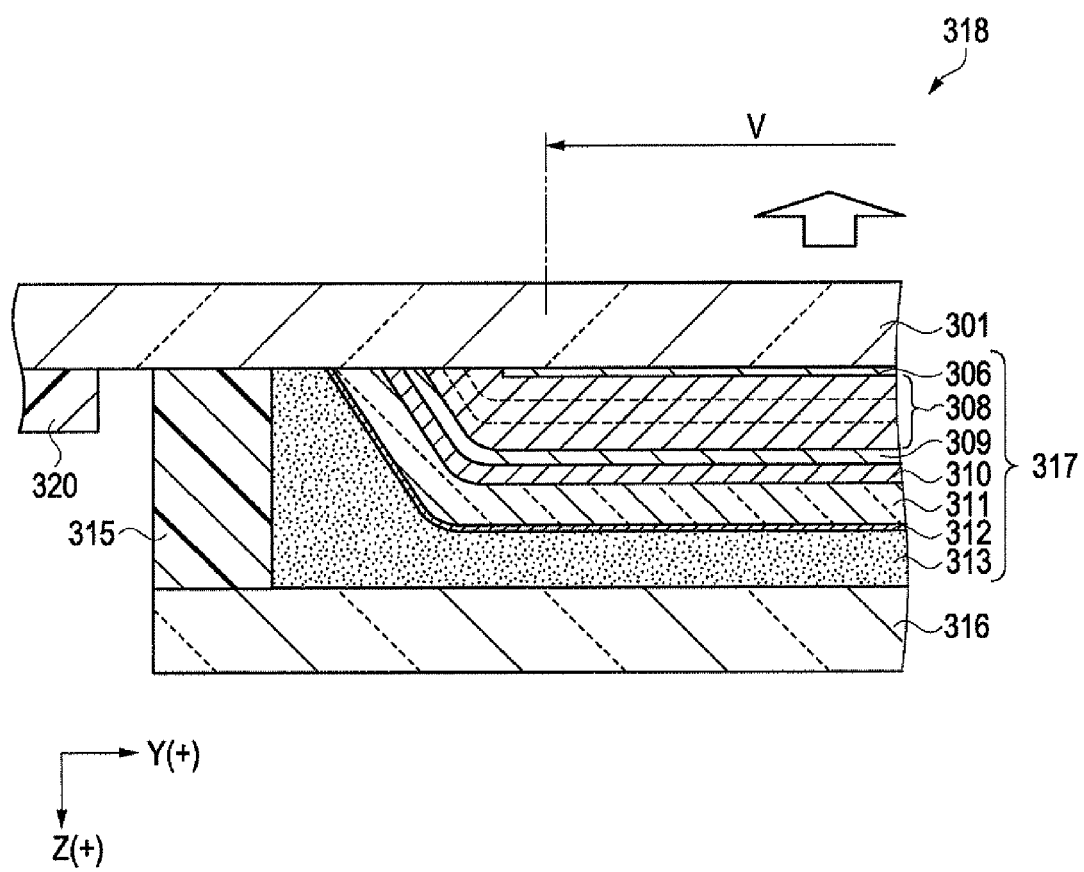
FIG. 22 is an enlarged view of a portion XXII in FIG. 21.

FIG. 22 is an enlarged view of a portion XXII of the panel 318 illustrated in FIG. 21.

The detailed structure of the panel 318 will be described below.

The panel 318 is a bottom-emission-type organic EL illumination panel that emits substantially white illumination light from the light-emitting region V on the element substrate 301 side. The panel 318 employs a passive mode, in which driving power is applied between a pair of anode and cathode disposed on the element substrate 301 and the sealing substrate 316, respectively, to turn on the light.

The panel 318 includes the element substrate 301, an anode 306, an organic EL layer 308 as an electro-optical layer, a cathode 309, an electrode protective layer 310, a buffer layer 311, a gas barrier layer 312, filler 313, and the sealing substrate 316. A portion between the element substrate 301 and the sealing substrate 316 is referred to as a functional layer 317. In other words, a multilayer structure from the anode 306 to the filler 313 is referred to as the functional layer 317.

The element substrate 301 is formed of transparent inorganic glass. In the present embodiment, non-alkali glass is used as a suitable example.

The anode 306 is a transparent electrode formed on the element substrate 301 and is composed of indium tin oxide (ITO) or ZnO. The anode 306 has a planar size equal to or larger than the planar size of the light-emitting region V and is connected to anode wiring (not shown) on the element substrate 301.

The anode 306 is covered with the organic EL layer 308. Although the organic EL layer 308 in FIG. 22 is a single layer as indicated by the solid line, the organic EL layer 308 actually includes a hole-transport layer, a light-emitting layer, and an electron-injection layer disposed in this order on the anode 306 as indicated by the broken line. The hole-transport layer and the light-emitting layer are formed of a thin film of an organic substance.

The hole-transport layer is formed of a subliming material, such as an aromatic diamine (TPAB2Me-TPD, α-NPD, or the like).

As a suitable example, the light-emitting layer has a multilayer structure including a red-light-emitting layer, a greenlight-emitting layer, and a blue-light-emitting layer. The structure of the light-emitting layer is not limited to this structure and may be any multilayer structure that includes a plurality of light-emitting layers capable of composing substantially white light.

For example, the light-emitting layer may have a two-layer structure composed of an orange-light-emitting layer and a blue-light-emitting layer or a structure including an intermediate layer between light-emitting layers. The light-emitting layer may also have a structure including an intermediate charge-generating layer between light-emitting layers, that is, a tandem organic EL layer structure.

The electron-injection layer contains lithium fluoride (LiF).

As a suitable example, the layers constituting the organic EL layer 308 are formed by vapor deposition, such as vacuum deposition, using a subliming material.

The organic EL layer 308 is covered with the cathode 309, which is formed of metal, such as MgAg. One end of the cathode 309 is in contact with the element substrate 301 and is connected to cathode wiring.

The electrode protective layer 310 is formed of a transparent high-density material impervious to water, such as $SiO_2$, $Si_3N_4$, or $SiO_xN_y$.

The buffer layer 311 is a transparent organic buffer layer, for example, formed of a thermosetting epoxy resin.

The gas barrier layer 312 is a transparent high-density sealing layer impervious to water, for example, formed of $SiO_2$, $Si_3N_4$, or $SiO_xN_y$, and has the function of preventing moisture from intruding into the organic EL layer 308.

The filler 313 is a transparent adhesive layer, for example, formed of a thermosetting epoxy resin and is applied between the gas barrier layer 312 and the sealing substrate 316 to bond them together. The filler 313 also functions to prevent moisture from intruding into the organic EL layer 308 from the outside.

The sealing substrate 316 is formed of inorganic glass as in the element substrate 301.

The sealing substrate 316 and the element substrate 301 are bonded together and sealed with a sealant 315 applied to the periphery of the sealing substrate 316. The sealant 315 may be an epoxy adhesive or a UV curable resin.

A protruding area of the element substrate 301 protruding from the sealing substrate 316 is connected to the flexible board 320. For example, the flexible board 320 includes a wiring pattern formed of copper foil on a polyimide film substrate. The flexible board 320 is electrically connected to anode wiring and cathode wiring formed on the element substrate 301 via an anisotropic electroconductive adhesive film. The flexible board 320 may be replaced with any wiring member that can transmit an external driving current, for example, a lead wire.

Since the connection via the anisotropic electroconductive adhesive film has insufficient mechanical strength, the connected portion of the flexible board 320 is conventionally reinforced with a silicon resin (adhesive). However, the silicon resin tends to be easily detached.

In the present embodiment, in place of this reinforcing structure, a resin film 325b functions as an adhesive (filler) to ensure sufficient actual strength and great flexibility. A method for bonding the first resin film 325a and the second resin film 325b will be described later.

In the panel 318 having such a structure, upon the application of a driving power to the flexible board 320, a driving current flowing between the anode 306 and the cathode 309 allows the organic EL layer 308 to emit substantially white illumination light through the light-emitting region V.

More specifically, light emitted from the organic EL layer 308 toward the anode 306 passes through the element substrate 301 and functions as illumination light. Light traveling toward the cathode 309 is reflected by the reflective cathode 309, passes through the organic EL layer 308, the anode 306, and the element substrate 301, and functions as illumination light.

The panel 318 is not limited to a bottom emission type and may be a top emission type. In a top emission type panel 318, illumination light is emitted from the sealing substrate 316. Thus, the top and bottom of the panel 318 must be inverted. A reflective layer is disposed below (on the element substrate 301 side of) the anode 306, and the thickness of a metal layer constituting the anode 306 is reduced such that the anode 306 becomes optically transparent.

The panel 318 may include a single glass substrate in place of the two glass substrates. In the case that the sealing substrate 316 is removed, in order to ensure the same gas barrier as the panel 318 including the two glass substrates, the thickness of the metal layer constituting the anode 306 or the gas barrier layer 312 may be increased, or two gas barrier layers 312 may be formed.

The organic EL may be replaced with inorganic EL.

Laminate Structure and Material of Reinforcing Member

Referring back to FIG. 21, the first resin film 325a and the second resin film 325b of the laminate structure 325 and the material of the reinforcing member 328 will be described below.

The first resin film 325a and the second resin film 325b entirely cover the front and back sides of the panel 318 including the light-emitting region V and the periphery of the panel 318. Thus, the first resin film 325a and the second resin film 325b require good adhesion with the glass substrate and the reinforcing member 328, great flexibility, high transparency (beam extraction efficiency), complete covering (high insulating properties and heat resistance) of the flexible board 320, and high water resistance to prevent moisture from intruding into the interior.

In order to satisfy these functions, the material of the first resin film 325a and the second resin film 325b is preferably a polyethylene resin having high water resistance (low water absorption), high insulating properties, great flexibility, high transparency, and low-temperature bondability. More preferably, the material of the first resin film 325a and the second resin film 325b is a copolymer having a polar group to improve adhesion.

More specifically, preferred examples of the polyethylene copolymer include an ethylene-vinyl acetate copolymer (EVA), an ethylene-methyl methacrylate copolymer (EMMA), an ethylene-hydroxyalkyl methacrylate copolymer, an ethylene-alkoxyethyl methacrylate copolymer, an ethylene-aminoethyl methacrylate copolymer, an ethylene-hydroxyglycidyl methacrylate copolymer, an ethylene-vinyl alcohol copolymer (EVOH), an ethylene-acrylic acid copolymer (EAA), an ethylene-methacrylic acid copolymer (EMAA), an ethylene-alkyl acrylate copolymer, an ethylene-vinylacetal copolymer, and an ethylene-vinylbutyral copolymer (PUB). Combinations of these two or more polyethylene copolymers (for example, an ethylene-vinyl acetate-vinyl alcohol copolymer exhibits good adhesion with both glass and CFRP) or mixtures of these two or more polyethylene copolymers may also be used.

The material of the first resin film 325a and the second resin film 325b may further contain a curing component, such as an epoxy compound, an isocyanate compound, or an amine compound, for example, polyethyleneimine, as a cross-linker to increase the heat resistance of the first resin film 325a and the second resin film 325b. Although an ethylene copolymer having a non-esterified carboxy group, such as an ethylene-acrylic acid copolymer (EAA) or an ethylene-methacrylic acid copolymer (EMAA), has low-temperature bondability and good adhesion, it may corrode copper wiring of the flexible board 320. An ethylene copolymer having a non-esterified carboxy group is therefore preferably combined with a cross-linking component, such as an epoxy curing agent, and is thermally cross-linked to eliminate residual acrylic acid.

The reinforcing member 328 should reinforce the fragile ends of the glass substrate, prevent a warp in a panel having a multilayer structure composed of materials having different coefficients of linear expansion, have tenacity (tensile resistance) to prevent the glass substrate from being bent to the breaking point (limiting radius), and radiate heat generated by the panel 318.

Preferably, the material of the reinforcing member 328 has a high Young's modulus (10 GPa or more), a low coefficient of linear expansion (10 ppm/° C. or less), and a high thermal conductivity (10%/m·k or more) to satisfy these functions.

In the present embodiment, as a suitable example, the material of the reinforcing member 328 is carbon-fiber-reinforced plastic (CFRP) having high tensile strength and sufficient heat radiation. Since CFRP has a low density (1.5 to 2.0 g/cm$^3$) and a high tensile strength (1000 MPa or more), even a thin CFRP film can strongly reinforce the object. In addition, light weight of CFRP makes CFRP a suitable material for the reinforcing member 328.

Figure 23:
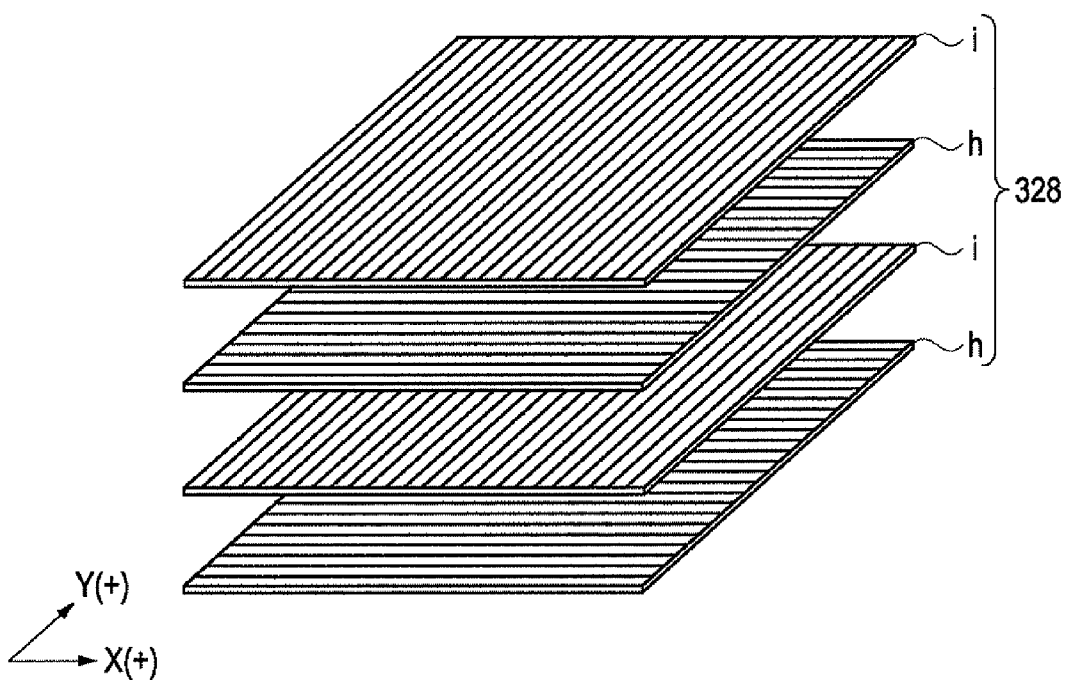
FIG. 23 is a schematic view illustrating the multilayer structure of CFRP.

FIG. 23 is a schematic view illustrating the multilayer structure of CFRP.

CFRP is a composite material of carbon fiber and resin and is manufactured by impregnating carbon fibers arranged parallel to each other with a thermosetting resin, such as an epoxy resin or a phenolic resin, or a thermoplastic resin, such as a polyester, to manufacture a precursor (carbon fiber layer) called prepreg, stacking two or more prepreg sheets alternately in different directions, and hardening the prepreg sheets.

More specifically, as illustrated in FIG. 23, two carbon fiber layers h (first carbon fiber layers), which are precursors containing a plurality of carbon fibers extending in the X-axis direction, and two carbon fiber layers i (second carbon fiber layers), which are precursors containing a plurality of carbon fibers extending in the Y-axis direction are alternately stacked and heated under pressure (for example, 120° C. to 180° C.) to manufacture a CFRP sheet. This CFRP sheet is used as the reinforcing member 328. In FIG. 23, the stripes indicate the extending direction of carbon fibers. Although the layers are separated for the sake of clarity, the layers are actually bonded to each other, forming a layered product.

Preferably, carbon fiber is polyacrylonitrile (PAN) carbon fiber or pitch (petroleum resin) carbon fiber.

In the present embodiment, although the reinforcing member 328 is a four-layer CFRP sheet as a suitable example, the reinforcing member 328 may have any multilayer structure composed of two or more carbon fiber layers having different extending directions of carbon fiber. In other words, the reinforcing member 328 may have any multilayer structure composed of two or more carbon fiber layers stacked such that the extending directions of carbon fiber cross each other.

Taking the X-axis direction as approximately 0 degrees, the extending directions of carbon fiber are basically approximately 0 degrees, approximately 90 degrees, approximately 90 degrees, and approximately 0 degrees from the bottom (the front and back sides of the reinforcing member 328 have the same extending direction of carbon fiber). The extending directions of carbon fiber may also be approximately 0 degrees, approximately 90 degrees, approximately 0 degrees, and approximately 90 degrees, or approximately 0 degrees, approximately 0 degrees, approximately 90 degrees, and approximately 90 degrees.

The front and back sides of the reinforcing member 328 basically have the same extending direction of carbon fiber, for example, 0 degrees, 90 degrees, and 0 degrees for three layers, or 0 degrees, 90 degrees, 0 degrees, 0 degrees, 90 degrees, and 0 degrees for six layers.

With any of these structures, the reinforcing member 328 can have intended functions. More specifically, the reinforcing member 328 can have a tensile strength of 1000 MPa or more in substantially all directions parallel to the surface of the reinforcing member 328.

Carbon fiber composed of high-purity carbon has a thermal conductivity in the range of 20 to 60 W/m·k, which is higher than glass (1 W/m·k) or general-purpose plastics (approximately 0.5 W/m·k), thus achieving sufficient heat radiation. The outermost surface of a CFRP sheet may be roughened to increase its surface area, thereby improving heat radiation in the atmosphere.

Referring back to FIG. 21, the reflective layer 328a and the protective layer 328b are disposed on the reinforcing member 328 in this order.

The reflective layer 328a is a metallic reflective layer. As a suitable example, a thin aluminum layer is formed on the reinforcing member 328 by vapor deposition, such as vacuum deposition. The reflective layer 328a may also be formed by any method other than vapor deposition. For example, metallic foil may be pressed by press working to form a thin metal layer on the reinforcing member 328.

The protective layer 328b is a transparent resin coating layer for preventing the reflective layer 328a from being scratched. As a suitable example, an acrylic resin is applied by spin coating and is cured to form a clear hard-coat layer.

The opening (hole) 328d of the reinforcing member 328 is provided with an optical film 335 to cover the light-emitting region V.

The optical film 335 is provided for the purpose of reinforcement and protection of the display surface.

In the present embodiment, as a suitable example, the optical film 335 is a poly(ethylene terephthalate) (PET) film having excellent transparency. The optical film 335 has an antireflection (AR) layer on the surface. The antireflection layer has a multilayer structure composed of inorganic oxides having different refractive indexes.

The material of the optical film 335 is not limited to PET and may be any transparent material, for example, poly(ethylene naphthalate) (PEN), cellulose triacetate (TAC), or a cyclic olefin polymer (COP).

The surface treatment of the optical film 335 is not limited to the antireflection treatment and may be another treatment. Examples of the surface treatment include a hard-coat treatment involving the formation of a hard-coat layer, such as a PMMA layer, to improve abrasion resistance, an antireflection treatment involving the formation of a low-reflection (LR) layer formed of a low-refractive-index fluorocarbon resin, an antiglare treatment involving the formation of a rough surface, an antistatic treatment involving the formation of an antistatic layer to keep out the dust, and an oil repellent treatment involving the formation of an oil repellent layer to prevent the deposition of sebum.

In FIG. 21, as a suitable example, the reflective layer 328a is formed on the front side (a fourth surface) of the reinforcing member 328. The reflective layer 328a may be formed on the back side (a third surface) of the reinforcing member 328. In other words, the reflective layer 328a may be formed on either the front side or the back side of the reinforcing member 328. Also in the case that the reflective layer 328a is formed on the back side of the reinforcing member 328, part of illumination light emitted from the light-emitting region V may be reflected by the reflective layer 328a, thus improving luminance.

Thickness of Each Component

Referring back to FIG. 22, the following is the description of the optimum thickness of each component required to impart both great flexibility and high actual strength (tenacity) to the illumination apparatus 300.

First, the thickness of the panel 318 will be described below.

In FIG. 22, although the functional layer 317 is particularly magnified to clarify the relationship between the components of the functional layer 317, the functional layer 317 actually has the smallest thickness. The functional layer 317 has a thickness in the range of several micrometers to approximately 20 μm. The thickness of the buffer layer 311 accounts for more than half of the total thickness. The organic EL layer 308 composed of a plurality of thin films each having a thickness in the order of nanometers has a thickness as small as less than 1 μm. As described above with reference to FIG. 22, in order to achieve both great flexibility and high adhesive strength, a space between the substrates of the panel 318 is entirely filled with solid substances without a hollow structure.

In the present embodiment, as a suitable example, each of the element substrate 301 and the sealing substrate 316 has a thickness of approximately 40 μm. As a suitable example, the panel 318 has a total thickness of approximately 90 μm. Experimental results obtained by the present inventors show that, in order to ensure the reliability of an organic EL panel, in addition to a sealing structure, such as the gas barrier layer 312, each of the element substrate 301 and the sealing substrate 316 should have a thickness of approximately 10 μm or more. In other words, only in the case that each of the element substrate 301 and the sealing substrate 316 has a thickness of approximately 10 μm or more, it is possible to ensure sufficient impact strength without impairing flexibility and excellent moisture barrier properties.

It is also known that the element substrate 301 and the sealing substrate 316 each having a thickness of approximately 100 μm or more may result in poor flexibility.

Thus, each of the element substrate 301 and the sealing substrate 316 preferably has a thickness in the range of 10 to 100 μm. In consideration of balance between strength and flexibility, each of the element substrate 301 and the sealing substrate 316 more preferably has a thickness in the range of 20 to 80 μm.

In consideration of the balance between strength and flexibility, the total thickness of the panel 318 from the element substrate 301 to the sealing substrate 316 preferably ranges from 50 to 120 μm.

The thickness of each of the element substrate 301 and the sealing substrate 316 initially ranges from approximately 0.3 to 0.7 mm and is then reduced by polishing or etching. Preferably, after a panel including thick front and back glass substrates is manufactured, the panel 318 having an intended thickness is manufactured by etching with an etchant (aqueous solution) containing hydrofluoric acid. The panel 318 having an intended thickness may also be manufactured by another method, such as a mechanical polishing method.

Referring back to FIG. 21, as a suitable example, the optical film 335 has a thickness in the range of approximately 20 to 50 μm. General transparent resins, including PET, have a large coefficient of linear expansion (20 to 80 ppm/° C.) and are elongated by heating during lamination and shrink while being cooled to room temperature, possibly causing a warp in a panel after lamination. Even a slight reduction in the thickness of the optical film 335 improves the shape retention ability of CFRP of the reinforcing member 328. The optical film 335 is therefore less likely to shrink while being cooled to room temperature. Thus, a warp in the panel 318 can be prevented. In an optical film 335 having a thickness of 20 μm or less, however, surface coating, such as hard coating or antireflection coating, is difficult to perform. Thus, the optical film 335 preferably has a thickness in the range of 20 to 50 μm. The thickness of the optical film 335 depends on the thickness of the reinforcing member 328 and should be smaller than the thickness of the reinforcing member 328. If the reinforcing member 328 has a thickness of approximately 200 μm, the optical film 335 preferably has a thickness in the range of 20 to 100 μm.

The optical film 335 is larger than the light-emitting region V, and the reinforcing member 328 is laid on the periphery of the optical film 335. This structure improves workability in the installation of the optical film 335.

The thicknesses of the first resin film 325a and the second resin film 325b of the laminate structure 325 will be described below.

In the present embodiment, as a suitable example, each of the first resin film 325a and the second resin film 325b is an EVA film having a thickness of approximately 50 μm. Experimental results obtained by the present inventors also show that each of the first resin film 325a and the second resin film 325b should have a thickness of approximately 20 μm or more to eliminate differences in levels including a gap around the panel 318.

In consideration of the balance between the elimination of differences in levels and the total thickness of the illumination apparatus 300, each of the first resin film 325a and the second resin film 325b preferably has a thickness in the range of 20 to 100 μm. Also taking into account the cost of the resin film and ease of lamination (workability), each of the first resin film 325a and the second resin film 325b preferably has a thickness in the range of 40 to 80 μm.

The thickness of the reinforcing member 328 will be described below.

In the present embodiment, as a suitable example, the reinforcing member 328 is a four-layer CFRP sheet having a thickness of approximately 100 μm.

A CFRP sheet can be manufactured if the CFRP sheet has a thickness of approximately 25 μm or more. With being attached to the laminate structure 325 (including the panel 318) having the thickness described above, the reinforcing member 328 should have a thickness in the range of 50 to 200 μm to ensure flexibility and actual strength (tenacity).

The total thickness of the illumination apparatus 300 including these components is approximately 290 μm at the thickest portion. The thickest portion is the periphery of the panel 318 at which the panel 318 and the reinforcing member 328 overlap each other.

The dimensions in the suitable examples described above are one of suitable examples derived by the present inventors from experimental results and physical property data by virtue of originality and ingenuity. Thus, the dimensions of each of the components are not particularly limited and are determined within the recommended ranges for each application.

Method for Manufacturing Illumination Apparatus

Figure 24:
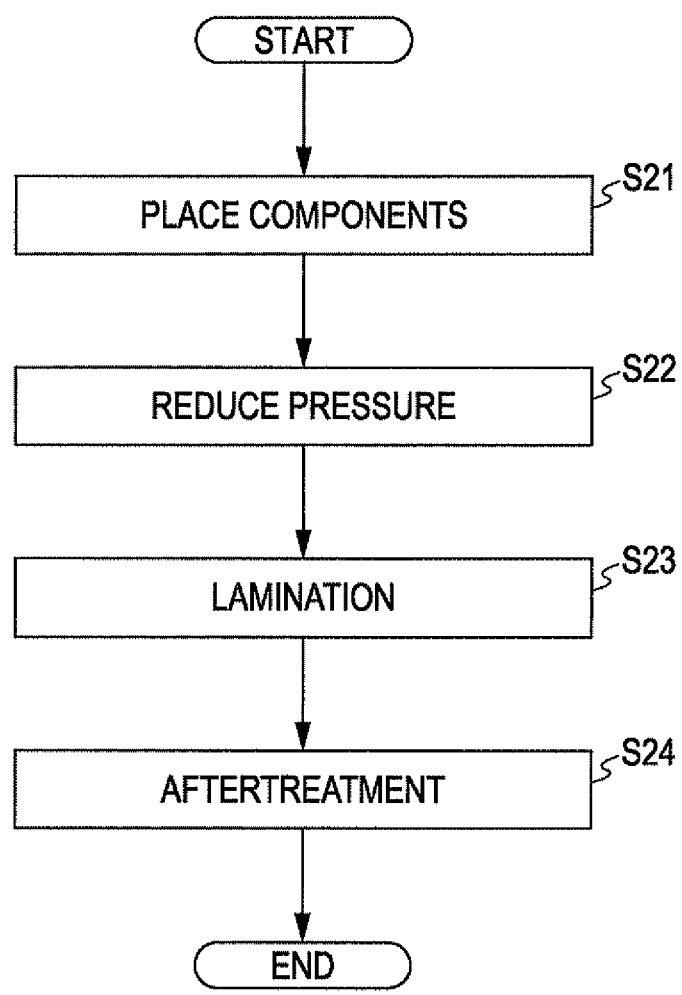
FIG. 24 is a flow chart illustrating a method for manufacturing an illumination apparatus according to the tenth embodiment.
Figure 25A:
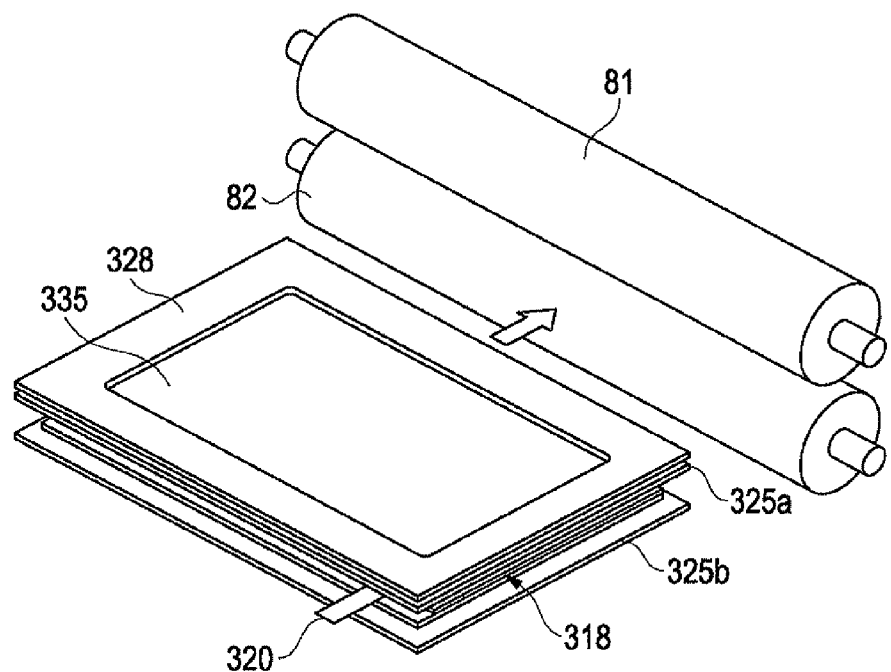
FIG. 25A is a schematic view illustrating a process of manufacturing an illumination apparatus according to the tenth embodiment.
Figure 25B:
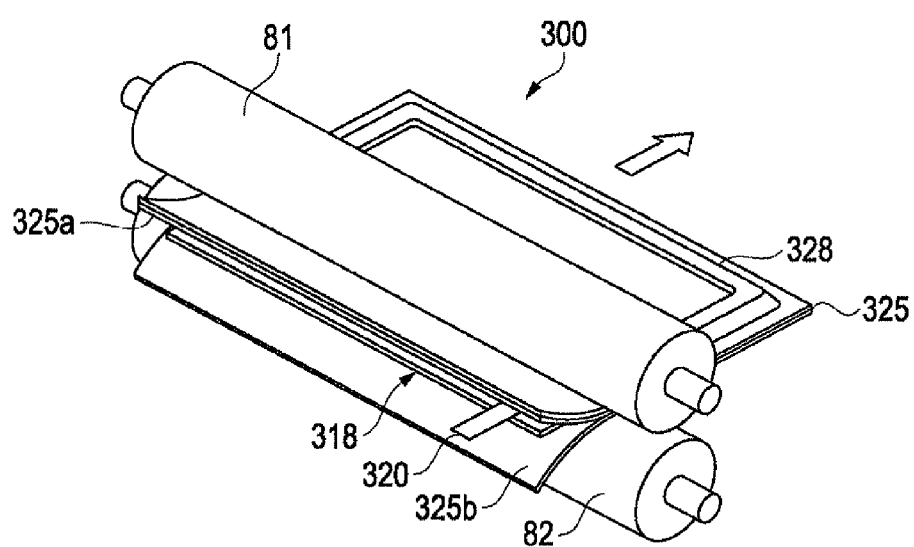
FIG. 25B is a schematic view illustrating a process of manufacturing an illumination apparatus according to the tenth embodiment.

FIG. 24 is a flow chart illustrating a method for manufacturing an illumination apparatus according to the tenth embodiment. FIGS. 25A and 25B are schematic views illustrating a process of manufacturing a display.

A method for manufacturing the illumination apparatus 300 will be described in detail below with reference to the flow chart shown in FIG. 24.

As illustrated in FIG. 25A, in step S21, the components are stacked (a precursor) and are placed in a laminator. More specifically, the panel 318, the first resin film 325a, the optical film 335, and the reinforcing member 328 are stacked on the second resin film 325b in this order. Although not shown in FIG. 25A, the components are stacked using a special-purpose guide plate and are correctly positioned. This process is performed in a normal environment as a suitable example and may also be performed under a reduced pressure as described below.

The precursor is placed in the laminator. FIG. 25A only shows the pressure rollers 81 and 82 of the laminator.

In step S22, the pressure of the environment in which the laminator and the precursor are placed is reduced. The laminator has been installed in a chamber, the internal pressure of which can be adjusted to a desired pressure. Through this process, air (air bubbles) within the precursor can be removed (degassing).

Simultaneously, the pressure rollers 81 and 82 are heated, and the roller surfaces formed of a heat-conductive elastomer are heated to a temperature in the range of 80° C. to 120° C.

In step S23, as indicated by the arrow in FIG. 25A, the side of the precursor opposite to the flexible board 320 is inserted between the pair of pressure rollers 81 and 82 to perform lamination. The first resin film 325a and the second resin film 325b are melted by the heat of the rollers between the pressure rollers 81 and 82 and are bonded together under pressure. The first resin film 325a and the second resin film 325b thus melted function as an adhesive (filler) and bond the panel 318, the flexible board 320, the optical film 335, and the reinforcing member 328 together.

As the precursor is pressed from one side to the other side, even if the components contain residual air bubbles, the air bubbles are squeezed out from the other end. As illustrated in FIG. 25B, the illumination apparatus 300 is extruded from the pressure rollers 81 and 82 at the end of the lamination.

Step S24 involves posttreatment including annealing to relieve the residual stress of the illumination apparatus 300. The illumination apparatus 300 may be annealed successively under a reduced pressure or in a normal environment. In the case that the first resin film 325a and the second resin film 325b contain a cross-linking component, the illumination apparatus 300 is preferably annealed at approximately 100° C. to complete crosslinking.

The laminator is not limited to the roll laminator with a pair of pressure rollers 81 and 82 and may be any apparatus that can convert the precursor into the illumination apparatus 300 in finished form. For example, a diaphragm vacuum laminator may be used. In the diaphragm vacuum laminator, a precursor is placed on a heating plate (hot plate), a flexible rubber sheet is pushed against the precursor by a pressure difference, and the precursor is heated under pressure.

After annealing, the mounting holes 303 are formed at the four corners of the reinforcing member 328 (see FIG. 20). More specifically, the illumination apparatus 300 is placed in a special-purpose guide plate and is subjected to press working to bore the four mounting holes 303. Alternatively, the mounting holes 303 may be formed in advance in the reinforcing member 328, the first resin film 325a, and the second resin film 325b. This method using the mounting holes 303 as the reference in the preparation of a precursor can increase the positional precision of the components in the in-plane direction.

Through these steps, the illumination apparatus 300 having great flexibility and high actual strength (tenacity) as illustrated in FIG. 20 is formed.

As described above, the illumination apparatus 300 and a method for manufacturing the illumination apparatus 300 according to the present embodiment have the following advantages.

In the illumination apparatus 300, the laminate structure 325 having such a thickness that the illumination apparatus 300 can have great flexibility is provided with the frame-shaped CFRP reinforcing member 328 two-dimensionally surrounding the light-emitting region V. Carbon fiber contained in CFRP has a higher tensile strength than conventional resin reinforcing plates. With the reinforcing member 328 being attached to the laminate structure 325, therefore, the reinforcing member 328 can prevent the laminate structure 325 from being bent to the breaking point (limiting radius) without impairing flexibility even when a bending stress is applied to the laminate structure 325 in the extending direction of carbon fiber.

The reinforcing member 328 has a multilayer structure composed of two or more carbon fiber layers having different extending directions of carbon fiber. This can increase the tensile strength of the laminate structure 325 in any two-dimensional direction, thereby preventing the laminate structure 325 from being bent to the breaking point (limiting radius) even if a bending stress is applied to the laminate structure 325 in any direction.

This is ascribable to the characteristics of carbon fiber: very small elongation due to high tensile strength and very small dimensional changes due to diagonal lamination of carbon fiber. Because of these characteristics, the deformation of the reinforcing member 328 under stress stops at a certain angle. The reinforcing member 328 can therefore prevent a glass substrate from being bent to the breaking point (limiting radius). Like a spring, the reinforcing member 328 also has functions of deformation constraint and recovery to its original shape.

CFRP containing carbon fiber has a coefficient of linear expansion as low as 1 ppm/° C. or less. Heat press bonding at approximately 100° C. therefore does not cause a warp in CFRP. In addition, since the coefficient of linear expansion of CFRP containing carbon fiber is very close to that of glass (4 ppm/° C.), CFRP containing carbon fiber is highly resistant to thermal shock against the panel 318.

The four rounded corners Rs of the opening (hole) 328d of the reinforcing member 328 can reduce cracking under bending stress, as compared with square corners. For example, the rounded corners Rs have a radius of approximately 1 mm.

Thus, the illumination apparatus 300 having great flexibility and high actual strength (tenacity) can be provided. In other words, the illumination apparatus 300 having sufficient actual strength can be provided.

Unlike the known liquid crystal display 400 in which the reinforcing plates (91 and 92) are attached to the front and back sides of the liquid crystal panel 90 (see FIG. 34), as illustrated in FIG. 21, the structure in which the reinforcing member 328 is disposed on the front side of the laminate structure 325 allows a reduction in the thickness of the illumination apparatus 300. This can improve the shape conformability of the first resin film 325a and the second resin film 325b during lamination, thereby reducing or preventing the formation of a gap around the panel 318.

Experimental results obtained by the present inventors show that no gap was observed around the panel 318 in a suitable example in which the panel 318 had a thickness of approximately 90 μm and the first resin film 325a and the second resin film 325b had a thickness of approximately 50 μm.

Since the reinforcing member 328 has a higher thermal conductivity than resin and is exposed to the outside air on the front side of the laminate structure 325, the reinforcing member 328 can efficiently radiate heat generated by the panel 318. The reinforcing member 328 can therefore prevent deterioration of the panel 318 caused by heat generation.

Thus, the illumination apparatus 300 having great flexibility, high actual strength (tenacity), and sufficient heat radiation can be provided.

Since the reflective layer 328a is formed on the front side of the reinforcing member 328, part of illumination light emitted from the light-emitting region V may be reflected by the reflective layer 328a, thus improving luminance. In other words, the reflective layer 328a can increase illumination efficiency. Thus, the illumination apparatus 300 can have sufficient illumination efficiency.

Thus, the illumination apparatus 300 having sufficient illumination efficiency can be provided.

Unlike the conventional reinforcement of the connected portion of the flexible board 320 with a silicon resin (adhesive), the first resin film 325a and the second resin film 325b also reinforce the connected portion, thus improving manufacturing efficiency. Furthermore, the connected portion and the panel 318 can be packed in (filled with) a single resin to ensure sufficient actual strength (tenacity) without impairing flexibility.

The polyethylene adhesive layer of the first resin film 325a and the second resin film 325b has excellent insulating properties, high water resistance, and high heat resistance, thus ensuring sufficient electrical reliability.

As for the manufacturing method, unlike acrylic adhesive layers, the polyethylene adhesive layer is almost free of initial tack at room temperature, allowing air bubbles to be easily removed and facilitating the positioning of the components in the precursor. A multilayer structure can therefore be formed in one pass by heat lamination under a reduced pressure. Thus, the manufacturing is highly efficient and highly mass productive.

Since the polyethylene adhesive layer is almost free of initial tack at room temperature, contamination with foreign substances can be reduced, and contaminants, if any, can be easily removed. Small foreign substances may be taken in the adhesive layer melted by heating. Defects caused by contamination with foreign substances in the polyethylene adhesive layer can therefore be less than in generally-used acrylic adhesive layers. In addition, the polyethylene resin is a general-purpose resin and inexpensive.

Eleventh Embodiment

Figure 26A:
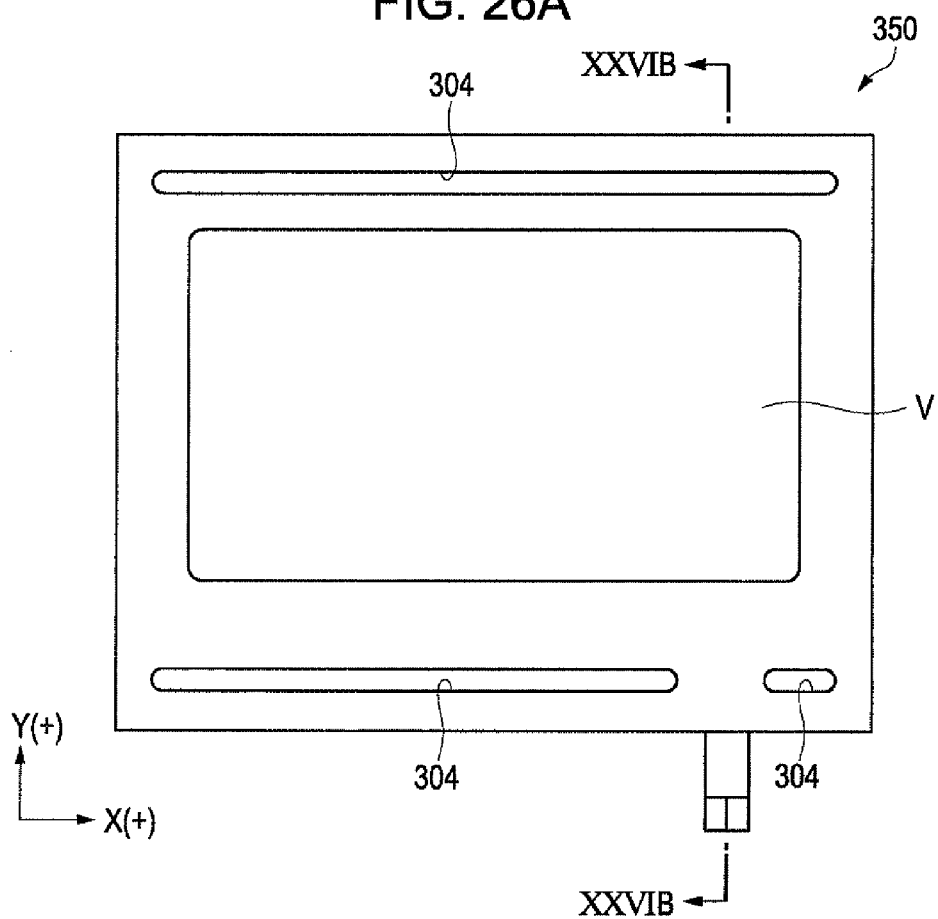
FIG. 26A is a plan view of an illumination apparatus according to an eleventh embodiment.
Figure 26B:
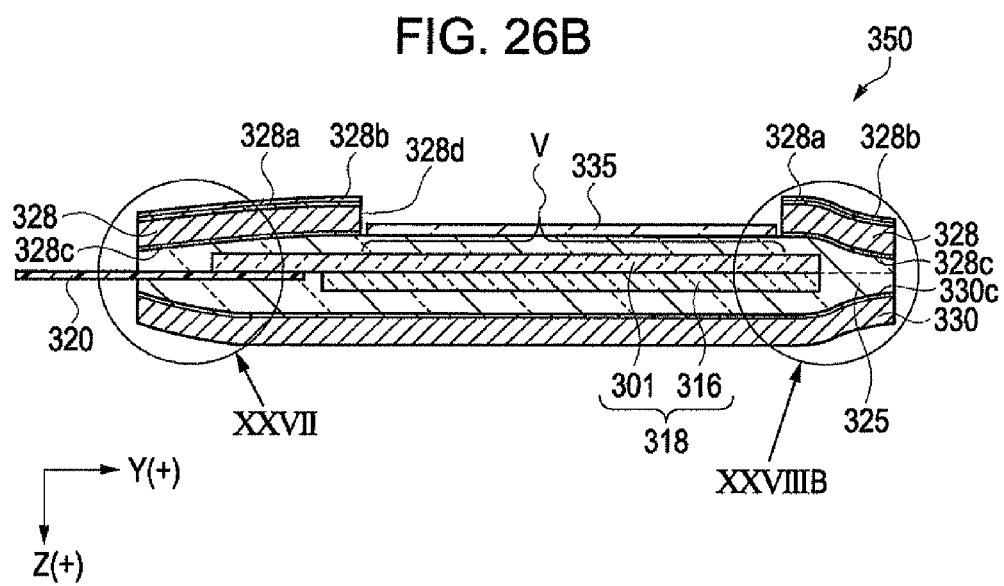
FIG. 26B is a sectional side view of the illumination apparatus taken along the line XXVIB-XXVIB in FIG. 26A.

FIG. 26A is a plan view of an illumination apparatus according to an eleventh embodiment and corresponds to FIG. 20. FIG. 26B is a cross-sectional view of the illumination apparatus taken along the line XXVIB-XXVIB in FIG. 26A and corresponds to FIG. 21.

An illumination apparatus 350 according to the eleventh embodiment will be described below. The same components as in the tenth embodiment are denoted by the same reference numerals and will not be further described.

As compared with the illumination apparatus 300 according to the tenth embodiment, the illumination apparatus 350 according to the present embodiment further includes a second reinforcing member 330 on the back side. Mounting holes 304 on the periphery of the illumination apparatus 350 are elongated holes (truck holes). A second reflective layer 328c and a third reflective layer 330c are formed on the inner surfaces (the surfaces on the panel 318 side) of the reinforcing member 328 (hereinafter also referred to as a first reinforcing member 328) and the second reinforcing member 330 on the front and back sides. Except for this, the description in the tenth embodiment substantially applies to the present embodiment.

The illumination apparatus 350 has the first reinforcing member 328 on the front side and the second reinforcing member 330 entirely covering the back side of the laminate structure 325. Like the first reinforcing member 328, the second reinforcing member 330 contains CFRP.

As illustrated in FIG. 26A, the mounting holes 304 on the periphery of the illumination apparatus 350 are elongated holes (truck holes). More specifically, slit mounting holes 304 having semicircular ends are formed in the long sides of the illumination apparatus 350. A single mounting hole 304 having a length close to the long side is formed in the long side on the Y-axis (+) side. Two long and short mounting holes 304 separated by the flexible board 320 are formed in the long side on the Y-axis (−) side.

The illumination apparatus 350 is not limited to this structure and may include a plurality of elongated mounting holes 304 in another arrangement on the periphery. For example, an additional mounting hole 304 may be formed in a short side, or an elongated mounting hole may be combined with a circular mounting hole.

A third reflective layer 330c is formed over the entire inner surface (a fifth surface) of the second reinforcing member 330. Like the first reflective layer 328a of the first reinforcing member 328, the third reflective layer 330c may be a reflective layer of an aluminum film. Like the first reflective layer 328a, the third reflective layer 330c may be overlaid with a protective layer, such as a resin coating layer. The outer surface (a surface on the Z-axis (+) side: a sixth surface) of the second reinforcing member 330 is a base material, such as unprotected CFRP.

In the present embodiment, the inner surface (a surface on the panel 318 side) of the first reinforcing member 328 on the front side has the second reflective layer 328c. The second reflective layer 328c is similar to the first reflective layer 328a. The second reflective layer 328c on the inner surface may be overlaid with a protective layer, such as a resin coating layer.

As in the illumination apparatus 300 according to the tenth embodiment, an optical film 335 is disposed in the opening (hole) 328d of the first reinforcing member 328 on the front side. The optical film 335 has a planar size equal to or smaller than the opening 328d and does not overlap with the first reinforcing member 328. This structure without an overlap allows the thickness of the illumination apparatus 350 to be reduced.

The manufacturing method is basically the same as the manufacturing method described in the tenth embodiment. More specifically, the second resin film 325b, the panel 318, the first resin film 325a, the optical film 335, and the first reinforcing member 328 are stacked on the second reinforcing member 330 in this order to prepare a precursor. The precursor is pressed in the same manner as in the tenth embodiment.

In the preceding description, the second reflective layer 328c and the third reflective layer 330c have a flat shape on the inner surface of the first reinforcing member 328 and the second reinforcing member 330. The second reflective layer 328c and the third reflective layer 330c may also have any shape that allows light to be efficiently reflected.

Figure 27A:
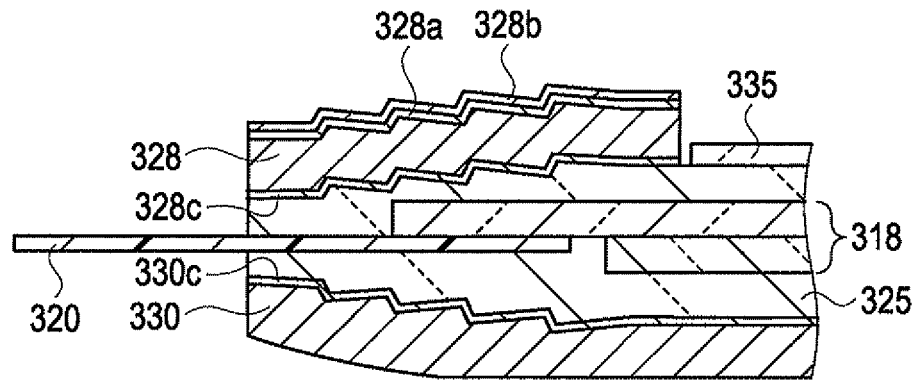
FIG. 27A is an enlarged view of an example of a portion XXVII in FIG. 26B.
Figure 27B:
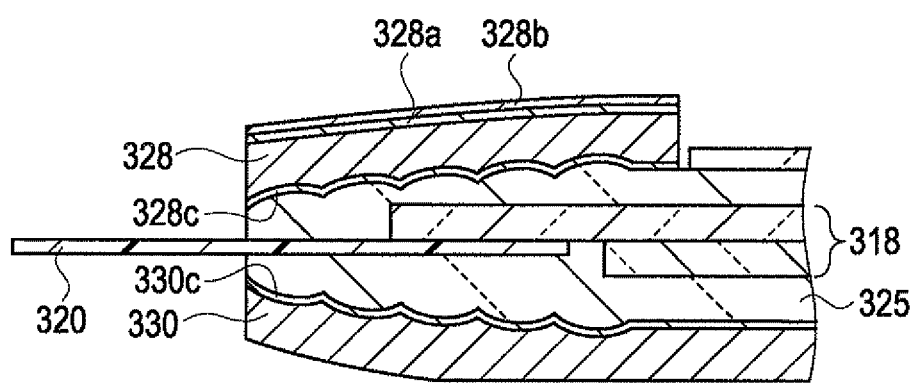
FIG. 27B is an enlarged view of another example of the portion XXVII in FIG. 26B.
Figure 27C:
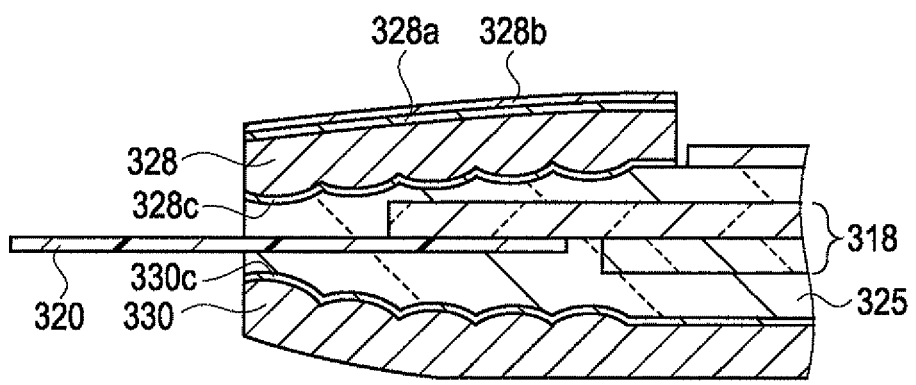
FIG. 27C is an enlarged view of still another example of the portion XXVII in FIG. 26B.

FIGS. 27A to 27C are enlarged views of examples of the portion XXVII in FIG. 26B. The second reflective layer 328c has a plurality of recessed and raised portions.

For example, as illustrated in FIG. 27A, the periphery of the inner surface of the first reinforcing member 328 may be embossed by press working to form a plurality of steps on the second reflective layer 328c. The height of each step preferably ranges from 0.1 to 10 µm. The recessed and raised portions may be wave-shaped or wedge-shaped.

In order to increase light reflection efficiency, the height difference between the recessed and raised portions is preferably increased from the light-emitting region V to the periphery. The recessed and raised portions may have any fine pattern, for example, a grid pattern or an imbricate pattern.

The third reflective layer 330c on the inner surface of the second reinforcing member 330 also has the same stepped pattern.

In FIG. 27A, as a suitable example, the first reflective layer 328a on the front side of the first reinforcing member 328 also has the stepped pattern. Alternatively, as illustrated in FIG. 26B, the first reflective layer 328a may be flat.

Such an embossed pattern may be formed by pressing a die having recessed and raised portions having a height difference in the range of 0.1 to 10 µm against a surface of a precursor (prepreg) of layered resin-impregnated carbon fibers at 80° C. to 120° C. Subsequently, an aluminum reflective layer may be formed on the inner surface and the front side by vacuum deposition.

Use of a roller die allows a precursor sheet to be manufactured by a roll-to-roll process, thus further increasing manufacturing efficiency.

As illustrated in FIG. 27B, a plurality of concave (bowl-shaped) curves may be formed on the second reflective layer 328c on the inner surface of the first reinforcing member 328 and the third reflective layer 330c on the inner surface of the second reinforcing member 330.

Alternatively, as illustrated in FIG. 27C, a plurality of convex (rounded hill) curves may be formed on the second reflective layer 328c on the inner surface of the first reinforcing member 328 and the third reflective layer 330c on the inner surface of the second reinforcing member 330.

In FIGS. 27B and 27C, although the first reflective layer 328a on the front side of the first reinforcing member 328 is flat, the first reflective layer 328a may have concave or convex curves.

Figure 28A:
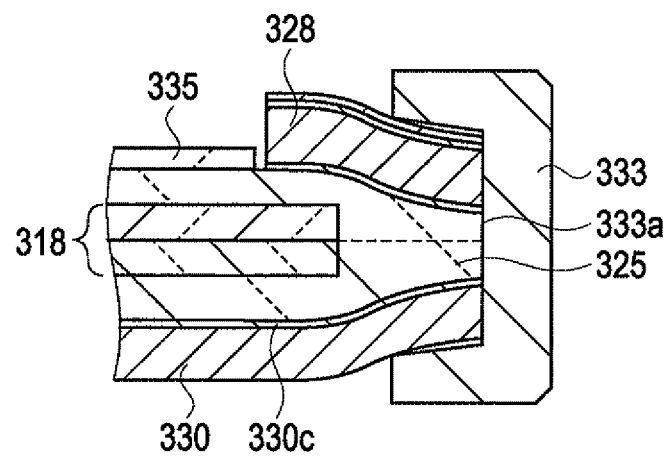
FIG. 28A is an enlarged view of a portion XXVIIIB in FIG. 26B.

FIG. 28A is an enlarged view of a portion XXVIIIB in FIG. 26B.

The illumination apparatus 350 may include a reflective member 333 on the periphery.

The reflective member 333 is a sealing member formed of metal, such as aluminum, and has a U-shaped cross-section, as illustrated in FIG. 28A. An end of the illumination apparatus 350 is clamped in the reflective member 333 while the bottom 333a of the U-shaped reflective member 333 abuts on the end face of the illumination apparatus 350. The reflective member 333 covers the four sides of the illumination apparatus 350. The reflective member 333 has a slit through which the flexible board 320 protrudes. The bottom 333a is a reflective surface, which reflects light emitted from the end face of the panel 318 toward the panel 318. The reflected light is repeatedly reflected by the second reflective layer 328c and the third reflective layer 330c. Part of the reflected light becomes illumination light.

The reflective member 333 is not necessarily formed of metal and may have any structure provided that the reflective surface abuts on the end face of the illumination apparatus 350. For example, the end face of the illumination apparatus 350 may be covered with a reflective tape.

Figure 28B:
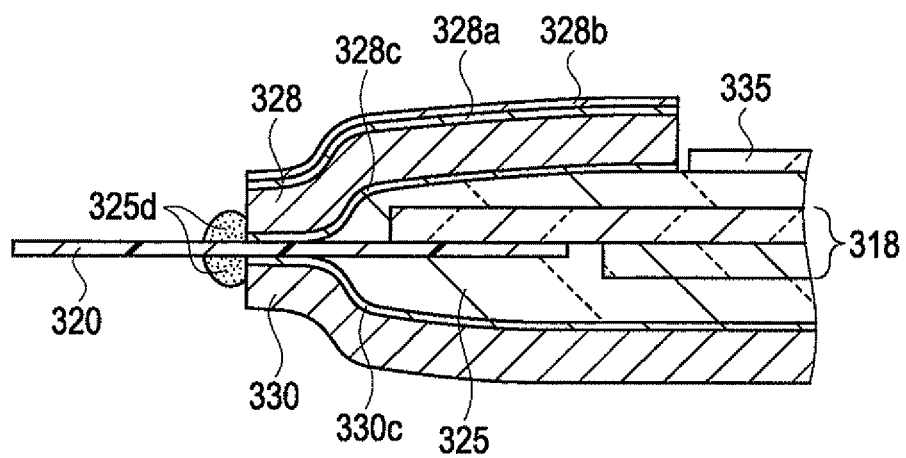
FIG. 28B is an enlarged view of an example of the portion XXVII in FIG. 26B.

FIG. 28B is an enlarged view of an example of a portion XXVII in FIG. 26B.

The first reinforcing member 328 and the second reinforcing member 330 may be bonded to each other at the periphery. More specifically, after the lamination of the first reinforcing member 328 and the second reinforcing member 330 in step S23 in FIG. 24, they are placed in a special-purpose die and is bonded to each other at the periphery by press working. The die is designed to narrow the periphery and is heated at a temperature in the range of 80° C. to 120° C.

As illustrated in FIG. 28B, the ends of the first reinforcing member 328 and the second reinforcing member 330 are narrowed by the press working to bond the second reflective layer 328c and the third reflective layer 330c at the periphery. Part of the resin film constituting the laminate structure 325 is extruded from the edge, forming a resin pool 325d.

After the first reinforcing member 328 and the second reinforcing member 330 are bonded to each other at the periphery, posttreatment in step S24 shown in FIG. 24 is performed. The resin pool 325d may be removed in the posttreatment.

In addition to the advantages of the tenth embodiment, the present embodiment also has the following advantages.

The illumination apparatus 350 includes the frame-shaped first reinforcing member 328 on the front side and the second reinforcing member 330 entirely covering the back side.

Even if a bending stress is applied to a glass substrate in any direction, therefore, the glass substrate can be prevented from being bent to the breaking point (limiting radius). In particular, the first reinforcing member 328 and the second reinforcing member 330 cover the most crack-prone periphery of the panel 318 from the front and back sides of the laminate structure 325, thereby preventing cracking of the panel 318.

Thus, the illumination apparatus 350 having great flexibility and high actual strength (tenacity) can be provided.

The first reinforcing member 328 and the second reinforcing member 330 on the front and back sides of the laminate structure 325 can efficiently radiate heat generated by the panel 318.

Thus, the illumination apparatus 350 having great flexibility, high actual strength (tenacity), and sufficient heat radiation can be provided.

The second reflective layer 328c on the inner surface of the first reinforcing member 328 and the third reflective layer 330c on the inner surface of the second reinforcing member 330 allow part of light (leaking light) from portions other than the light-emitting region V of the panel 318 to be utilized as illumination light. More specifically, for example, leaking light from the end face of the panel 318 is repeatedly reflected by the second reflective layer 328c and the third reflective layer 330c, and part of the leaking light is emitted from the light-emitting region V as illumination light.

This can increase illumination efficiency. The illumination apparatus 350 can therefore have sufficient illumination efficiency.

Thus, the illumination apparatus 350 having sufficient illumination efficiency can be provided.

A plurality of wedge-shaped, convex, or concave portions on the second reflective layer 328c and the third reflective layer 330c on the inner surfaces of the reinforcing members can increase reflection efficiency. In other words, these portions can increase the amount of leaking light traveling to the light-emitting region V.

Light leaking from the panel 318 composed of a pair of transparent substrates is most frequently comes from the end face.

Forming the reflective member 333 on the periphery of the illumination apparatus 350 or bringing the second reflective layer 328c into contact with the third reflective layer 330c can reduce light leakage. In other words, this can increase the use efficiency of light leaking from the end face and illumination efficiency.

Thus, the illumination apparatus 350 having sufficient illumination efficiency can be provided.

Twelfth Embodiment

FIG. 29A is a plan view of an illumination apparatus according to a twelfth embodiment. FIG. 29B is a sectional side view of the illumination apparatus taken along the line XXIXB-XXIXB in FIG. 29A.

An illumination apparatus 360 according to the twelfth embodiment will be described below. The same components as in the preceding embodiments are denoted by the same reference numerals and will not be further described.

The illumination apparatus 360 according to the present embodiment is a large (large area) illumination apparatus in which a plurality of panels 332 are two-dimensionally arranged (tiling). More specifically, four panels 332 two-dimensionally arranged are disposed between a first resin film 345a and a second resin film 345b and between a first reinforcing member 336 and a second reinforcing member 337 on the front and back sides of the panels 332.

In the illumination apparatus 360, a matrix of four panels 332 are tiled. The panels 332 are substantially the same as the panel 318 according to the tenth embodiment except that the panels 332 are rectangular elongated in the Y-axis direction. The panels 332 emit substantially white light from a light-emitting region.

The four panels 332 aligned in the longitudinal direction and evenly spaced vertically and horizontally are disposed between the first resin film 345a and the second resin film 345b to form a laminate structure 345. The first resin film 345a and the second resin film 345b have the same structure as the first resin film 325a and the second resin film 325b according to the tenth embodiment except that their planar shapes (sizes) are different.

The first reinforcing member 336 and the second reinforcing member 337 are disposed on the front and back sides of the laminate structure 345. The first reinforcing member 336 and the second reinforcing member 337 also have substantially the same structure as the first reinforcing member 328 and the second reinforcing member 330 except that their planar shapes (sizes) are different. More specifically, the first reinforcing member 336 has a plurality of openings 336a corresponding to light-emitting regions in the panels 332. The second reinforcing member 337 entirely covers the back side of the four panels 332 tiled.

As illustrated in FIG. 29A, elongated mounting holes 304 are formed in the periphery of the illumination apparatus 360. More specifically, slit mounting holes 304 having semicircular ends are formed in the long sides of the illumination apparatus 360. A slit mounting hole 304 is also formed in the short side on the Y-axis (+) side.

The illumination apparatus 360 is not limited to this structure and may include a plurality of elongated mounting holes 304 in another arrangement on the periphery. For example, an additional mounting hole 304 may be formed in the short side on the Y-axis (−) side, or an elongated mounting hole may be combined with a circular mounting hole.

Four flexible boards 320 that supply driving power to the four panels 332 protrude outside through the short side on the Y-axis (−) side of the illumination apparatus 360. The flexible boards 320 of the two panels 332 on the Y-axis (+) side extends on the back side of the two panels 332 on the Y-axis (−) side and protrude outside through the short side on the Y-axis (−) side.

The rectangular light-emitting region of each of the panels 332 is divided by a rib 336g of the first reinforcing member 336 into two substantially square light-emitting regions Va and Vb. The ribs 336g prevent the light-emitting regions from being expanded in the X-axis direction during lamination.

The number of panels 332 to be tiled is not limited to four and may be any plural number.

In addition to the advantages of the eleventh embodiment, the present embodiment also has the following advantages.

In the illumination apparatus 360, a plurality of panels 332 can be tiled to fabricate an illumination apparatus having a desired planar size.

Since a low-profile panel is fragile, upsizing of an illumination apparatus with the low-profile panel has been limited because of poor handleability and a low yield. A large-area illumination apparatus can therefore be fabricated in a high yield by tiling a plurality of panels 332 having such a size that excellent handleability and a high yield are ensured.

Thus, the large illumination apparatus 360 can be provided with high manufacturing efficiency and low costs.

Figure 30:
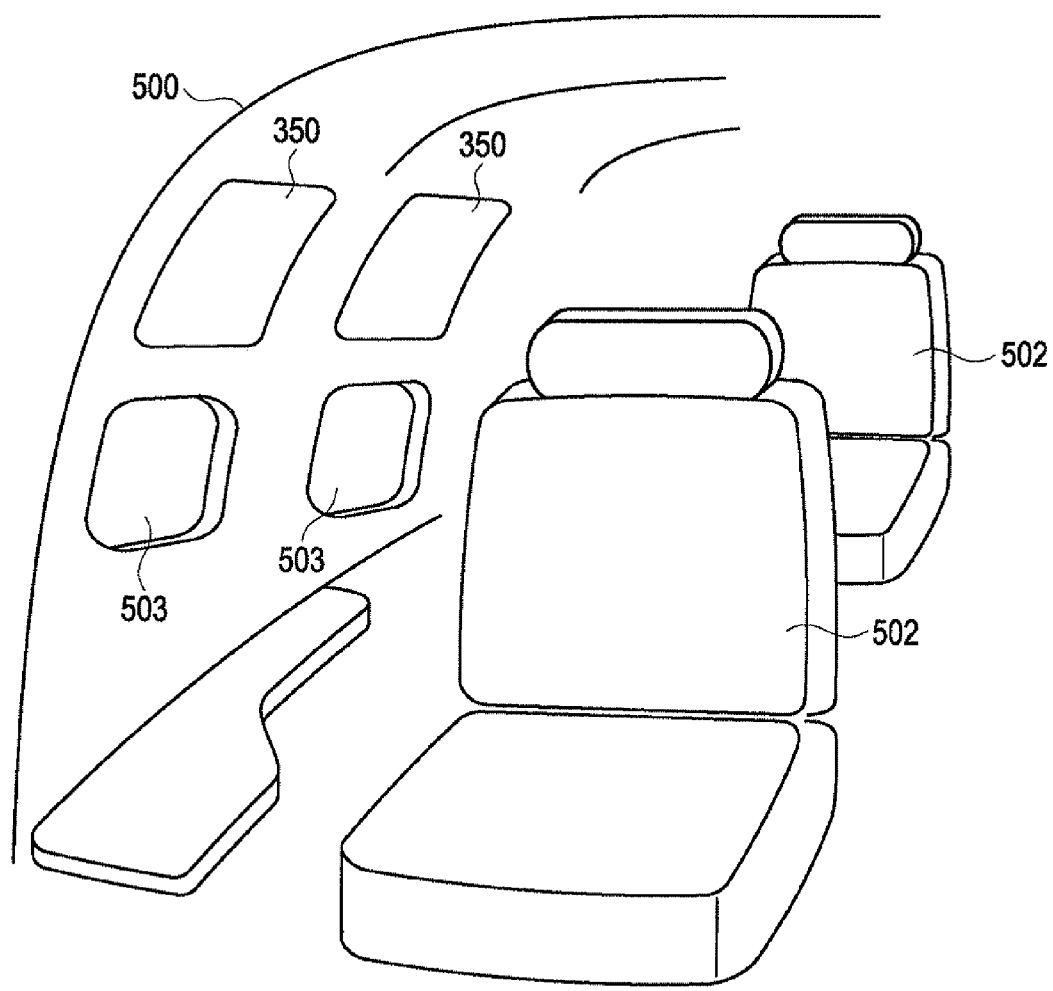
FIG. 30 is a schematic view of an interior illumination apparatus of an airplane.

FIG. 30 is a schematic view of an interior illumination apparatus of an airplane including the illumination apparatuses described above.

The illumination apparatus 350 can be used as an interior illumination apparatus of an airplane, for example. The illumination apparatus 350 may be replaced with an illumination apparatus according to the tenth or twelfth embodiment or a modified embodiment described below.

As illustrated in FIG. 30, curved illumination apparatuses 350 are mounted on a curved wall 500 of an airplane. More specifically, the illumination apparatuses 350 are mounted on the wall 500 near windows 503. The windows 503 are located in a relatively flat area on the wall 500 beside seats 502. The illumination apparatuses 350 are mounted on a more curved area above the windows 503. In other words, the illumination apparatuses 350 are mounted such that an area over the knee of a passenger in a seat 502 can be mainly illuminated by the illumination apparatuses 350.

The illumination apparatuses 350 are not necessarily mounted directly on the wall 500. For example, the illumination apparatuses 350 may be mounted on the doors of the overhead bins above the windows 503 or on the curved ceiling.

As described above, the illumination apparatuses 350 can be mounted on a curved surface as the interior illumination apparatuses of an airplane because of their flexibility. The light weight of the illumination apparatuses 350 allows the illumination apparatuses 350 to be mounted on the doors of the overhead bins without impairing the opening and closing of the doors and can save the fuel consumption of the airplane. The luminance of the illumination apparatus 350 increases substantially linearly with the direct-current power supplied and can therefore be altered without a complicated circuit, such as an inverter circuit.

Thus, a light-weight easy-to-use illumination apparatus is provided that can be installed at any location.

The illumination apparatus 350 is not limited to the interior illumination apparatus of an airplane and may be used as interior illumination in traversing means, such as ships, trains, and automobiles. The illumination apparatus 350 may also be used as interior illumination in buildings, such as company premises, hotels, and houses.

The illumination apparatus 350 used in these applications has the same operational advantages.

The invention is not limited to the embodiments described above. Various changes and modifications may be made in these embodiments. Modified embodiments will be described below.

First Modified Embodiment

Referring back to FIG. 3, in the display panel 18 described in the preceding embodiment, all the pixels can emit white light, and color filters for selecting the respective RGB components from the white light are disposed on the display surface side. The display panel 18 is not limited to this structure and may have any structure in which RGB colored light can be emitted from the respective color pixels.

For example, RGB light-emitting layers are formed in the organic EL layer 8 for the respective RGB color pixels (a three-color light emitting method).

Although the display 100 is of an active-matrix type in the preceding embodiments, the display 100 may be of a passive-matrix (simple-matrix) type.

In this case, the element layer 2 is not necessary, and the organic EL layer 8 is disposed between a scanning electrode and a data electrode. For example, the scanning electrode is formed on the element substrate 1 side, and the data electrode is formed on the CF substrate 16 side. The scanning electrodes and the data electrodes cross each other and extend in a grid-like fashion as viewed from the top.

These structures can also achieve the operational advantages of the preceding embodiments.

Second Modified Embodiment

Although the reinforcing members 28, 29, 30, and 44 are formed of CFRP containing carbon fiber in the preceding embodiments, the reinforcing members 28, 29, 30, and 44 may be formed of any material having similar physical properties.

For example, the reinforcing members 28, 29, 30, and 44 may be formed of invar (an iron alloy containing 30% to 50% by weight Ni), titanium, or a titanium alloy, which has physical properties similar to the physical properties of CFRP.

These materials may be used in combination. For example, in the structure illustrated in FIG. 8, the first frame-shaped reinforcing member 28 may be formed of invar having excellent processability, and the second reinforcing member 30 may be formed of CFRP.

Use of invar having excellent processability in the frame-shaped reinforcing member 28 or 44 on the front side allows smooth finish of the four rounded corners Rs (see FIG. 19A) and the end face of the opening, thus providing the reinforcing member 28 or 44 with the function as a parting plate for distinctively defining the display area V. These structures can also achieve the operational advantages of the preceding embodiments.

Third Modified Embodiment

Figure 31:
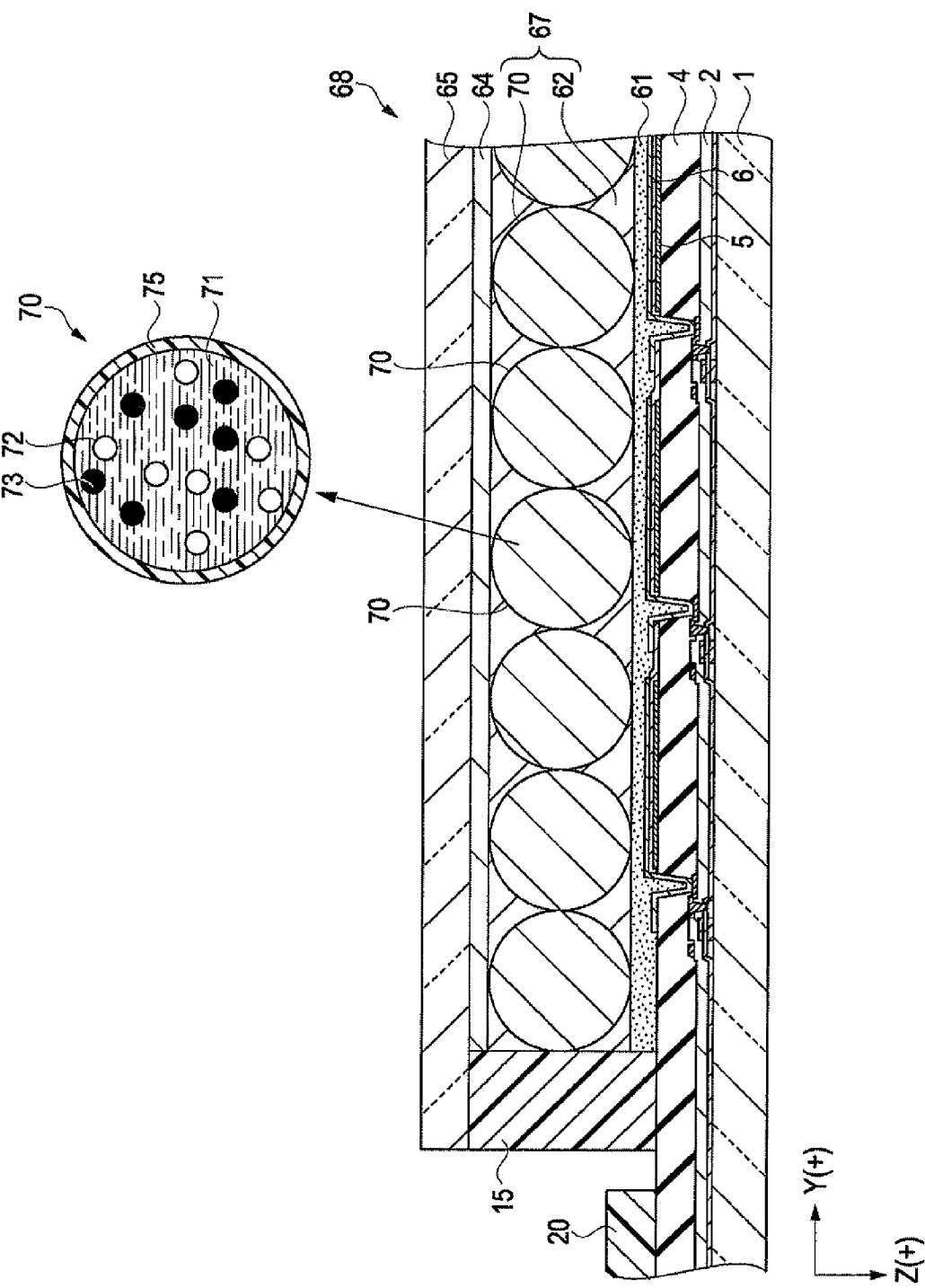
FIG. 31 is a cross-sectional view of a display panel according to a third modified embodiment of the invention.

FIG. 31 is a cross-sectional view of a display panel according to a third modified embodiment and corresponds to FIG. 3.

Although the display panel 18 is an organic EL panel in the preceding embodiments, the display panel 18 may be any thin display panel including an electro-optical layer between a pair of substrates. For example, the display panel 18 may be an electrophoresis panel, which includes an electrophoresis layer as an electro-optical layer.

A display panel 68 according to the third modified embodiment will be described below. The same components as in FIG. 3 are denoted by the same reference numerals and will not be further described.

The display panel 68 according to the present embodiment is an reflective electrophoresis panel, which includes an electrophoresis layer 67 as an electro-optical layer.

The display panel 68 includes the electrophoresis layer 67 between an element substrate 1 and a counter substrate 65. A multilayer structure from the element substrate 1 to a pixel electrode 6 is the same as the structure illustrated in FIG. 3.

The counter substrate 65 is a transparent substrate formed of glass or plastic, for example. A counter electrode 64 disposed on the counter substrate 65 faces a plurality of pixel electrodes 6. The counter electrode 64 is formed of a transparent electroconductive material, such as ITO.

The electrophoresis layer 67 includes a plurality of microcapsules 70, a binder 62 for binding the microcapsules 70, and an adhesive layer 61. The display panel 68 is fabricated by binding an electrophoresis sheet, in which the electrophoresis layer 67 is fixed to the counter substrate 65 with the binder 62, to the element substrate 1, on which the pixel electrode 6 and other components are formed with the adhesive layer 61.

The microcapsules 70 are disposed between the pixel electrodes 6 and the counter electrode 64. One or two or more microcapsules 70 are disposed for a single pixel (or a single pixel electrode 6).

As illustrated in an enlarged view at the upper right in FIG. 31, each of the microcapsules 70 includes a dispersion medium 71, a plurality of white particles 72, and a plurality of black particles 73 in a shell 75. For example, the microcapsule 70 is a sphere having a diameter of approximately 50 μm.

The shell 75 is formed of a translucent polymer resin, such as an acrylic resin, a urea resin, gum arabic, or gelatin.

The dispersion medium 71 disperses the white particles 72 and the black particles 73 in the microcapsule 70 (or within the shell 75).

For example, the white particles 72 are (polymer or colloid) particles containing a white pigment, such as titanium dioxide, zinc white (zinc oxide), or antimony trioxide, and are negatively charged.

For example, the black particles 73 are (polymer or colloid) particles containing a black pigment, such as aniline black or carbon black, and are positively charged.

An electric field caused by a potential difference between the pixel electrode 6 and the counter electrode 64 moves the white particles 72 and the black particles 73 in the dispersion medium 71. The color tone of particles deposited on the counter electrode 64 is displayed.

The pigment of the white particles 72 or the black particles 73 may be replaced with a red, green, or blue pigment to display a red, green, or blue color, respectively.

The display panel 68 is not limited to of a microcapsule type and may be an electrophoresis panel of an electronic liquid powder type, in which the polarity of a chargeable electronic liquid powder within a pixel is altered to turn on and off the display. An electrophoresis panel of a cholesteric liquid crystal type may also be used.

These structures can also achieve the operational advantages of the preceding embodiments.

Fourth Modified Embodiment

A fourth modified embodiment will be described below with reference to FIG. 32.

Figure 32A:
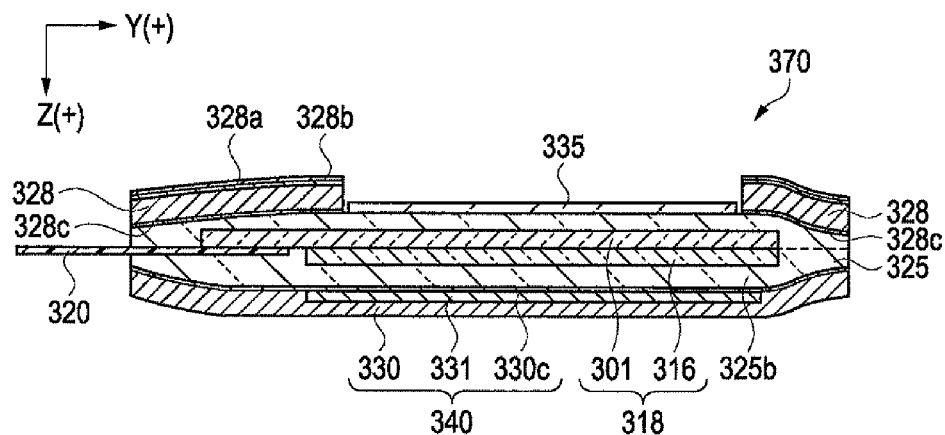
FIG. 32A is a cross-sectional view of a display panel according to a fourth modified embodiment of the invention.
Figure 32B:
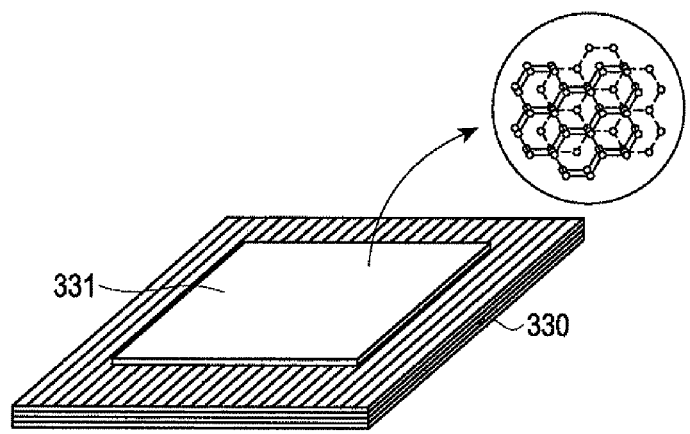
FIG. 32B is a perspective view of a reinforcing member of the display panel according to the fourth modified embodiment.
Figure 32C:
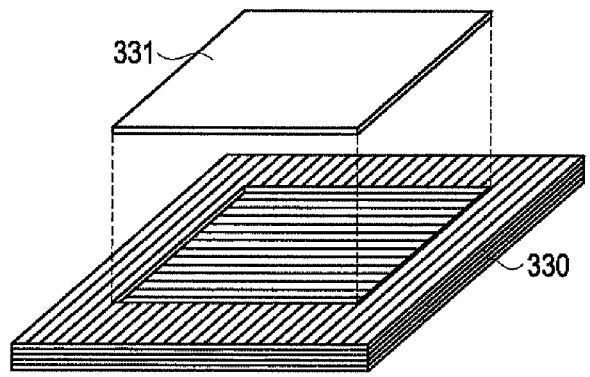
FIG. 32C is a perspective view of a reinforcing member of the display panel according to the fourth modified embodiment.

FIG. 32A is a cross-sectional view of an illumination apparatus according to the fourth modified embodiment and corresponds to FIG. 26B. FIGS. 32B and 32C are perspective views of a reinforcing member according to the fourth modified embodiment.

An illumination apparatus 370 according to the fourth modified embodiment will be described below. The same components as in the eleventh embodiment are denoted by the same reference numerals and will not be further described.

The illumination apparatus 370 according to the present embodiment includes a second reinforcing member 340, which is structurally different from the second reinforcing member 330 in the eleventh embodiment. More specifically, the second reinforcing member 340 exhibits better heat radiation characteristics than the second reinforcing member 330. Except for this, the description in the eleventh embodiment substantially applies to this embodiment.

The second reinforcing member 340 is disposed on the entire back side of a laminate structure 325 in the illumination apparatus 370. The second reinforcing member 340 has a size substantially the same as the laminate structure 325.

As illustrated in FIG. 32B, the second reinforcing member 340 includes a graphite layer 331 and a third reflective layer 330c on a four-layer CFRP reinforcing body 330 in an integrated form. Although the reinforcing body 330 has the same structure as the second reinforcing member 330 in the eleventh embodiment, the reinforcing body 330 is part of the second reinforcing member 340 and is designated differently from the second reinforcing member 330. For the sake of clarity, the third reflective layer 330c is omitted in FIGS. 32B and 32C.

The graphite layer 331 includes sublayers composed of carbon atoms having a hexagonal structure (as illustrated in an enlarged view in a circle in FIG. 32B) stacked in the thickness direction (the Z-axis direction).

The graphite layer 331 has a thermal conductivity as high as 600 to 1500 W/m·k in the in-plane direction. The graphite layer 331 disposed between the laminate structure 325 and the reinforcing body 330 can improve heat radiation. More specifically, heat generated by a panel 318 is radially diffused across the graphite layer 331 in a short period of time. The graphite layer 331 can transfer heat to the reinforcing body 330 on the outermost surface, thus improving heat radiation. Graphite may be synthetic graphite manufactured by firing the starting material of a polyimide film at 1000° C. or more for crystallization or natural graphite manufactured by rolling graphite particles obtained from a mine into a film. In either case, graphite has a hexagonal structure and a thermal conductivity of 600 W/m·k or more. The graphite layer 331 has a coefficient of linear expansion of approximately 5 ppm/° C., which is substantially the same as that of a glass substrate.

A layered product composed of the CFRP reinforcing body 330 and the graphite layer 331 is also referred to as carbon fiber graphite reinforced plastic (CFGRP). In the present modified embodiment, the third reflective layer 330c is heat-conductive aluminum foil.

For example, the second reinforcing member 340 (CFGRP) can be manufactured by stacking an epoxy-intermediate-impregnated carbon fiber prepreg film (layer), a graphite film (layer), and the third reflective layer 330c and hot-pressing them under reduced pressure. The heating temperature preferably ranges from 120° C. to 150° C.

In the present modified embodiment, although the reinforcing body 330 is a four-layer CFRP sheet as a suitable example, the reinforcing body 330 may have any multilayer structure composed of two or more carbon fiber layers having different extending directions of carbon fiber, as described in the tenth embodiment.

The graphite layer 331 is smaller than the reinforcing body 330. In other words, the periphery of the graphite layer 331 is within the reinforcing body 330. Preferably, the graphite layer 331 is larger than the light-emitting region V of the panel 318 but smaller than the panel 318.

Such a structure is intended to exploit the high thermal conductivity of the graphite layer 331 and compensate for low abrasion resistance and fragility of the graphite layer 331. Such a structure has been designed such that a portion generating a large amount of heat is covered with the graphite layer 331 while less bending stress is applied to the portion during lamination.

In the present embodiment, as a suitable example, the reinforcing body 330 is a five-layer CFGRP sheet having a thickness of approximately 140 μm. More specifically, the CFGRP sheet includes four CFRP layers having a total thickness of approximately 100 μm and the graphite layer 331 having a thickness of approximately 40 μm.

The thickness of the reinforcing body 330 is not limited to this thickness and may range from approximately 50 to 200 μm. Within this thickness range, the illumination apparatus 370 can have self-supporting ability, a high strength, and moderate flexibility.

Preferably, the graphite layer 331 has a thickness of 50 μm or less to ensure thermal conductivity in the thickness direction.

The structure of the second reinforcing member 340 is not limited to the structure illustrated in FIG. 32B. For example, the second reinforcing member 340 may have the structure illustrated in FIG. 32C.

In the second reinforcing member 340 illustrated in FIG. 32C, the top carbon fiber layer i of the reinforcing body 330 has an opening (hole) into which the graphite layer 331 is inserted. In other words, the top carbon fiber layer has a frame shape with an opening into which the graphite layer 331 is inserted.

Thus, the second reinforcing member 340 includes the graphite layer 331 placed in the opening. The second reinforcing member 340 may be manufactured by hot pressing.

In this structure, the graphite layer 331 has such a thickness that the top surface of the graphite layer 331 is flush with or higher than the top surface of the carbon fiber layer i to ensure heat transfer. As a suitable example, the graphite layer 331 has a thickness of approximately 25 μm, which is the same as the height of the carbon fiber layer i.

This structure allows a reduction in the total thickness of the illumination apparatus 370 while the heat radiation characteristics are substantially the same as the reinforcing member illustrated in FIG. 32B.

In addition to the advantages of the eleventh embodiment, the present modified embodiment also has the following advantages.

The illumination apparatus 370 includes the second reinforcing member 340 on the back side of the laminate structure 325. The second reinforcing member 340 includes the CFRP reinforcing body 330, the graphite layer 331, and the third reflective layer 330c in an integrated form.

The third reflective layer 330c and the graphite layer 331 each having high thermal conductivity disposed between the laminate structure 325 and the reinforcing body 330 can radially diffuse heat generated by the panel 318 across the graphite layer 331 in a short period of time. The graphite layer 331 can transfer heat to the reinforcing body 330 on the outermost surface. The reinforcing body 330 on the outermost surface can radiate heat to the outside.

The graphite layer 331 has a coefficient of linear expansion of approximately 5 ppm/° C., which is substantially the same as that of a glass substrate. The second reinforcing member 340 including the graphite layer 331 disposed on the CFRP reinforcing body 330 can therefore be attached to the laminate structure 325 without causing a warp in the laminate structure 325.

Thus, the illumination apparatus 370 that can sufficiently radiate heat and is prevented from warping is provided.

The graphite layer 331 having a thickness as small as 50 μm or less is covered with the reinforcing body 330 and a resin film 325b such that the periphery of the graphite layer 331 is not exposed. Such a structure can compensate for low abrasion resistance and fragility of the graphite layer 331, thereby ensuring sufficient actual strength, without impairing thermal conductivity in the thickness direction.

Thus, the illumination apparatus 370 can have sufficient actual strength while having great flexibility.

Fifth Modified Embodiment

Figure 33:
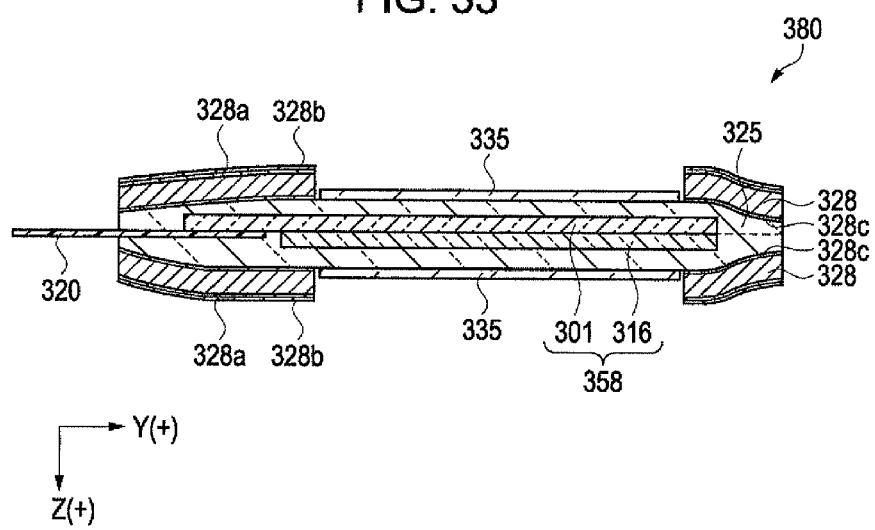
FIG. 33 is a cross-sectional view of an illumination apparatus according to a fifth modified embodiment of the invention.

FIG. 33 is a cross-sectional view of an illumination apparatus according to the fifth modified embodiment and corresponds to FIG. 26B.

An illumination apparatus 380 according to the fifth modified embodiment will be described below. The same components as in the eleventh embodiment are denoted by the same reference numerals and will not be further described.

In the preceding embodiments, the panel 318 emits illumination light from a light-emitting region on the front side. A panel may emit illumination light from the front and back sides.

The illumination apparatus 380 includes a panel 358 that can emit illumination light from the front and back sides. In addition to a reinforcing member 328 on the front side, the illumination apparatus 380 includes a frame-shaped reinforcing member 328 on the back side.

The panel 358 has substantially the same structure as the panel 318 illustrated in FIG. 22. However, a metal layer of the cathode 309 has such a thickness that light can pass through the metal layer. Alternatively, the cathode 309 may be a transparent electrode formed of ITO.

In addition to the light-emitting region on the front side, the panel 358 can emit illumination light from a light-emitting region on the back side. Thus, the panel 358 can emit substantially white illumination light from the front and back sides.

In order to emit illumination light from the back side of the panel 358, the illumination apparatus 380 includes, on the back side, an inverted form of the frame-shaped reinforcing member 328 on the front side. An optical film 335 on the front side is also attached to the light-emitting region on the back side.

The illumination apparatus 380, which can emit illumination light from the front and back sides, can be suitably used in a screen for separating two customer areas. The illumination apparatus 380 can simultaneously illuminate the two customer areas. The illumination apparatus 380 can also be suitably used in a glass door of a store facing a road. The illumination apparatus 380 can simultaneously illuminate the road surface and the floor in the store.

Thus, the illumination apparatus 380 is provided that can simultaneously illuminate the front and rear.

Sixth Modified Embodiment

A sixth modified embodiment will be described below with reference to FIG. 26B.

Although the reinforcing member 328 and the reinforcing member 330 (reinforcing body) are formed of CFRP containing carbon fiber in the preceding embodiments, the reinforcing member 328 and the reinforcing member 330 (reinforcing body) may be formed of any material having similar physical properties.

For example, the reinforcing member 328 may be formed of invar (an iron alloy containing 30% to 50% by weight Ni), titanium, or a titanium alloy, which exhibits a low thermal deformation (a low coefficient of linear expansion) like CFRP.

These materials may be used in combination. For example, in the structure illustrated in FIG. 26B, the first frame-shaped reinforcing member 328 may be formed of invar having excellent processibility, and the second reinforcing member 330 may be formed of CFRP.

These structures can also achieve the operational advantages of the preceding embodiments.

Seventh Modified Embodiment

A seventh modified embodiment will be described below with reference to FIG. 22.

Although the panel 318 is a passive panel that emits substantially white light from the light-emitting region V in the preceding embodiments, the panel 318 is not limited to the passive panel and may be an active panel. More specifically, the panel 318 may be an organic EL panel having the light-emitting region V including a matrix of RGB active pixels.

This structure can also achieve the operational advantages of the preceding embodiments. Furthermore, an illumination apparatus of a desired illumination color can be provided. The illumination apparatus can also be used as a display panel for signs and signboards.

Eighth Modified Embodiment

Although the display panel 18 or the panel 318 includes the organic EL layer 8 or the organic EL layer 308 as an electro-optical layer on the glass substrate in the preceding embodiments, the display panel 18 or the panel 318 may have another structure. For example, like a glass substrate, if a transparent organic film that may be broken or cannot recover after bending is used as a substrate, the laminate structure in the preceding embodiments can be employed to increase the resistance to bending.

The entire disclosure of Japanese Patent Application No. 2009-149478, filed Jun. 24, 2009, 2009-150708, filed Jun. 25, 2009, and 2010-058826, filed Mar. 16, 2010 are expressly incorporated by reference herein.

What is claimed is:

1. An electro-optical device comprising:
a display panel having an electro-optical layer;
a first resin film disposed on the display panel to cover a first surface on the side of a display area of the display panel;
a second resin film disposed on the display panel to cover a second surface that is opposite the first surface;
a reinforcing member disposed on the first resin film, the reinforcing member having a third surface facing the first surface of the display panel and a fourth surface being opposite to the third surface, and
a reflective layer disposed on at least one of the third surface and the fourth surface of the reinforcing member.

2. An electro-optical device according to claim 1, wherein the reinforcing member has an opening corresponding to a position of the display area of the display panel.

3. The electro-optical device according to claim 1, wherein the reinforcing member includes a first carbon fiber layer and a second carbon fiber layer, the first carbon fiber layer containing a plurality of carbon fibers extending in a first direction, the second carbon fiber layer containing a plurality of carbon fibers extending in a second direction, the first direction and the second direction crossing each other.

4. The electro-optical device according to claim 3, wherein the first carbon fiber layer and the second carbon fiber layer are formed of resin-impregnated carbon fiber prepreg, and the reinforcing member is a layered product formed by curing at least three layers of the first carbon fiber layer and the second carbon fiber layer.

5. The electro-optical device according to claim 2, wherein the reinforcing member is composed of invar, titanium, or a titanium alloy.

6. The electro-optical device according to claim 2, wherein the opening of the reinforcing member has the same shape as the display area, and the reinforcing member covers the display panel to the edges of the display panel.

7. The electro-optical device according to claim 2, further comprising an optical film covering the display area at the opening of the reinforcing member, and the first resin film serves as an adhesive between the display panel, the reinforcing member, and the optical film.

8. The electro-optical device according to claim 1, wherein
the electro-optical layer of the display panel is disposed above a glass substrate,
at least one side of the glass substrate has a protruding area outside the display area,
the protruding area is connected to one edge of a flexible printed circuit board,
the one edge of the flexible printed circuit board is covered with at least one of the first resin film and the second resin film, and
the other edge of the flexible printed circuit board is disposed outside an edge of at least one of the first resin film and the second resin film.

9. The electro-optical device according to claim 8, wherein the glass substrate has a thickness of 100 μm or less.

10. The electro-optical device according to claim 1, wherein the first resin film and the second resin film is composed of a polyethylene copolymerization material.

11. The electro-optical device according to claim 1, wherein the electro-optical layer is an organic EL layer that includes an organic light-emitting layer.

12. An electronic device comprising an electro-optical device according to claim 1 as a display.

13. An illumination apparatus comprising:
a panel having an electro-optical layer;
a first resin film disposed on the panel to cover a first surface of the panel;
a second resin film disposed on the panel to cover a second surface opposite the first surface;
a reinforcing member disposed on at least one of the first resin film and the second resin film, the reinforcing member having a third surface facing the first surface of the display panel and a fourth surface being opposite to the third surface, and
a reflective layer disposed on at least one of a third surface and a fourth surface of the reinforcing member.

14. The illumination apparatus according to claim 13, wherein the reflective layer is disposed on the third surface and the fourth surface of the reinforcing member.

15. The illumination apparatus according to claim 13, wherein the first surface of the panel has a light-emitting region, and a first reinforcing member disposed on the first resin film has an opening corresponding to a position of the light-emitting region of the panel.

16. The illumination apparatus according to claim 13, wherein the reinforcing member comprises a first reinforcing member disposed on the first resin film and a second reinforcing member disposed on the second resin film of the panel.

17. The illumination apparatus according to claim 16, further comprising a reflective layer disposed on a fifth surface of the second reinforcing member, the fifth surface facing the second surface of the panel.

18. The illumination apparatus according to claim 13, wherein the reinforcing member has a multilayer structure that includes a first carbon fiber layer and a second carbon fiber layer, the first carbon fiber layer containing a plurality of carbon fibers extending in a first direction, the second carbon fiber layer containing a plurality of carbon fibers extending in a second direction, the first direction and the second direction crossing each other.

19. The illumination apparatus according to claim 18, wherein the first carbon fiber layer and the second carbon fiber layer are formed of resin-impregnated carbon fiber prepreg, and the reinforcing member is a layered product formed by curing at least three layers of the first carbon fiber layer and the second carbon fiber layer.

20. The illumination apparatus according to claim 13, wherein the reinforcing member is composed of invar, titanium, or a titanium alloy.

21. The illumination apparatus according to claim 15, wherein the first reinforcing member has an opening of the same shape as a light-emitting region of the panel and covers the panel to the edges of the panel.

22. The illumination apparatus according to claim 13, wherein the first resin film, the second resin film, and the reinforcing member have a plurality of mounting holes passing therethrough around the panel.

23. The illumination apparatus according to claim 22, wherein the mounting holes are elongated holes extending along sides of the panel.

24. The illumination apparatus according to claim 13, wherein
the electro-optical layer of the panel is disposed above a glass substrate,
at least one side of the glass substrate has a protruding area outside the light-emitting region,
the protruding area is connected to one edge of a flexible printed circuit board,
the one edge of the flexible printed circuit board is covered with the first resin film and the second resin film, and
the other edge of the flexible printed circuit board is disposed outside edges of the first resin film and the second resin film.

25. The illumination apparatus according to claim 13, wherein the electro-optical layer of the panel is disposed on a glass substrate, and the glass substrate has a thickness of 100 μm or less.

26. The illumination apparatus according to claim 13, wherein the first resin film and the second resin film comprise a polyethylene copolymerization material.

27. The illumination apparatus according to claim 13, wherein the electro-optical layer is an organic EL layer that includes an organic light-emitting layer.

28. An electro-optical device comprising:
a display panel having an electro-optical layer;
a first resin film disposed on the display panel to cover a first surface on the side of a display area of the display and panel;
a second resin film disposed on the display panel to cover a second surface opposite the first surface;
a reinforcing member including a graphite layer, the reinforcing member disposed on at least one of the first resin film and the second resin film, and
the graphite layer having a plurality of openings.

29. An electro-optical device comprising:
a display panel having an electro-optical layer;
a first resin film disposed on the display panel to cover a first surface on the side of a display area of the display panel;

a second resin film disposed on the display panel to cover a second surface that is opposite the first surface;

a reinforcing member disposed on the second resin film, the reinforcing member having a third surface facing the second surface of the display panel and a fourth surface being opposite to the third surface, and a reflective layer disposed on at least one of the third surface and the fourth surface of the reinforcing member.

30. The electro-optical device according to claim 3, wherein the reinforcing member includes a graphite layer that is disposed between the first carbon fiber layer and the second carbon fiber layer.

31. The electro-optical device according to claim 29, wherein the reinforcing member includes a graphite layer that is disposed between the second resin film and the first carbon fiber layer.

32. An electro-optical device comprising:

a display panel having an electro-optical layer;

a first resin film disposed on the display panel to cover a first surface on the side of a display area of the display panel;

a second resin film disposed on the display panel to cover a second surface that is opposite the first surface;

a first reinforcing member disposed on the first resin film, the first reinforcing member having a third surface facing the second surface of the display panel and a fourth surface being opposite to the third surface;

a second reinforcing member disposed on the second resin film, and a reflective layer disposed on at least one of the third surface and the fourth surface of the first reinforcing member.

* * * * *